(12) United States Patent
Chung et al.

(10) Patent No.: US 12,419,103 B2
(45) Date of Patent: Sep. 16, 2025

(54) DIELECTRIC WALLS FOR COMPLEMENTARY FIELD EFFECT TRANSISTORS

(71) Applicant: Taiwan Semiconductor Manufacturing Co., Ltd., Hsinchu (TW)

(72) Inventors: Cheng-Ting Chung, Hsinchu (TW); Yi-Bo Liao, Hsinchu (TW); Jin Cai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 440 days.

(21) Appl. No.: 18/151,279

(22) Filed: Jan. 6, 2023

(65) Prior Publication Data

US 2024/0072052 A1    Feb. 29, 2024

Related U.S. Application Data

(60) Provisional application No. 63/421,320, filed on Nov. 1, 2022, provisional application No. 63/374,024, filed on Aug. 31, 2022.

(51) Int. Cl.
| | |
|---|---|
| H10D 84/85 | (2025.01) |
| H10D 30/01 | (2025.01) |
| H10D 30/43 | (2025.01) |
| H10D 84/01 | (2025.01) |
| H10D 84/03 | (2025.01) |
| H10D 88/00 | (2025.01) |

(52) U.S. Cl.
CPC .......... *H10D 84/85* (2025.01); *H10D 84/017* (2025.01); *H10D 84/0186* (2025.01); *H10D 84/038* (2025.01); *H10D 88/01* (2025.01)

(58) Field of Classification Search
CPC .. H10D 84/85; H10D 84/017; H10D 84/0186; H10D 84/038; H10D 88/00; H10D 88/01; H10D 30/43; H10D 30/014
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2018/0151450 A1* | 5/2018 | Ching | H10D 84/0193 |

(Continued)

*Primary Examiner* — Mohsen Ahmadi
(74) *Attorney, Agent, or Firm* — Slater Matsil, LLP

(57) ABSTRACT

In an embodiment, a device includes: a dielectric wall; nanostructures abutting the dielectric wall; a lower source/drain region adjoining a lower subset of the nanostructures; an upper source/drain region adjoining an upper subset of the nanostructures, the upper source/drain region oppositely doped from the lower source/drain region; and a shared source/drain contact contacting the upper source/drain region and the lower source/drain region, the shared source/drain contact extending into the dielectric wall.

20 Claims, 73 Drawing Sheets

(56) References Cited

U.S. PATENT DOCUMENTS

| | | |
|---|---|---|
| 2019/0131394 A1 | 5/2019 | Reznicek et al. |
| 2020/0118891 A1 | 4/2020 | Cheng et al. |
| 2020/0294969 A1* | 9/2020 | Rachmady ............ H10D 30/62 |
| 2021/0376076 A1* | 12/2021 | Su ....................... H10D 30/014 |
| 2022/0108981 A1 | 4/2022 | Hwang et al. |
| 2023/0101278 A1* | 3/2023 | Lin .................... H10D 84/0151 |
| | | 257/401 |
| 2023/0268225 A1* | 8/2023 | Huang ................. H01L 23/485 |

* cited by examiner

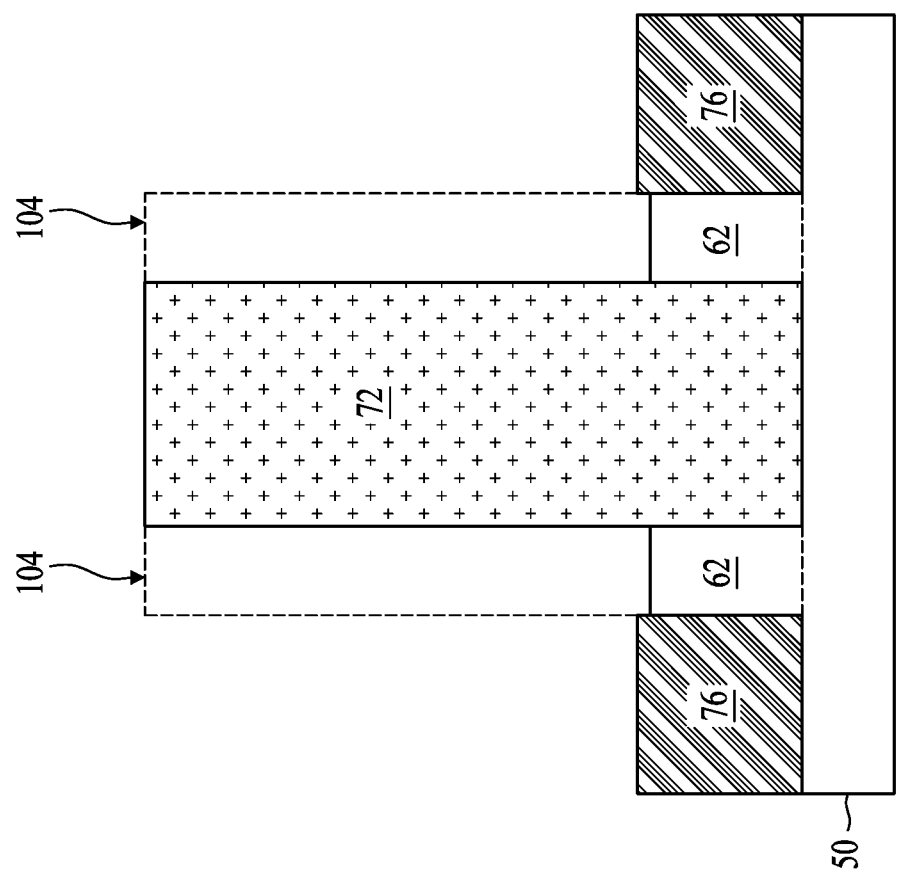

DIELECTRIC WALLS FOR COMPLEMENTARY FIELD EFFECT TRANSISTORS

PRIORITY CLAIM AND CROSS-REFERENCE

This application claims the benefit of U.S. Provisional Application No. 63/421,320, filed on Nov. 1, 2022 and U.S. Provisional Application No. 63/374,024, filed on Aug. 31, 2022, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
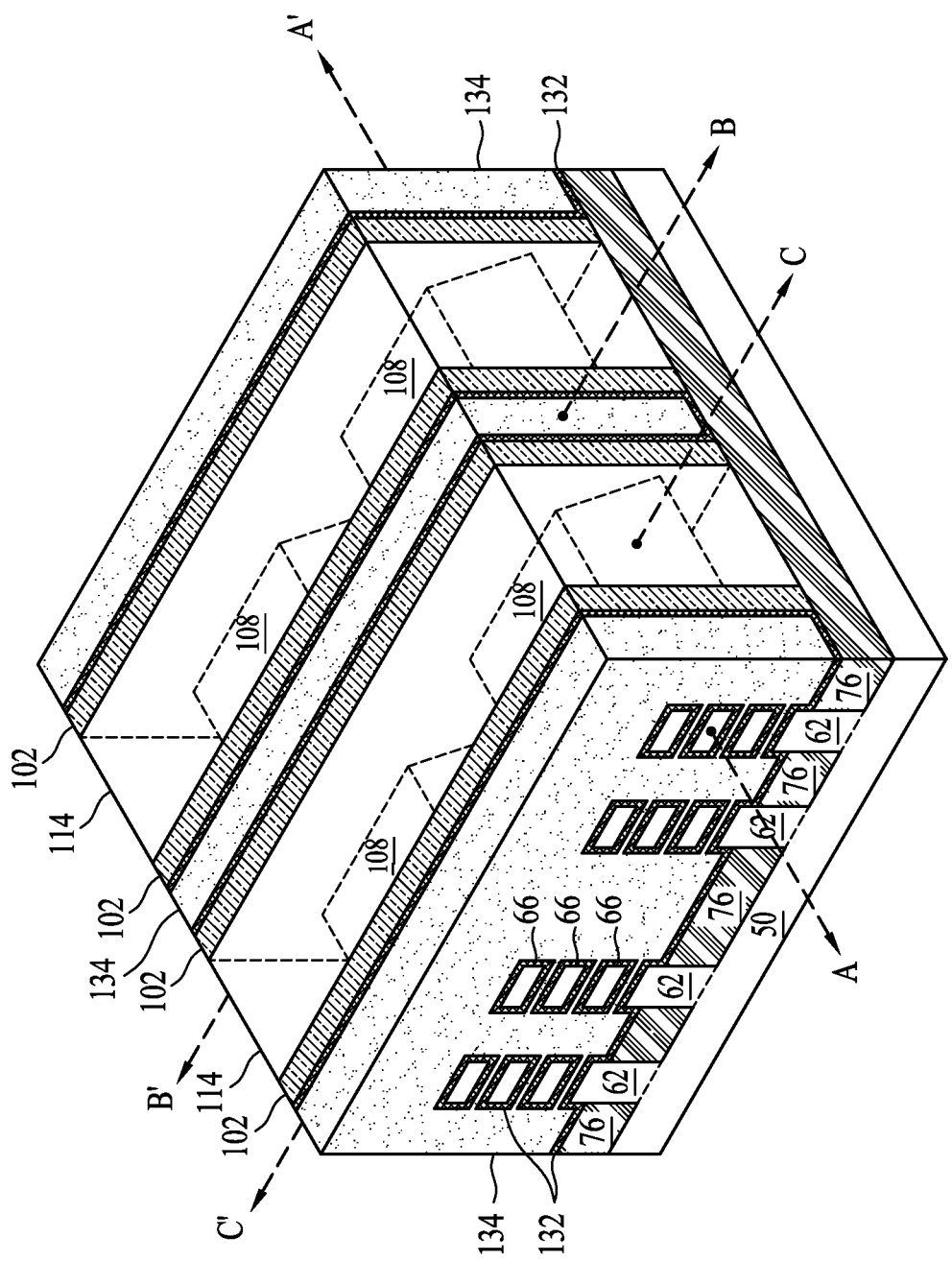
FIG. 1 illustrates an example of a nanostructure field-effect transistor (nanostructure-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, complementary-FETs include dielectric walls between adjacent nanostructures. The gate structures of the complementary-FETs are formed above the dielectric walls, and source/drain contacts for the complementary-FETs are formed partially in the dielectric walls. Because the gate structures are above the dielectric walls, a majority of a source/drain contact extends along a dielectric wall instead of along a gate structure. The parasitic capacitance between the source/drain contacts and the gate structures may thus be reduced.

FIG. 1 illustrates an example of nanostructure-FETs (e.g., nanowire FETs, nanosheet FETs, multi bridge channel (MBC) FETs, nanoribbon FETs, gate-all-around (GAA) FETs, or the like), in accordance with some embodiments. FIG. 1 is a three-dimensional view, where some features of the nano structure-FETs are omitted for illustration clarity.

As subsequently described in greater detail complementary-FETs will be formed from multiple vertically stacked nanostructure-FETs. A complementary-FET includes a lower nanostructure-FET of a first device type (e.g., n-type/p-type) and an upper nanostructure-FET of a second device type (e.g., p-type/n-type) that is opposite the first device type. FIG. 1 shows an example of lower nanostructure-FETs for the complementary-FETs.

The nanostructure-FETs include nanostructures 66 (e.g., nano sheets, nanowires, or the like) over fins 62 on a substrate 50 (e.g., a semiconductor substrate), with the nanostructures 66 being semiconductor features that act as channel regions for the nanostructure-FETs. Isolation regions 76, such as shallow trench isolation (STI) regions, may be disposed between adjacent fins 62, which may protrude above and from between neighboring isolation regions 76. The nanostructures 66 are disposed above and between adjacent isolation regions 76. Although the isolation regions 76 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may comprise a single material or a plurality of materials.

Gate dielectrics 132 are over top surfaces of the fins 62 and along top surfaces, sidewalls, and bottom surfaces of the nanostructures 66. Gate electrodes 134 are over the gate dielectrics 132. Source/drain regions 108 are disposed on the fins 62 at opposing sides of the gate dielectrics 132 and the gate electrodes 134. Source/drain region(s) 108 may refer to a source or a drain, individually or collectively dependent upon the context. An inter-layer dielectric (ILD) 114 is formed over the source/drain regions 108.

FIG. 1 further illustrates reference cross-sections that are used in later figures. Cross-section A-A' is along a longitudinal axis of a fin 62 and in a direction of, for example, a current flow between the source/drain regions 108 of the devices. Cross-section B-B' is perpendicular to cross-section A-A' and is along a longitudinal axis of a gate electrode 134. Cross-section C-C' is parallel to cross-section B-B' and extends through source/drain regions 108 of the devices.

FIGS. 2-21C are views of intermediate stages in the manufacturing of complementary-FETs, in accordance with some embodiments. FIGS. 2, 3, 4, 5, 6, 7, and 8 are three-dimensional views showing a similar three-dimensional view as FIG. 1. FIGS. 9A, 10A, 11A, 12A, 13A, 14A, 15A, 16A, 17A, 18A, 19A, 20A, and 21A illustrate cross-sectional views along a similar cross-section as reference cross-section A-A' in FIG. 1. FIGS. 9B, 10B, 11B, 12B, 13B, 14B, 15B, 16B, 17B, 18B, 19B, 20B, and 21B illustrate cross-sectional views along a similar cross-section as reference cross-section B-B' in FIG. 1. FIGS. 9C, 10C, 11C, 12C, 13C, 14C, 15C, 16C, 17C, 18C, 19C, 20C, and 21C illustrate cross-sectional views along a similar cross-section as reference cross-section C-C' in FIG. 1.

Figure 2:
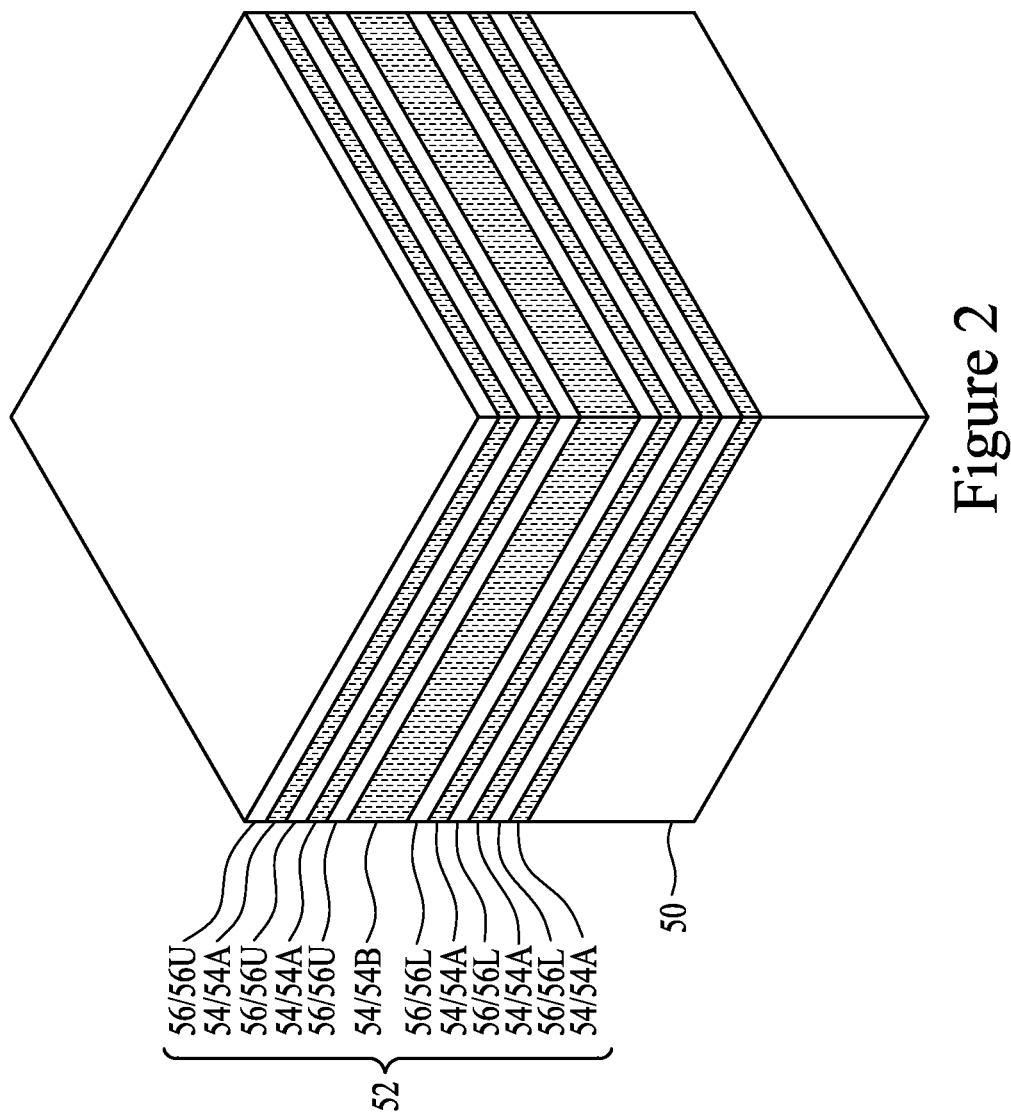
FIGS. 2-21D are views of intermediate stages in the manufacturing of complementary field-effect transistors (complementary-FETs), in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50.

As subsequently described in greater detail, the first semiconductor layers 54 will be removed and the second semiconductor layers 56 will be patterned to form channel regions for the complementary-FETs. The first semiconductor layers 54 are dummy layers that will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon-germanium. The second semiconductor material of the second semiconductor layers 56 is a material suitable for both n-type and p-type devices, such as silicon.

The multi-layer stack 52 is illustrated as including six of the first semiconductor layers 54 and six of the second semiconductor layers 56. It should be appreciated that the multi-layer stack 52 may include any number of the first semiconductor layers 54 and the second semiconductor layers 56. Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like.

In some embodiments, some layers of the multi-layer stack 52 are formed to be thicker than other layers of the multi-layer stack 52. A middle semiconductor layer 54B of the first semiconductor layers 54 may be thicker than others of the first semiconductor layers 54A. A first subset of the second semiconductor layers 56 (e.g., lower semiconductor layers 56L) are below the middle semiconductor layer 54B. A second subset of the second semiconductor layers 56 (e.g., upper semiconductor layers 56U) are above the middle semiconductor layer 54B. The lower semiconductor layers 56L may be formed of the same semiconductor material as the upper semiconductor layers 56U, or may be formed of a different semiconductor material than the upper semiconductor layers 56U.

Figure 3:
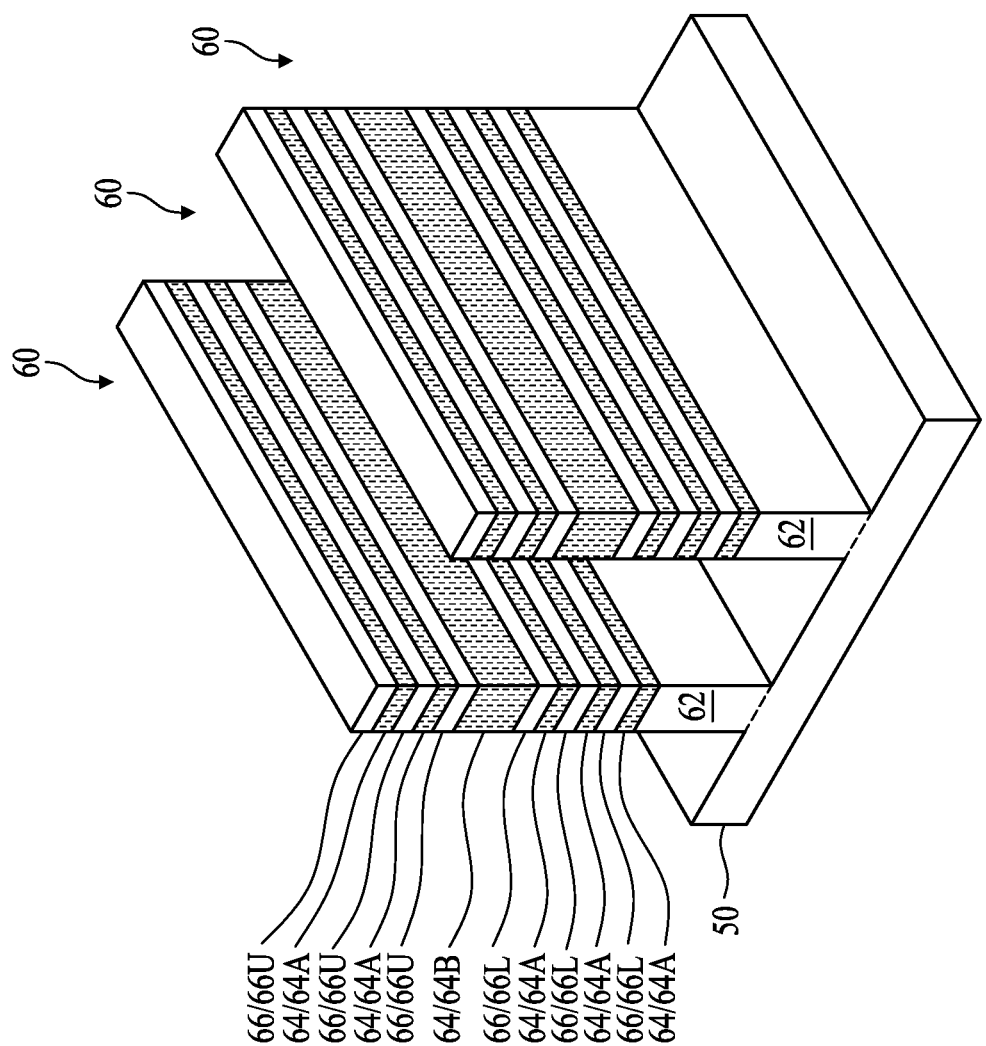

In FIG. 3, fins 62 are formed in the substrate 50 and nanostructures 64, 66 are formed in the multi-layer stack 52. In some embodiments, the nanostructures 64, 66 and the fins 62 may be formed in the multi-layer stack 52 and the substrate 50, respectively, by etching trenches 60 in the multi-layer stack 52 and the substrate 50. The etching may be any acceptable etch process, such as a reactive ion etch (RIE), neutral beam etch (NBE), the like, or a combination thereof. The etching may be anisotropic. Forming the nanostructures 64, 66 by etching the multi-layer stack 52 may further define first nanostructures 64 from the first semiconductor layers 54 and define second nanostructures 66 from the second semiconductor layers 56.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 62 and the nanostructures 64, 66. In some embodiments, a mask (or other layer) may remain on the nanostructures 64, 66.

Although each of the fins 62 and the nanostructures 64, 66 are illustrated as having a constant width throughout, in other embodiments, the fins 62 and/or the nanostructures 64, 66 may have tapered sidewalls such that a width of each of the fins 62 and/or the nanostructures 64, 66 continuously increases in a direction towards the substrate 50. In such embodiments, each of the nanostructures 64, 66 may have a different width and be trapezoidal in shape.

The thicknesses of the nanostructures 64, 66 correspond to the thicknesses of the semiconductor layers 54, 56, respectively. As a result, the nanostructures 64 include isolation structures 64B that are thicker than others of the nanostructures 64A. The isolation structures 64B will define the boundary of the devices of the complementary-FETs. A first, lower subset of the nanostructures 66 (e.g., lower nanostructures 66L) are below the isolation structures 64B. A second, upper subset of the nanostructures 66 (e.g., upper nanostructures 66U) are above the isolation structures 64B. The lower nanostructures 66L will act as channel regions for lower nanostructure-FETs of the complementary-FETs, and the upper nanostructures 66U will act as channel regions for upper nanostructure-FETs of the complementary-FETs.

As subsequently described in greater detail for FIGS. 4-7, dielectric walls 72 will be formed between some of the adjacent nanostructures 66. The dielectric walls 72 will be formed in desired trenches 60 by forming dielectric walls 72 in all of the trenches 60, and then removing a subset of the dielectric walls 72 such that only the dielectric walls 72 in the desired trenches 60 remain. Additionally, STI regions 76 will be formed in some or all of the trenches 60. The STI regions 76 are different from the dielectric walls 72. Although one dielectric wall 72 is illustrated, it should be appreciated that multiple dielectric walls 72 may be formed.

Figure 4:
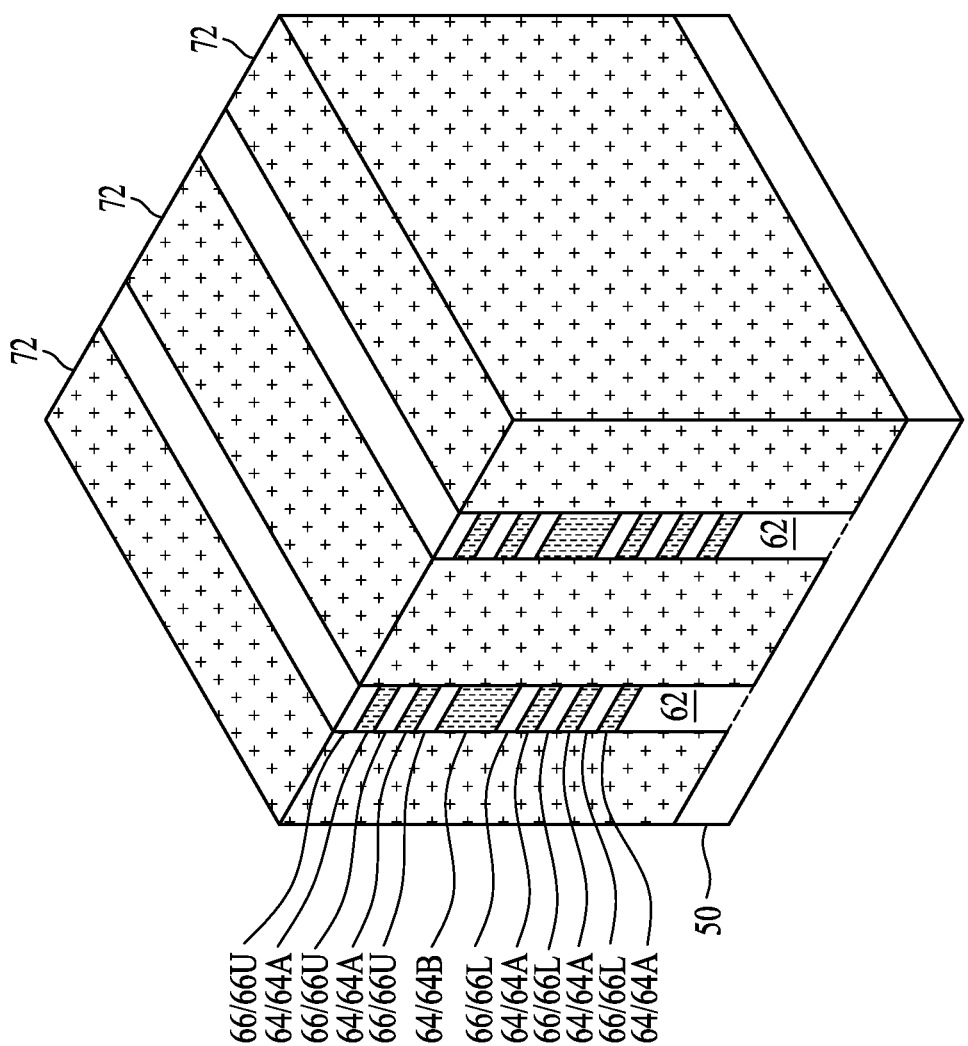

In FIG. 4, dielectric walls 72 are formed over the substrate 50 and in the trenches 60 between adjacent fins 62 and nanostructures 64, 66. The dielectric walls 72 may be formed of a dielectric material such as silicon oxide, silicon nitride, silicon oxynitride, silicon carbonitride, silicon oxycarbonitride, silicon oxycarbide, aluminum oxide, hafnium oxide, zirconium oxide, silicon carbide, combinations thereof, or the like, which may be deposited by chemical vapor deposition (CVD) or atomic layer deposition (ALD), or the like. In this embodiment, the dielectric walls 72 are single-layered, e.g., formed of a single layer of a single dielectric material. In another embodiment (subsequently described for FIGS. 25A-25C), the dielectric walls 72 are multi-layered, e.g., formed of multiple layers of different dielectric materials.

As an example to form the dielectric walls 72, one or more of the previously described dielectric material(s) may be deposited in the trenches 60 between adjacent fins 62 and nanostructures 64, 66. The dielectric material(s) may also be deposited over the fins 62 and the nanostructures 64, 66 such that excess dielectric material(s) cover the nanostructures 64, 66. A removal process is then applied to the dielectric material(s) to remove excess dielectric material(s) over the nanostructures 64, 66. In some embodiments, a planarization process such as a chemical mechanical polish (CMP), an etch-back process, combinations thereof, or the like may be utilized. The planarization process exposes the nanostructures 64, 66 such that top surfaces of the nanostructures 64, 66 and the dielectric material(s) are level after the planarization process is complete. In embodiments in which a mask remains on the nanostructures 64, 66, the planarization process may expose the mask or remove the mask such that top surfaces of the mask or the nanostructures 64, 66, respectively, and the dielectric material(s) are level after the planarization process is complete. The dielectric material(s), after the removal process, have portions left in the trenches 60 (thus forming the dielectric walls 72).

Figure 5:
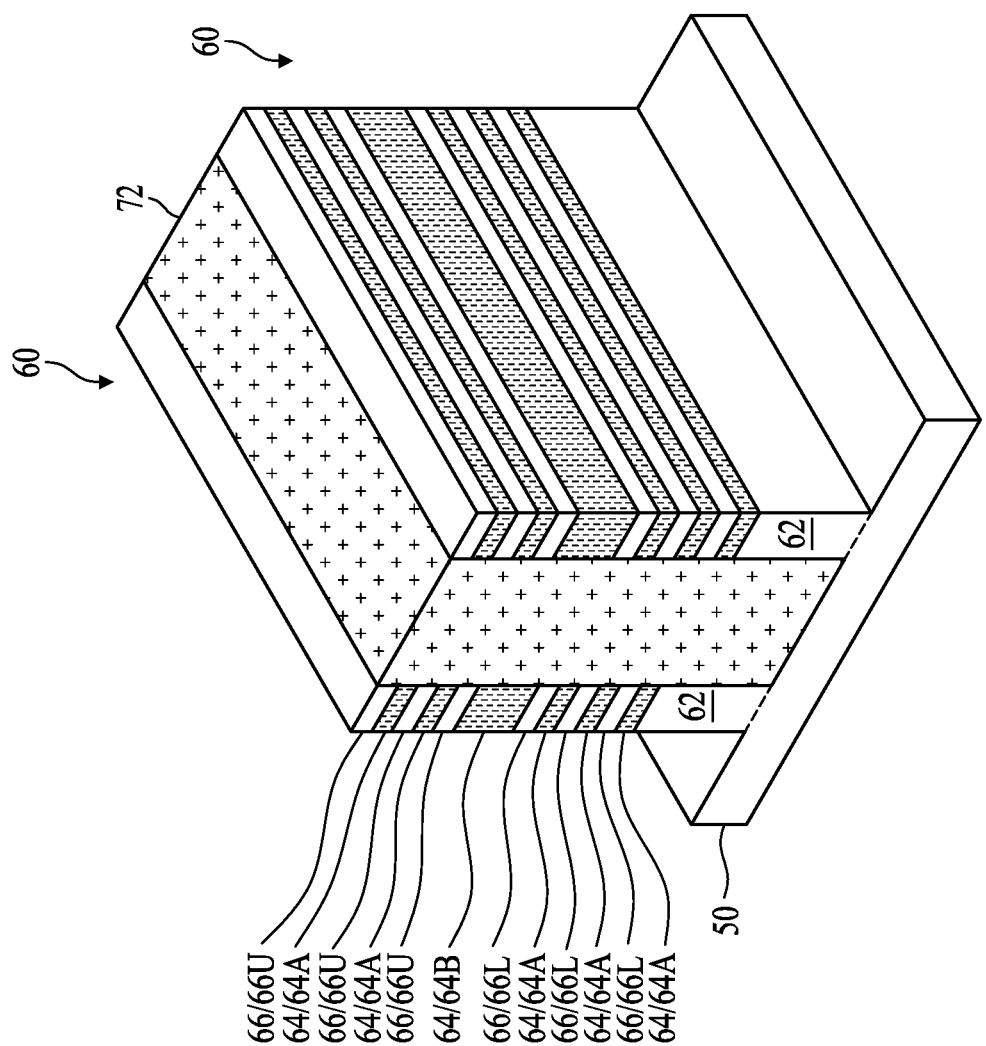

In FIG. 5, a first subset of the dielectric walls 72 are removed to re-form some of the trenches 60. A second subset of the dielectric walls 72 are not removed, and remain in respective trenches 60. The desired dielectric walls 72 may be removed using acceptable photolithography and etching techniques. For example, a mask (not separately illustrated) such as a photoresist may be formed over the dielectric walls 72 and the nanostructures 64, 66. The photoresist is patterned to expose the dielectric walls 72 that will be removed. The photoresist can be formed by using a spin-on technique and can be patterned using acceptable photolithography techniques. Once the photoresist is patterned, the dielectric walls 72 exposed by the photoresist may be removed by any acceptable etch process, such as one that is selective to the material(s) of the dielectric walls 72 (e.g., selectively etches the material(s) of the dielectric walls 72 at a faster rate than the materials of the nanostructures 64, 66). After the etch, the photoresist is removed, such as by an acceptable ashing process.

In this embodiment, both sides of each dielectric wall 72 abut the adjacent nanostructures 66 after the removal process, such that the nanostructures 66 contact the sidewalls of the dielectric wall 72. As a result, each dielectric wall 72 completely fills a trench 60 such that it extends continuously between the adjacent nanostructures 66. In another embodiment (subsequently described for FIG. 27), each dielectric wall 72 partially fills a trench 60 such that only one side of each dielectric wall 72 abuts the adjacent nanostructures 66.

Figure 6:
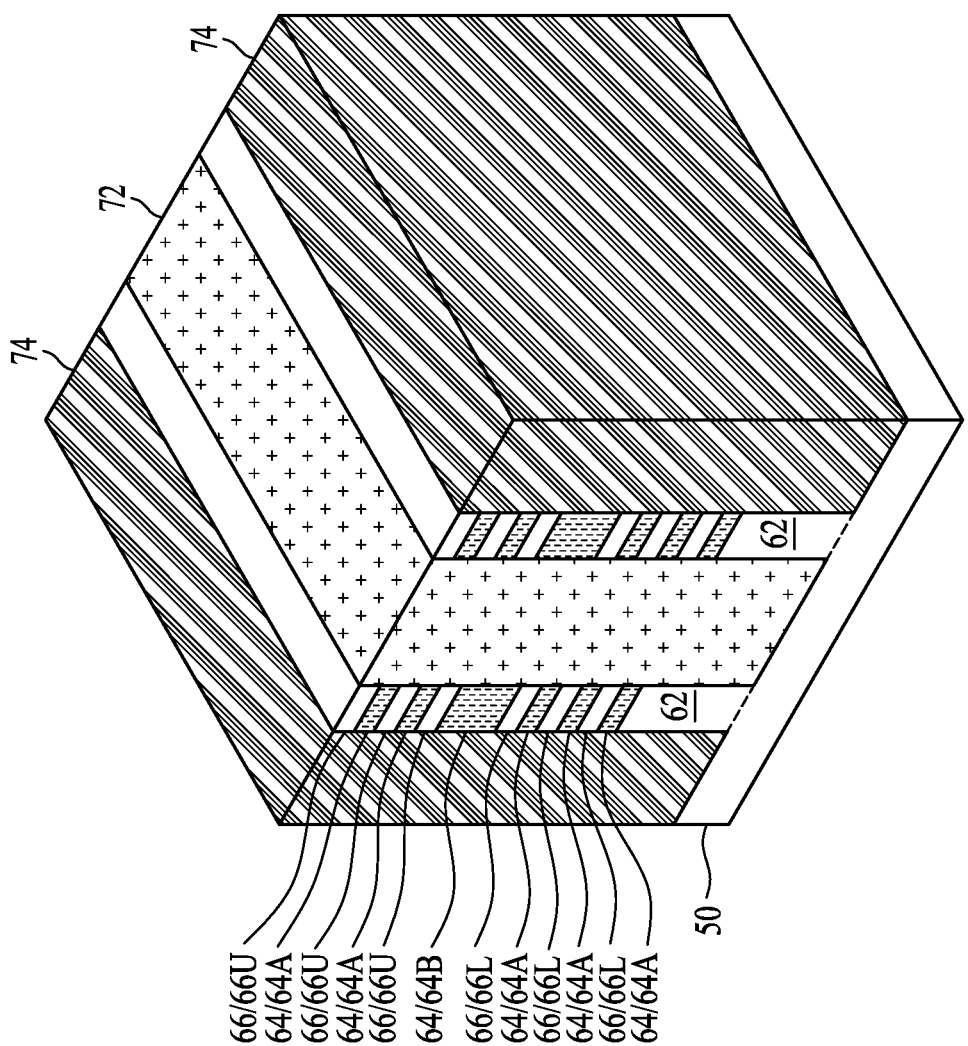

In FIG. 6, an insulation material 74 is formed over the substrate 50 and between some of the adjacent fins 62 and nanostructures 64, 66. Specifically, the insulation material 74 is in the trenches 60 between the adjacent fins 62 and nanostructures 64, 66 where the dielectric walls 72 were removed. The insulation material 74 may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. The insulation material 74 is different from the material of the dielectric walls 72. In some embodiments, the insulation material 74 includes silicon oxide formed by an FCVD process. An annealing process may be performed once the insulation material 74 is formed. Although the insulation material 74 is illustrated as a single layer, some embodiments may utilize multiple layers. For example, in some embodiments a liner (not separately illustrated) may first be formed along a surface of the substrate 50, the fins 62, and the nanostructures 64, 66. Thereafter, a fill material, such as one of the previously described insulation materials may be formed over the liner.

The insulation material 74 may be deposited over the fins 62 and the nanostructures 64, 66 such that excess insulation material 74 covers the nanostructures 64, 66. A removal process is then applied to the insulation material 74 to remove excess insulation material 74 over the nanostructures 64, 66. In some embodiments, a planarization process such as a chemical mechanical polish (CMP), an etch-back process, combinations thereof, or the like may be utilized. The planarization process exposes the nanostructures 64, 66 such that top surfaces of the nanostructures 64, 66 and the insulation material 74 are level after the planarization process is complete. In embodiments in which a mask remains on the nanostructures 64, 66, the planarization process may expose the mask or remove the mask such that top surfaces of the mask or the nanostructures 64, 66, respectively, and the insulation material 74 are level after the planarization process is complete.

Figure 7:
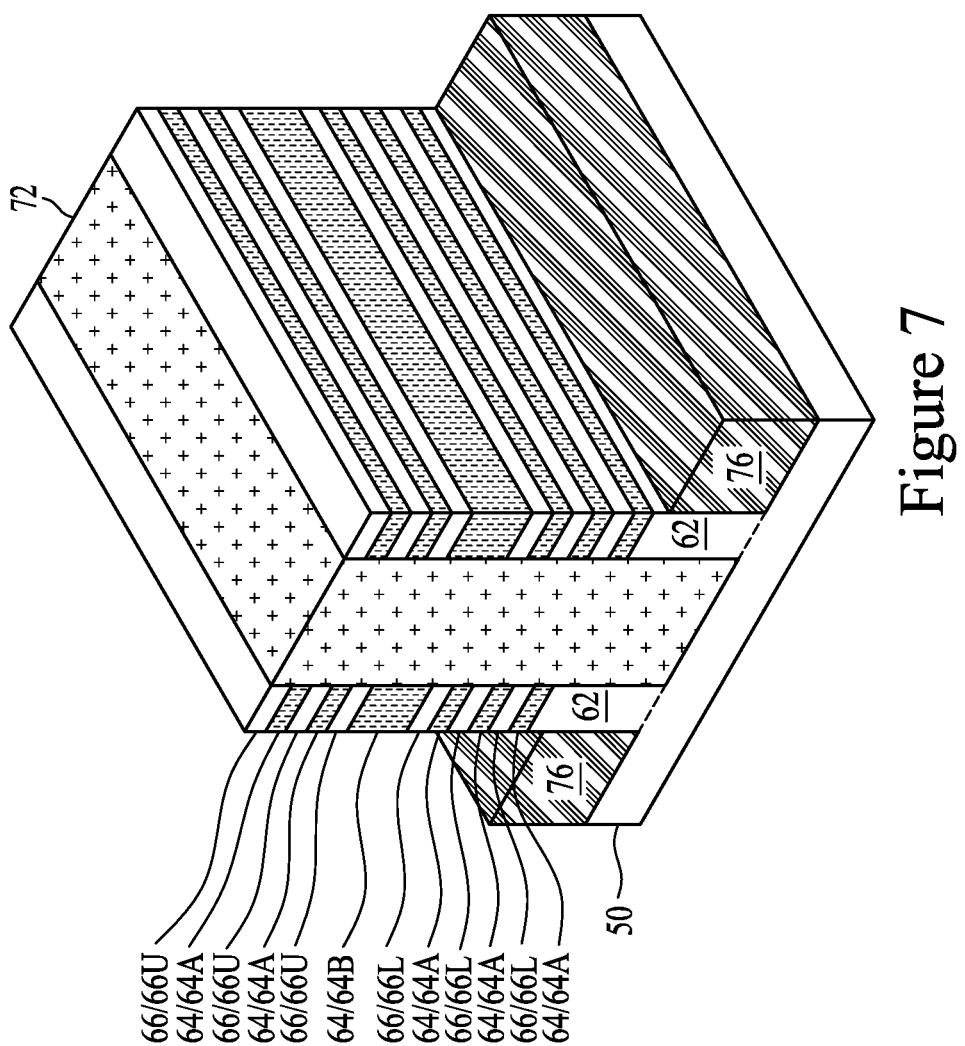

In FIG. 7, the insulation material 74 is recessed to form STI regions 76. The STI regions 76 are adjacent the fins 62. The insulation material 74 is recessed such that upper portions of fins 62 and/or the nanostructures 64, 66 protrude from between neighboring STI regions 76. The upper portions of the fins 62 and/or the nanostructures 64, 66 are above the STI regions 76. Additionally, the upper portions of the dielectric walls 72 are above the STI regions 76. Further, the top surfaces of the STI regions 76 may have a flat surface as illustrated, a convex surface, a concave surface (such as dishing), or a combination thereof. The top surfaces of the STI regions 76 may be formed flat, convex, and/or concave by an appropriate etch. The STI regions 76 may be recessed using an acceptable etching process, such as one that is selective to the material of the insulation material 74 (e.g., etches the material of the insulation material 74 at a faster rate than the materials of the fins 62 and the nanostructures 64, 66). For example, an oxide removal using, for example, dilute hydrofluoric (dHF) acid may be used.

The previously described process is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may comprise the previously described alternating semiconductor materials, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

In this embodiment, the dielectric walls 72 are formed before the STI regions 76. As a result, the dielectric walls 72 contact a top surface of the substrate 50. Additionally, the dielectric walls 72 are between a first subset of adjacent fins 62 and nanostructures 64, 66 and the STI regions 76 are between a second subset of adjacent fins 62 and nanostructures 64, 66. In another embodiment (subsequently described for FIGS. 24A-24C), the dielectric walls 72 are formed after the STI regions 76, such that the dielectric walls 72 are formed above the STI regions 76.

Further, appropriate wells (not separately illustrated) may be formed in the fins 62, the nanostructures 64, 66, the dielectric walls 72, and/or the STI regions 76. For example, an n-type impurity implant and/or a p-type impurity implant may be performed. The n-type impurities may be phosphorus, arsenic, antimony, or the like implanted in the region to a concentration in a range from $10^{17}$ atoms/cm$^3$ to $10^{19}$ atoms/cm$^3$. The p-type impurities may be boron, boron fluoride, indium, or the like implanted in the region to a concentration in a range from $10^{17}$ atoms/cm$^3$ to $10^{19}$ atoms/cm$^3$. When wells are formed in the nanostructures 66, the wells may have a conductivity type opposite from a conductivity type of source/drain regions that will be subsequently formed adjacent the nanostructures 66. Additionally, the wells in the lower nanostructures 66L may have a conductivity type opposite from a conductivity type of the wells in the upper nanostructures 66U. In some embodiments, the lower nanostructures 66L have p-type wells and the upper nanostructures 66U have n-type wells. In some embodiments, the lower nanostructures 66L have n-type wells and the upper nanostructures 66U have p-type wells. After the implant(s), an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In some embodiments, wells are formed in the fins 62 but not the nanostructures 64, 66. The wells in the fins 62 may have a conductivity type opposite from a conductivity type of source/drain regions that will be subsequently formed adjacent the lower nanostructures 66L. In some embodiments, the fins 62 have n-type wells, p-type source/drain regions are subsequently formed adjacent the lower nanostructures 66L, and n-type source/drain regions are subsequently formed adjacent the upper nanostructures 66U. In some embodiments, the fins 62 have p-type wells, n-type source/drain regions are subsequently formed adjacent the lower nanostructures 66L, and p-type source/drain regions are subsequently formed adjacent the upper nanostructures 66U.

Figure 8:
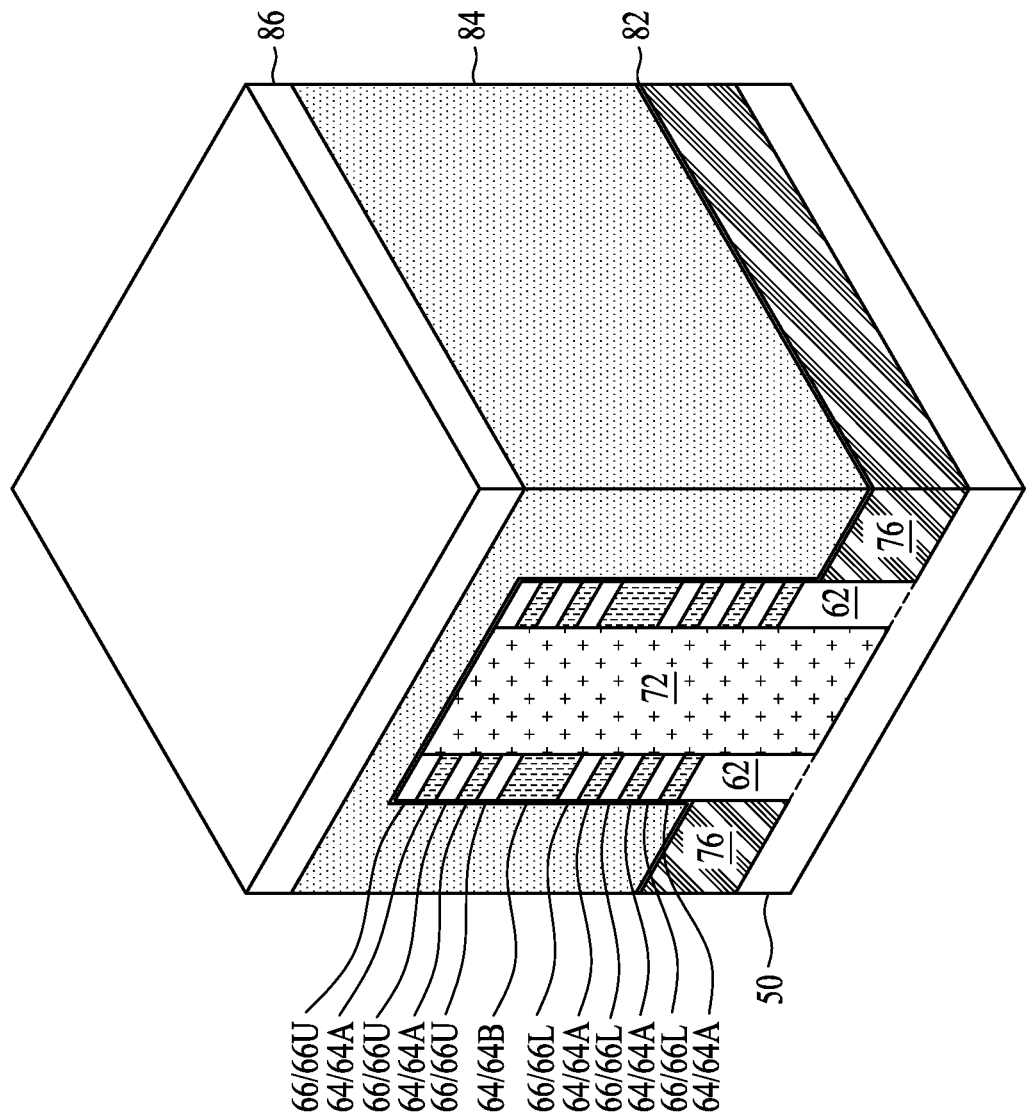

In FIG. 8, a dummy dielectric layer 82 is formed on the dielectric walls 72 and the fins 62 and/or the nanostructures 64, 66. The dummy dielectric layer 82 may be formed of silicon oxide, silicon nitride, a combination thereof, or the like, which may be deposited or thermally grown according to acceptable techniques. A dummy gate layer 84 is formed over the dummy dielectric layer 82, and a mask layer 86 is formed over the dummy gate layer 84. The dummy gate layer 84 may be deposited over the dummy dielectric layer 82 and then planarized, such as by a CMP. The dummy gate layer 84 may be formed of a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The material of the dummy gate layer 84 may be deposited by CVD, physical vapor deposition (PVD), sputter deposition, or other techniques for depositing the selected material. The dummy gate layer 84 may be formed of other materials that have a high etching selectivity from the etching of insulation materials, e.g., the STI regions 76 and/or the dummy dielectric layer 82. The mask layer 86 may be deposited over the dummy gate layer 84. The mask layer 86 may be formed of a dielectric material such as silicon nitride, silicon oxynitride, or the like. In the illustrated embodiment, the dummy dielectric layer 82 covers the STI regions 76 and the dielectric walls 72, such that the dummy dielectric layer 82 extends between the dummy gate layer 84, the STI regions 76, and the dielectric walls 72. In another embodiment, the dummy dielectric layer 82 covers only the fins 62 and/or the nanostructures 64, 66.

Figure 9A:
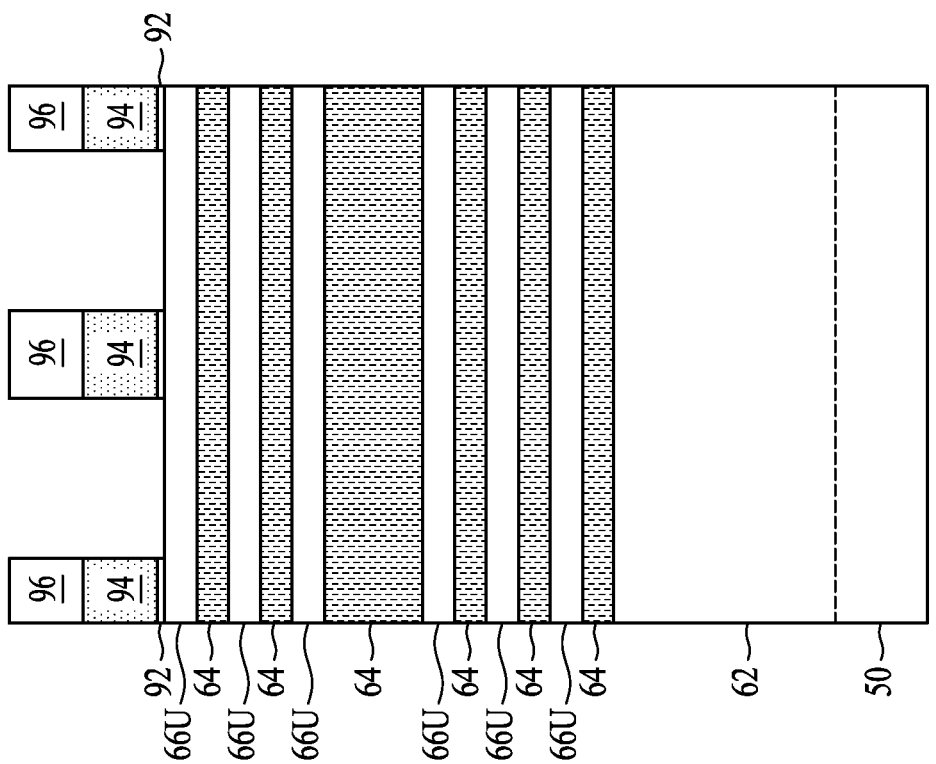
Figure 9B:
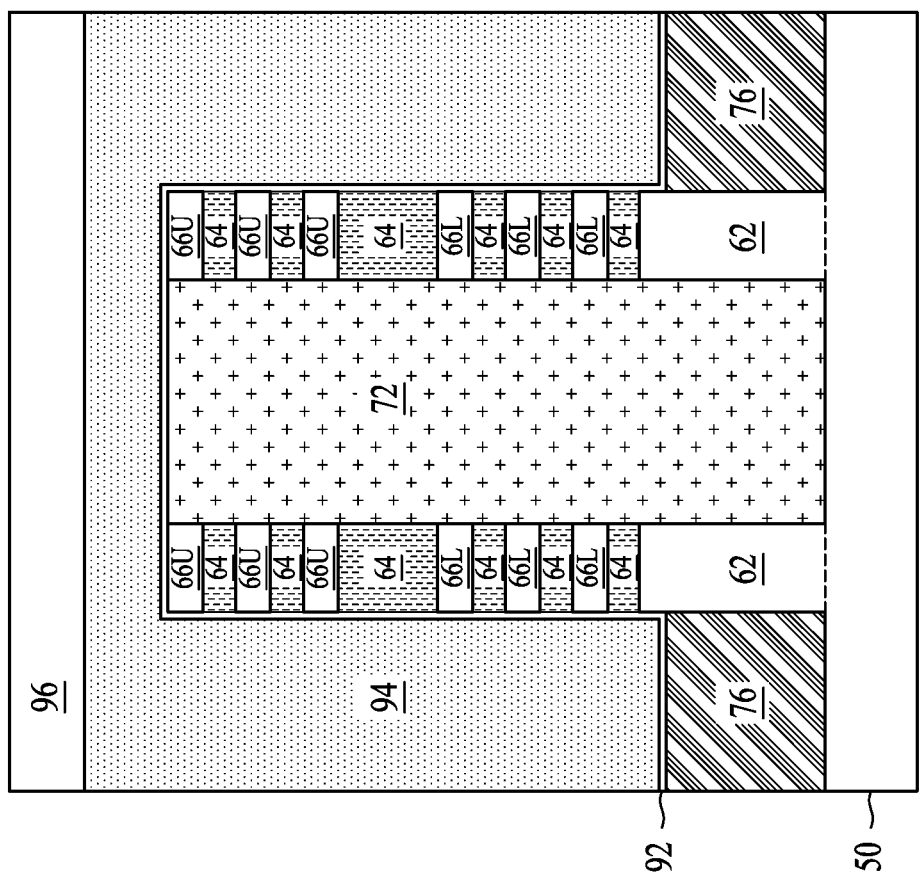
Figure 9C:
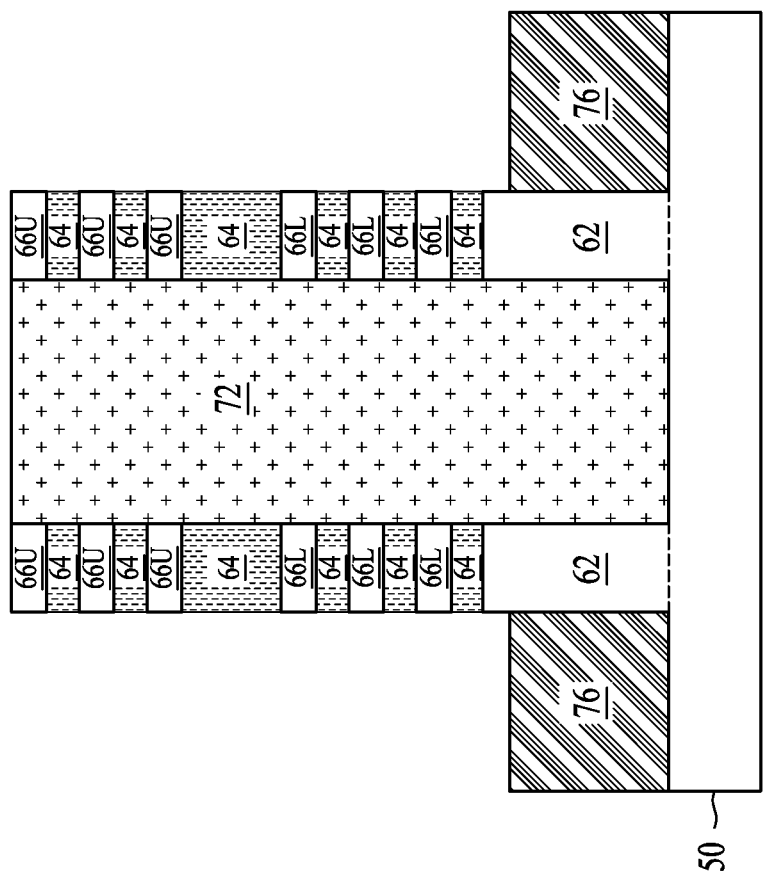

In FIGS. 9A-9C, the mask layer 86 is patterned using acceptable photolithography and etching techniques to form masks 96. The pattern of the masks 96 then may be transferred to the dummy gate layer 84 and to the dummy dielectric layer 82 to form dummy gates 94 and dummy dielectrics 92, respectively. The dummy gates 94 cover respective channel regions of the nanostructures 64, 66. The pattern of the masks 96 may be used to physically separate each of the dummy gates 94 from adjacent dummy gates 94. The dummy gates 94 may also have a lengthwise direction substantially perpendicular to the lengthwise direction of respective fins 62. The masks 96 can optionally be removed after patterning, such as by any acceptable etching technique.

Figure 10A:
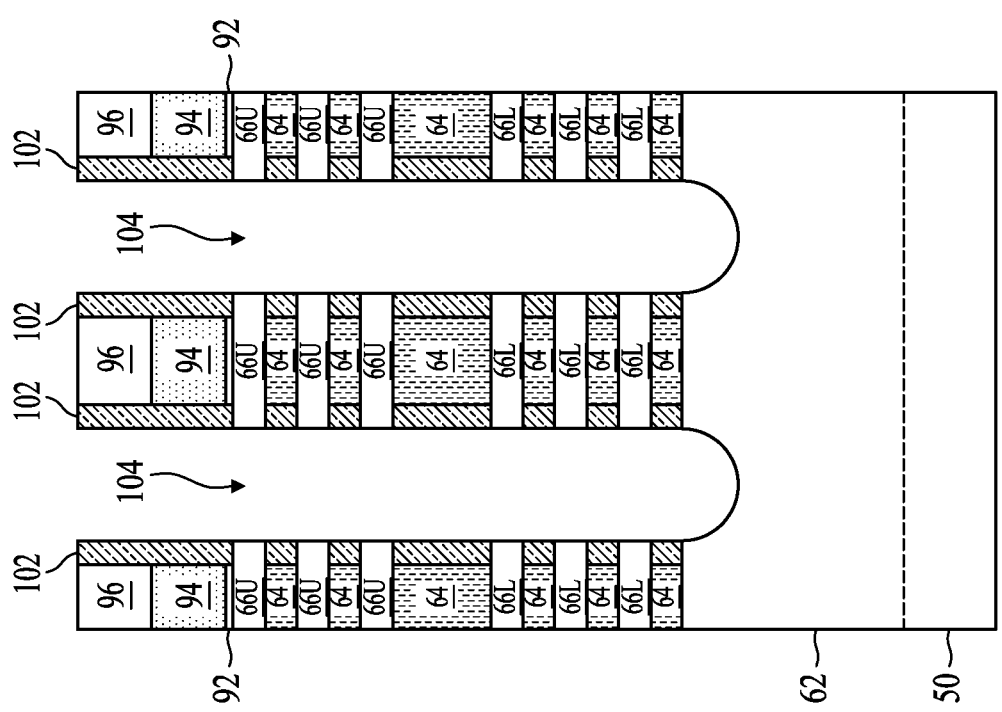
Figure 10B:
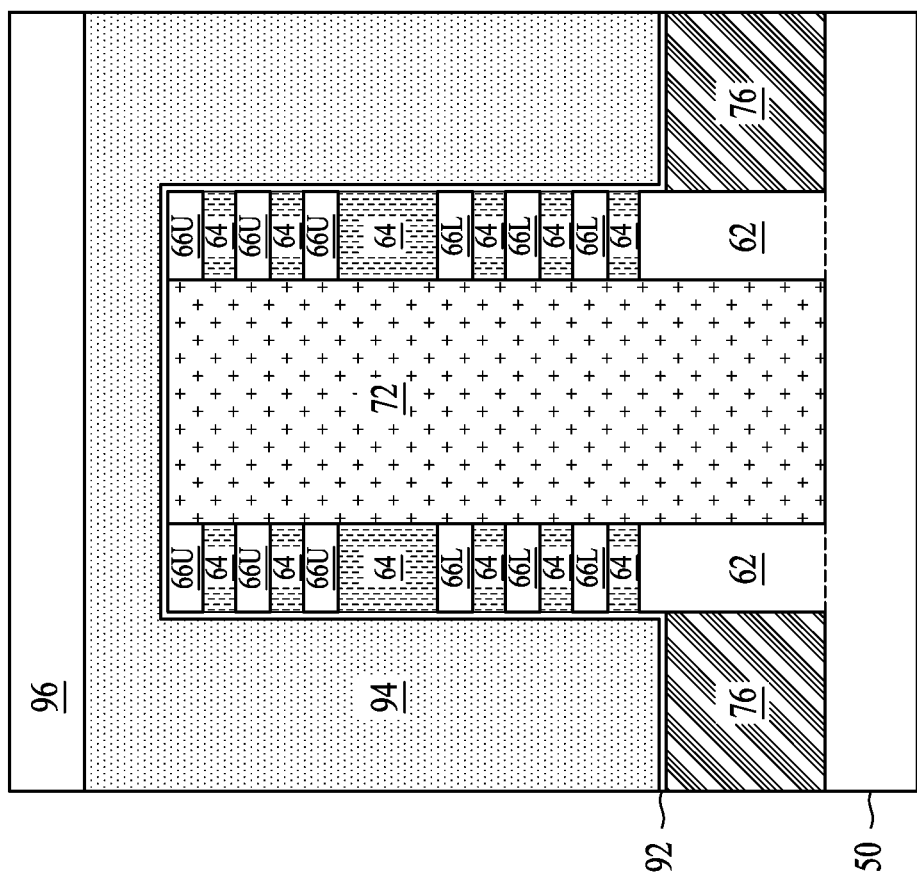

In FIGS. 10A-10C, gate spacers 102 are formed over the nanostructures 64, 66 and on exposed sidewalls of the masks 96 (if present), the dummy gates 94, and the dummy dielectrics 92. The gate spacers 102 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material (s). The etching may be anisotropic. The dielectric material (s), when etched, have portions left on the sidewalls of the dummy gates 94 (thus forming the gate spacers 102).

Further, implants for lightly doped source/drain (LDD) regions (not separately illustrated) may be performed. Appropriate type impurities may be implanted into the nanostructures 64, 66. The LDD regions may have a same conductivity type as a conductivity type of source/drain regions that will be subsequently formed adjacent the nanostructures 66. Additionally, the LDD regions in the lower nanostructures 66L may have a conductivity type opposite from a conductivity type of the LDD regions in the upper nanostructures 66U. In some embodiments, the lower nanostructures 66L have p-type LDD regions and the upper nanostructures 66U have n-type LDD regions. In some embodiments, the lower nanostructures 66L have n-type LDD regions and the upper nanostructures 66U have p-type LDD regions. The n-type impurities may be the any of the n-type impurities previously discussed, and the p-type impurities may be the any of the p-type impurities previously discussed. The lightly doped source/drain regions may have a concentration of impurities in a range from $10^{17}$ atoms/cm$^3$ to $10^{20}$ atoms/cm$^3$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like.

Source/drain recesses 104 are patterned in the fins 62 and/or the nanostructures 64, 66. Source/drain regions will be subsequently formed in the source/drain recesses 104. The source/drain recesses 104 may extend through the nanostructures 64, 66 and into the substrate 50. The source/drain recesses 104 extend through the lower nanostructures 66L and through the upper nanostructures 66U. In some embodiments, the fins 62 may be etched such that bottom surfaces of the source/drain recesses 104 are disposed below the top surfaces of the STI regions 76. The source/drain recesses 104 may be formed by etching the fins 62 and/or the nanostructures 64, 66 using anisotropic etching processes, such as RIE, NBE, or the like. The gate spacers 102 and the dummy gates 94 mask portions of the fins 62 and/or the nanostructures 64, 66 during the etching processes used to form the source/drain recesses 104. A single etch process or multiple etch processes may be used to etch each layer of the nanostructures 64, 66 and/or the fins 62. Timed etch processes may be used to stop the etching of the source/drain recesses 104 after the source/drain recesses 104 reach a desired depth.

The dielectric walls 72 are exposed to the etchants utilized for patterning the source/drain recesses 104. In this embodiment, no losses of the dielectric walls 72 occurs during the etching of the source/drain recesses 104, such that the height of the dielectric walls 72 is not reduced. In another embodiment (subsequently described for FIGS. 22-23), losses of the dielectric walls 72 occurs during the etching of the source/ drain recesses 104, such that the height of the dielectric walls 72 is reduced. The losses (if any) of the dielectric walls 72 depends on the etchants utilized for patterning the source/drain recesses 104.

Figure 11A:
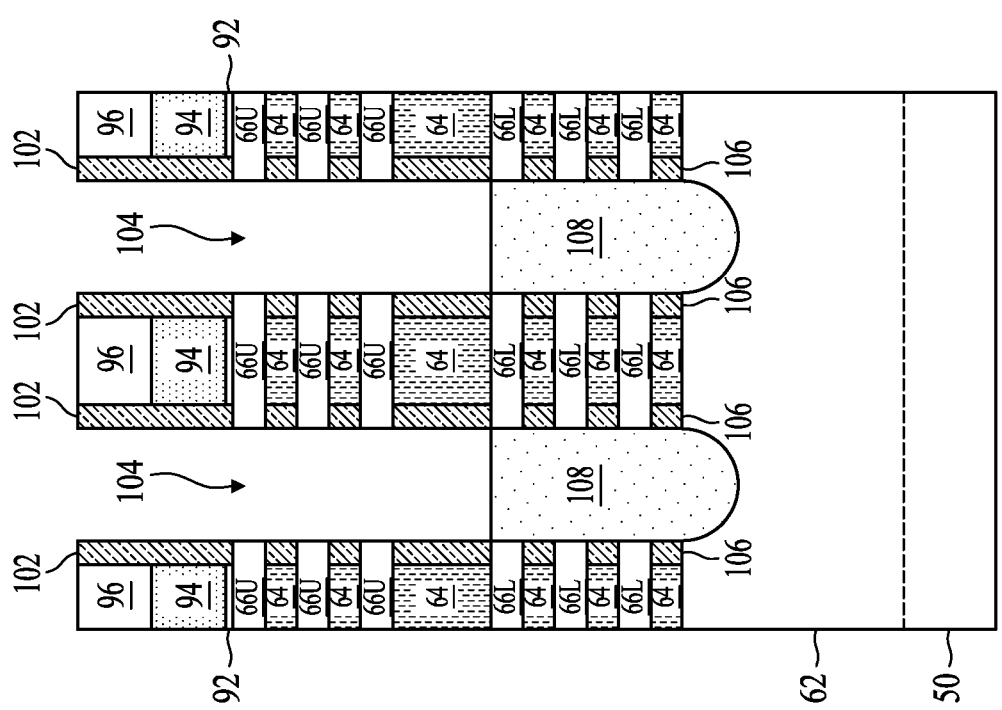
Figure 11B:
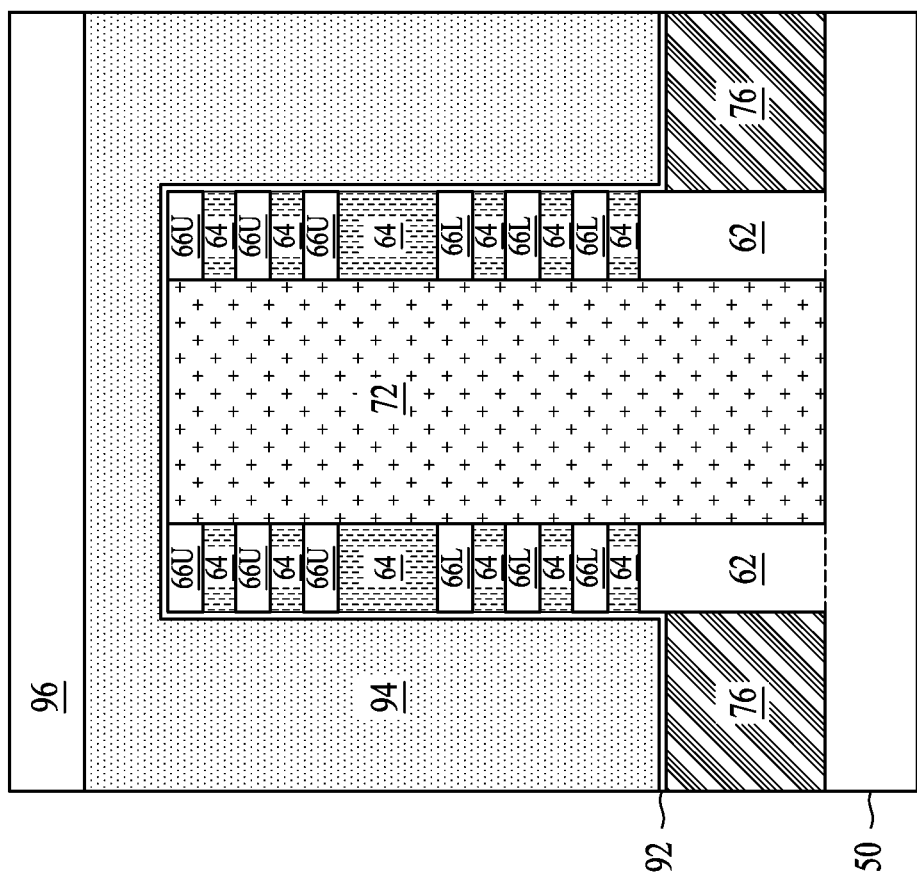
Figure 11C:
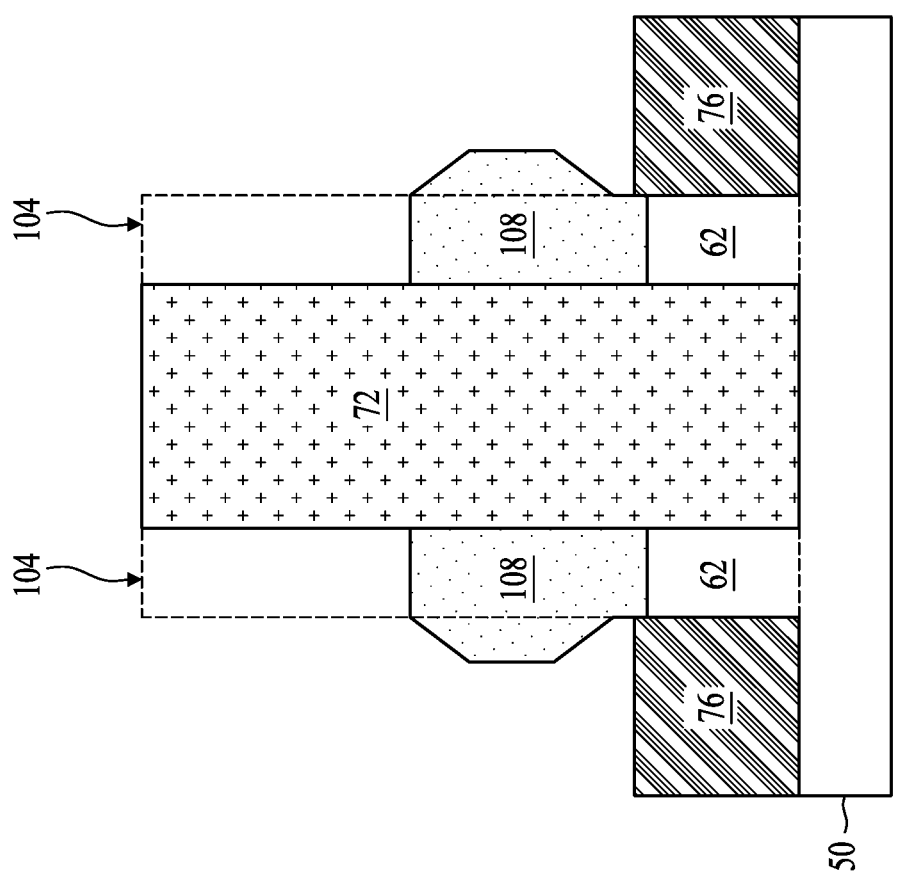

In FIGS. 11A-11C, inner spacers 106 are formed on the sidewalls of the remaining portions of the first nanostructures 64, e.g., those sidewalls exposed by the source/drain recesses 104. As subsequently described in greater detail, source/drain regions will be subsequently formed in the source/drain recesses 104, and the first nanostructures 64 will be replaced with corresponding gate structures. The inner spacers 106 act as isolation features between the subsequently formed source/drain regions and the subsequently formed gate structures. Further, the inner spacers 106 may be used to prevent damage to the subsequently formed source/drain regions by subsequent etch processes, such as etch processes used to subsequently remove the first nanostructures 64.

As an example to form the inner spacers 106, the source/ drain recesses 104 can be laterally expanded. Specifically, portions of the sidewalls of the first nanostructures 64 exposed by the source/drain recesses 104 may be recessed to form sidewall recesses. Although sidewalls of the first nanostructures 64 are illustrated as being straight, the sidewalls may be concave or convex. The sidewalls may be recessed by any acceptable etch process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon-germanium, the etch process may be a wet etch using tetramethylammonium hydroxide (TMAH), ammonium hydroxide (NH$_4$OH), or the like. In another embodiment, the etch process may be a dry etch using a fluorine-based gas such as hydrogen fluoride (HF) gas. In some embodiments, the same etch process may be continually performed to both form the source/drain recesses 104 and recess the sidewalls of the first nanostructures 64. The inner spacers 106 can then be formed by conformally forming an insulating material in the source/ drain recesses 104, and subsequently etching the insulating material. The insulating material may be silicon nitride or silicon oxynitride, although any suitable material, such as low-dielectric constant (low-k) materials having a k-value less than about 3.5, may be utilized. The insulating material may be formed by a deposition process, such as ALD, CVD, or the like. The etching of the insulating material may be anisotropic. For example, the etch process may be a dry etch such as a RIE, a NBE, or the like.

Although outer sidewalls of inner spacers 106 are illustrated as being flush with sidewalls of the second nanostructures 66, the outer sidewalls of the inner spacers 106 may extend beyond or be recessed from sidewalls of the second nanostructures 66. In other words, the inner spacers 106 may partially fill, completely fill, or overfill the sidewall recesses. Moreover, although the sidewalls of the inner spacers 106 are illustrated as being straight, the sidewalls of the inner spacers 106 may be concave or convex.

Lower epitaxial source/drain regions 108 are formed in the lower portions of the source/drain recesses 104. The lower epitaxial source/drain regions 108 only partially fill the source/drain recesses 104, such that the lower epitaxial source/drain regions 108 are in contact with the lower nanostructures 66L and are not in contact with the upper nanostructures 66U. In some embodiments, the lower epitaxial source/drain regions 108 exert stress in the respective channel regions of the lower nanostructures 66L, thereby improving performance. The lower epitaxial source/drain regions 108 are formed in the source/drain recesses 104 such that each dummy gate 94 is disposed between respective neighboring pairs of the lower epitaxial source/drain regions 108 in a top-down view. In some embodiments, the inner spacers 106 are used to separate the lower epitaxial source/drain regions 108 from the nanostructures 64 by an appropriate lateral distance so that the lower epitaxial source/drain regions 108 do not short out with subsequently formed gates of the resulting devices.

The lower epitaxial source/drain regions 108 are epitaxially grown in the lower portions of the source/drain recesses 104. The height of the lower epitaxial source/drain regions 108 is less than the distance between the fins 62 and the upper nanostructures 66U. Timed epitaxial growth processes may be used to stop the growth of the lower epitaxial source/drain regions 108 after the lower epitaxial source/drain regions 108 reach a desired height. The lower epitaxial source/drain regions 108 may have any desired conductivity type, which is opposite the conductivity type of the channel regions of the lower nanostructures 66L. In some embodiments, the lower epitaxial source/drain regions 108 may be in situ doped during growth.

In some embodiments, the lower epitaxial source/drain regions 108 are n-type source/drain regions. For example, if the lower nanostructures 66L are silicon, the lower epitaxial source/drain regions 108 may include materials exerting a tensile strain on the lower nanostructures 66L, such as silicon, silicon carbide, phosphorous-doped silicon carbide, silicon phosphide, silicon arsenide, or the like. The lower epitaxial source/drain regions 108 may have surfaces raised from respective upper surfaces of the lower nanostructures 66L and may have facets.

In some embodiments, the lower epitaxial source/drain regions 108 are p-type source/drain regions. For example, if the lower nanostructures 66L are silicon-germanium, the lower epitaxial source/drain regions 108 may include materials exerting a compressive strain on the lower nanostructures 66L, such as silicon-germanium, boron-doped silicon-germanium, boron-doped silicon, germanium, germanium tin, or the like. The lower epitaxial source/drain regions 108 may have surfaces raised from respective upper surfaces of the lower nanostructures 66L and may have facets.

The lower epitaxial source/drain regions 108 may be implanted with dopants to form source/drain regions, similar to the process previously discussed for forming lightly-doped source/drain regions, followed by an anneal. The source/drain regions may have an impurity concentration in the range of $10^{19}$ atoms/cm$^3$ and $10^{21}$ atoms/cm$^3$. The n-type and/or p-type impurities for source/drain regions may be any of the impurities previously discussed. In some embodiments, the lower epitaxial source/drain regions 108 are in situ doped during growth.

As a result of the epitaxy processes used to form the lower epitaxial source/drain regions 108, upper surfaces of the lower epitaxial source/drain regions 108 have facets which expand laterally outward beyond sidewalls of the lower nanostructures 66L. In some embodiments, the dielectric walls 72 block the epitaxial growth, such that the lower epitaxial source/drain regions 108 at opposing sides of the dielectric walls 72 remain separated after the epitaxy process is completed. In some embodiments, fin spacers (not separately illustrated) are formed covering a portion of the sidewalls of the fins 62 that extend above the STI regions 76, thereby blocking the epitaxial growth. In some embodiments, the lower epitaxial source/drain regions 108 extend to the surface of the STI regions 76.

The lower epitaxial source/drain regions 108 may comprise one or more semiconductor material layers. For example, the lower epitaxial source/drain regions 108 may comprise a liner layer, a main layer, and a finishing layer (or more generally, a first semiconductor material layer, a second semiconductor material layer, and a third semiconductor material layer). Each of the liner layer, the main layer, and the finishing layer may be formed of different semiconductor materials and may be doped to different dopant concentrations. In embodiments in which the lower epitaxial source/drain regions 108 include three semiconductor material layers, the liner layers may be grown in the source/drain recesses 104, the main layers may be grown on the liner layers, and the finishing layers may be grown on the main layers. Any number of semiconductor material layers may be used for the lower epitaxial source/drain regions 108.

Figure 12A:
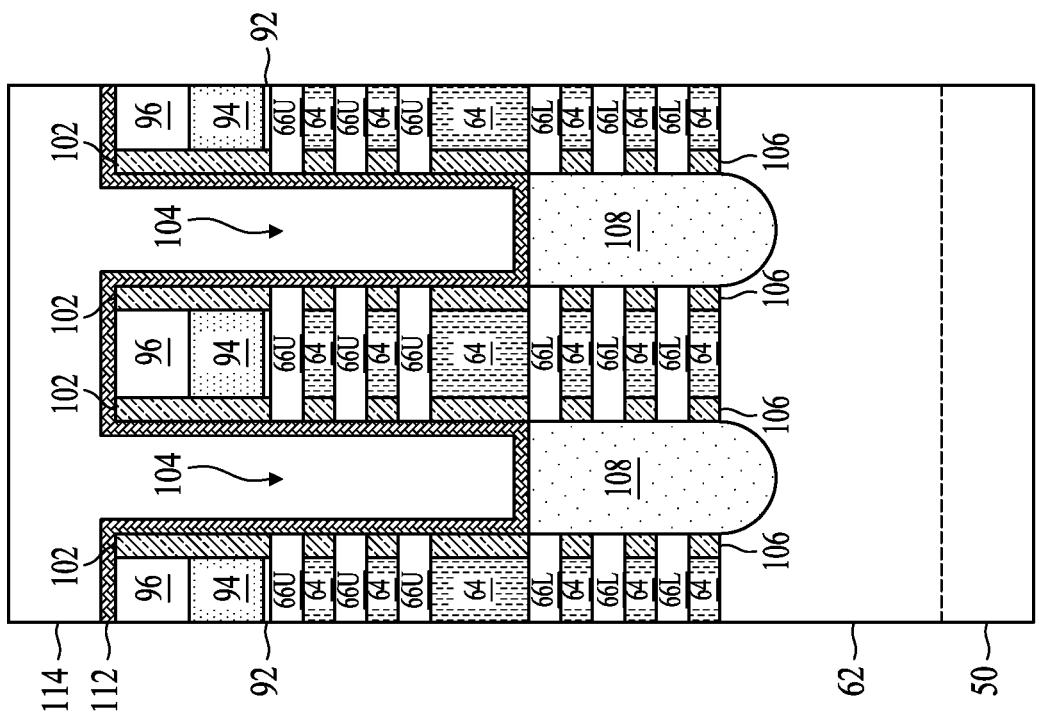
Figure 12B:
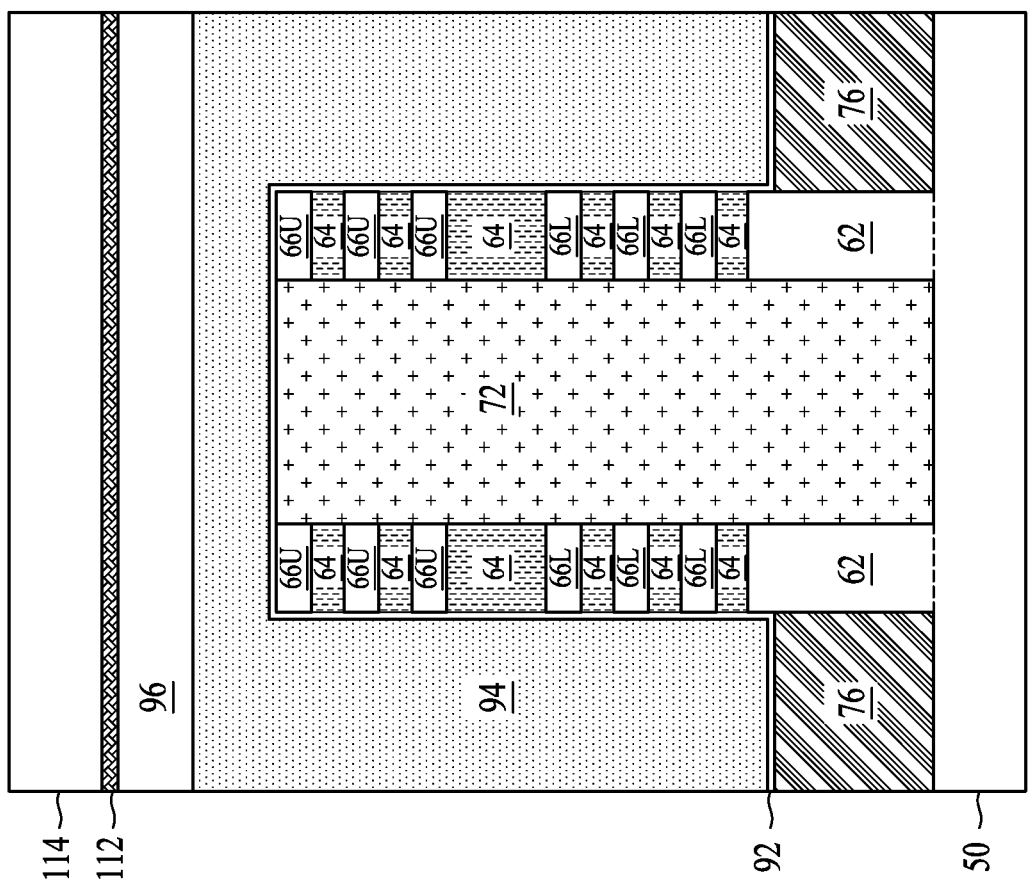
Figure 12C:
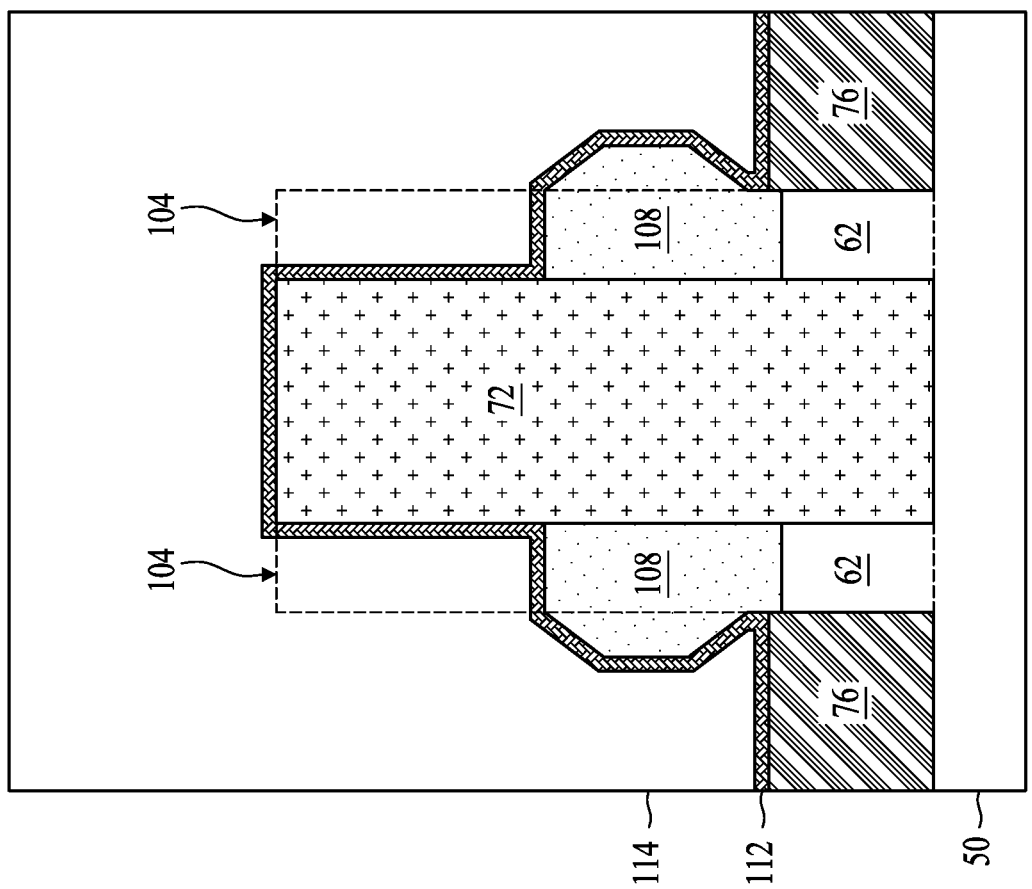

In FIGS. 12A-12C, a first ILD 114 is formed over the lower epitaxial source/drain regions 108, the gate spacers 102, the masks 96 (if present) or the dummy gates 94, the STI regions 76, and the dielectric walls 72. The first ILD 114 may be formed of a dielectric material, which may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a first contact etch stop layer (CESL) 112 is formed between the first ILD 114 and the lower epitaxial source/drain regions 108, the gate spacers 102, the masks 96 (if present) or the dummy gates 94, the STI regions 76, and the dielectric walls 72. The first CESL 112 may be formed of a dielectric material having a high etching selectivity from the etching of the first ILD 114, such as silicon nitride, silicon oxide, silicon oxynitride, or the like, which may be formed by any suitable deposition process, such as CVD, ALD, or the like.

Figure 13A:
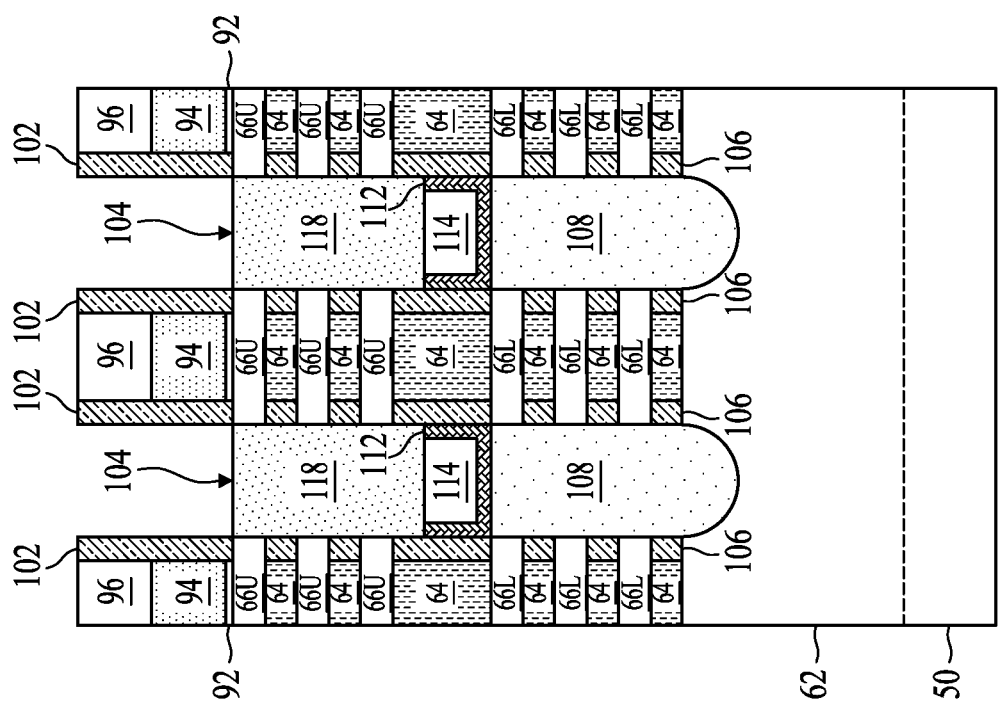
Figure 13B:
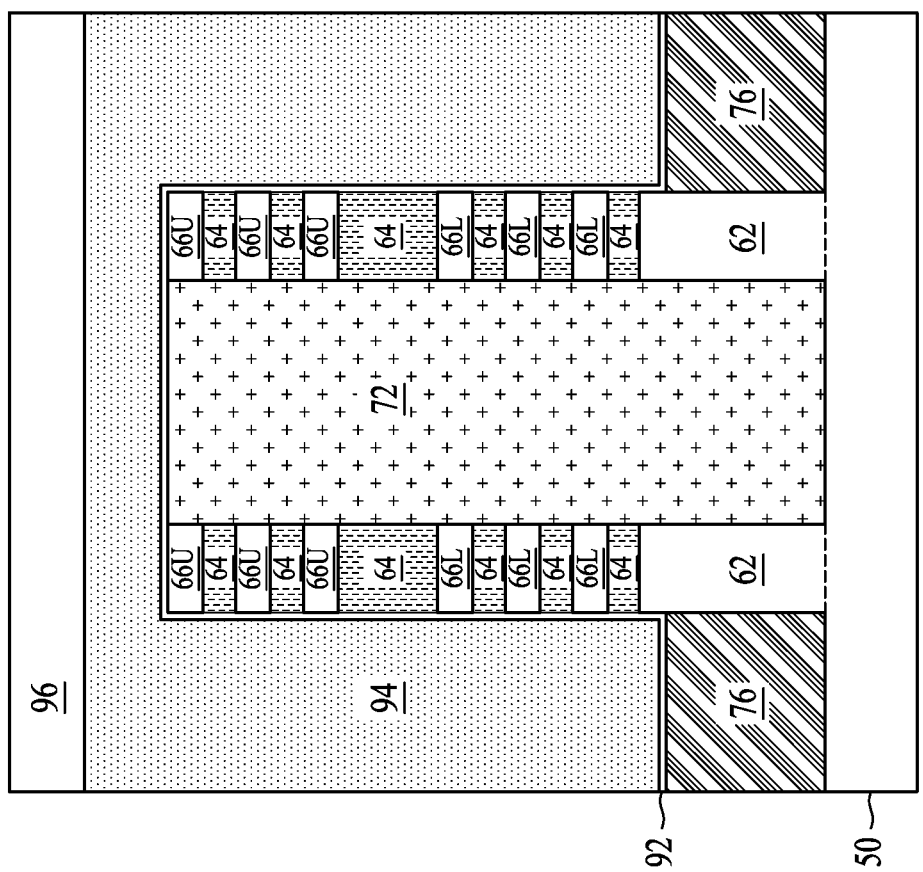
Figure 13C:
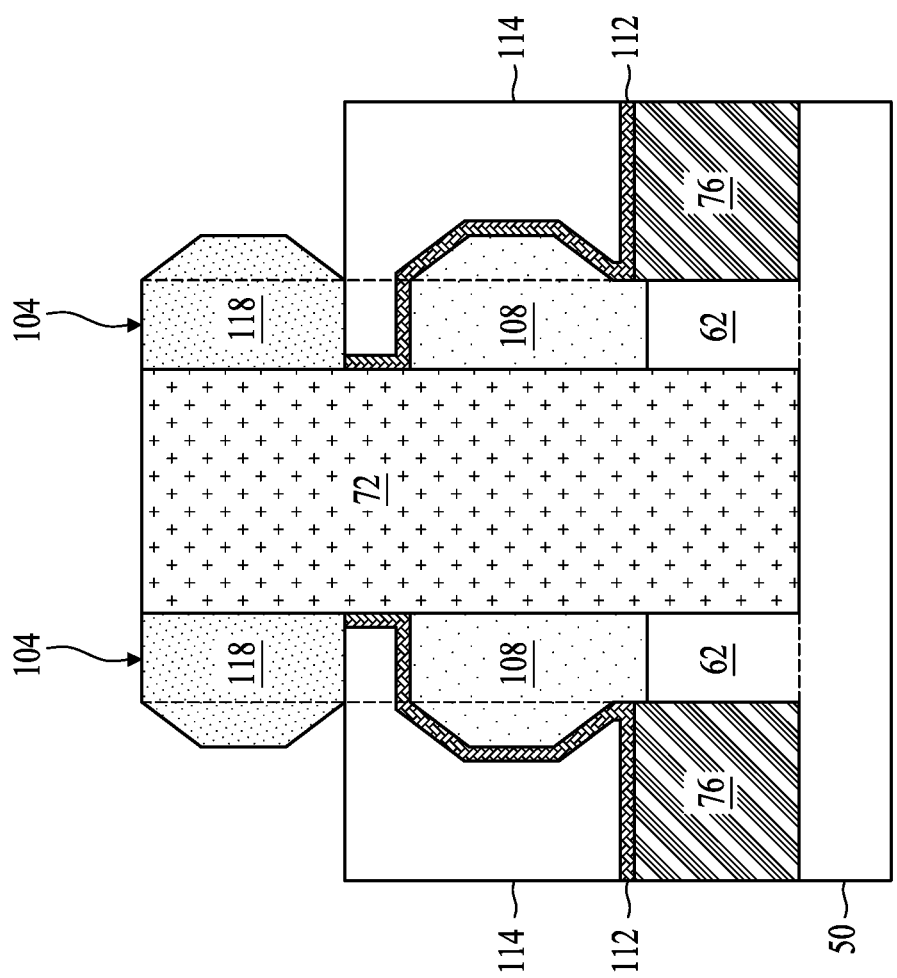

In FIG. 13A-13C, the first ILD 114 and the first CESL 112 are recessed to re-form the upper portions of the source/drain recesses 104. After the recessing, the first CESL 112 and the first ILD 114 only partially fill the source/drain recesses 104, such that the sidewalls of the upper nanostructures 66U are exposed. Upper portions of the dielectric walls 72 may also be exposed. The first ILD 114 and the first CESL 112 may be recessed using an acceptable etching process. The etching exposes the sidewalls of the upper nanostructures 66U. In some embodiments, the first ILD 114 is etched using the first CESL 112 as an etch stop layer, and the first CESL 112 is then etched using the first ILD 114 as an etching mask.

Upper epitaxial source/drain regions 118 are then formed in the upper portions of the source/drain recesses 104. The upper epitaxial source/drain regions 118 only partially fill the source/drain recesses 104, such that the upper epitaxial source/drain regions 118 are in contact with the upper nanostructures 66U and are not in contact with the lower nanostructures 66L. In some embodiments, the upper epitaxial source/drain regions 118 exert stress in the respective channel regions of the upper nanostructures 66U, thereby improving performance. The upper epitaxial source/drain regions 118 are formed in the source/drain recesses 104 such that each dummy gate 94 is disposed between respective neighboring pairs of the upper epitaxial source/drain regions 118 in a top-down view. In some embodiments, the inner spacers 106 are used to separate the upper epitaxial source/drain regions 118 from the nanostructures 64 by an appropriate lateral distance so that the upper epitaxial source/drain regions 118 do not short out with subsequently formed gates of the resulting devices.

The upper epitaxial source/drain regions 118 are epitaxially grown in the upper portions of the source/drain recesses 104. The upper epitaxial source/drain regions 118 may have any desired conductivity type, which is opposite the conductivity type of the channel regions of the upper nanostructures 66U. The conductivity type of the upper epitaxial source/drain regions 118 may be opposite the conductivity type of the lower epitaxial source/drain regions 108, and the conductivity type of the channel regions of the upper nanostructures 66U may be opposite the conductivity type of the channel regions of the lower nanostructures 66L. Put another way, the upper epitaxial source/drain regions 118 may be oppositely doped from the lower epitaxial source/drain regions 108, and the upper nanostructures 66U may be oppositely doped from the lower nanostructures 66L. In some embodiments, the upper epitaxial source/drain regions 118 may be in situ doped during growth.

In some embodiments, the upper epitaxial source/drain regions 118 are n-type source/drain regions. For example, if the upper nanostructures 66U are silicon, the upper epitaxial source/drain regions 118 may include materials exerting a tensile strain on the upper nanostructures 66U, such as silicon, silicon carbide, phosphorous-doped silicon carbide, silicon phosphide, silicon arsenide, or the like. The upper epitaxial source/drain regions 118 may have surfaces raised from respective upper surfaces of the upper nanostructures 66U and may have facets.

In some embodiments, the upper epitaxial source/drain regions 118 are p-type source/drain regions. For example, if the upper nanostructures 66U are silicon-germanium, the upper epitaxial source/drain regions 118 may include materials exerting a compressive strain on the upper nanostructures 66U, such as silicon-germanium, boron-doped silicon-germanium, boron-doped silicon, germanium, germanium tin, or the like. The upper epitaxial source/drain regions 118 may have surfaces raised from respective upper surfaces of the upper nanostructures 66U and may have facets.

The upper epitaxial source/drain regions 118 may be implanted with dopants to form source/drain regions, similar to the process previously discussed for forming lightly-doped source/drain regions, followed by an anneal. The source/drain regions may have an impurity concentration in the range of $10^{19}$ atoms/cm$^3$ and $10^{21}$ atoms/cm$^3$. The n-type and/or p-type impurities for source/drain regions may be any of the impurities previously discussed. In some embodiments, the upper epitaxial source/drain regions 118 are in situ doped during growth.

As a result of the epitaxy processes used to form the upper epitaxial source/drain regions 118, upper surfaces of the upper epitaxial source/drain regions 118 have facets which expand laterally outward beyond sidewalls of the upper nanostructures 66U. In some embodiments, the dielectric walls 72 block the epitaxial growth, such that the upper epitaxial source/drain regions 118 at opposing sides of the dielectric walls 72 remain separated after the epitaxy process is completed.

The upper epitaxial source/drain regions 118 may comprise one or more semiconductor material layers. For example, the upper epitaxial source/drain regions 118 may comprise a liner layer, a main layer, and a finishing layer (or more generally, a first semiconductor material layer, a second semiconductor material layer, and a third semiconductor material layer). Each of the liner layer, the main layer, and the finishing layer may be formed of different semiconductor materials and may be doped to different dopant concentrations. In embodiments in which the upper epitaxial source/drain regions 118 include three semiconductor material layers, the liner layers may be grown in the source/drain recesses 104, the main layers may be grown on the liner layers, and the finishing layers may be grown on the main layers. Any number of semiconductor material layers may be used for the upper epitaxial source/drain regions 118.

The source/drain recesses 104 may be completely filled by the combination of the upper epitaxial source/drain regions 118, the first ILD 114, the first CESL 112, and the lower epitaxial source/drain regions 108. The first ILD 114 and the first CESL 112 are between the upper epitaxial source/drain regions 118 and the lower epitaxial source/drain regions 108. The lower epitaxial source/drain regions 108 are for lower nanostructure-FETs of complementary-FETs, and the upper epitaxial source/drain regions 118 are for upper nanostructure-FETs of the complementary-FETs. The first ILD 114 and the first CESL 112 thus act as isolation regions to prevent shorting of the lower and upper nanostructure-FETs.

Figure 14A:
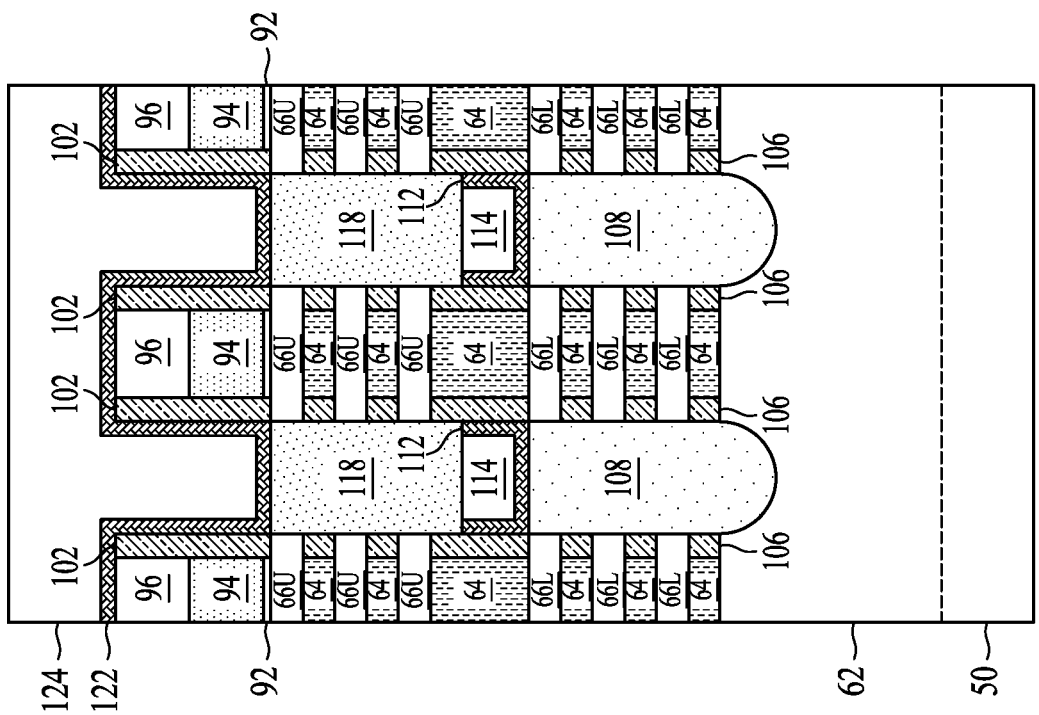
Figure 14B:
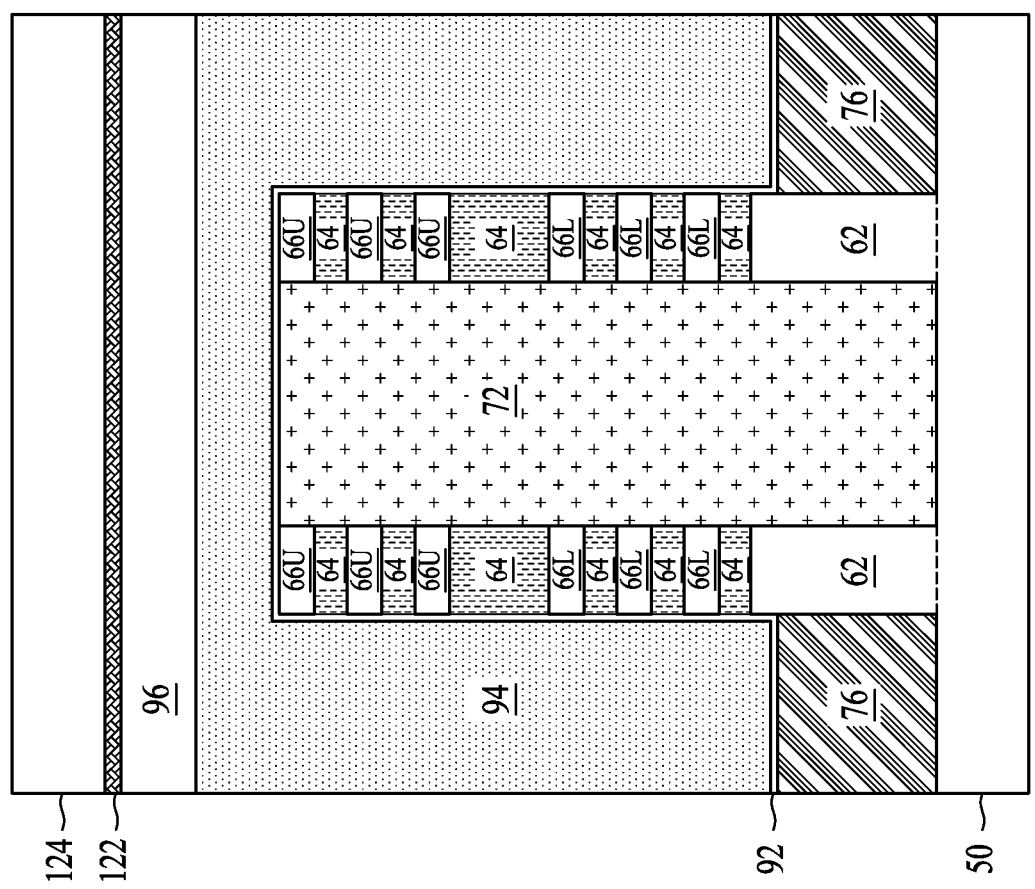
Figure 14C:
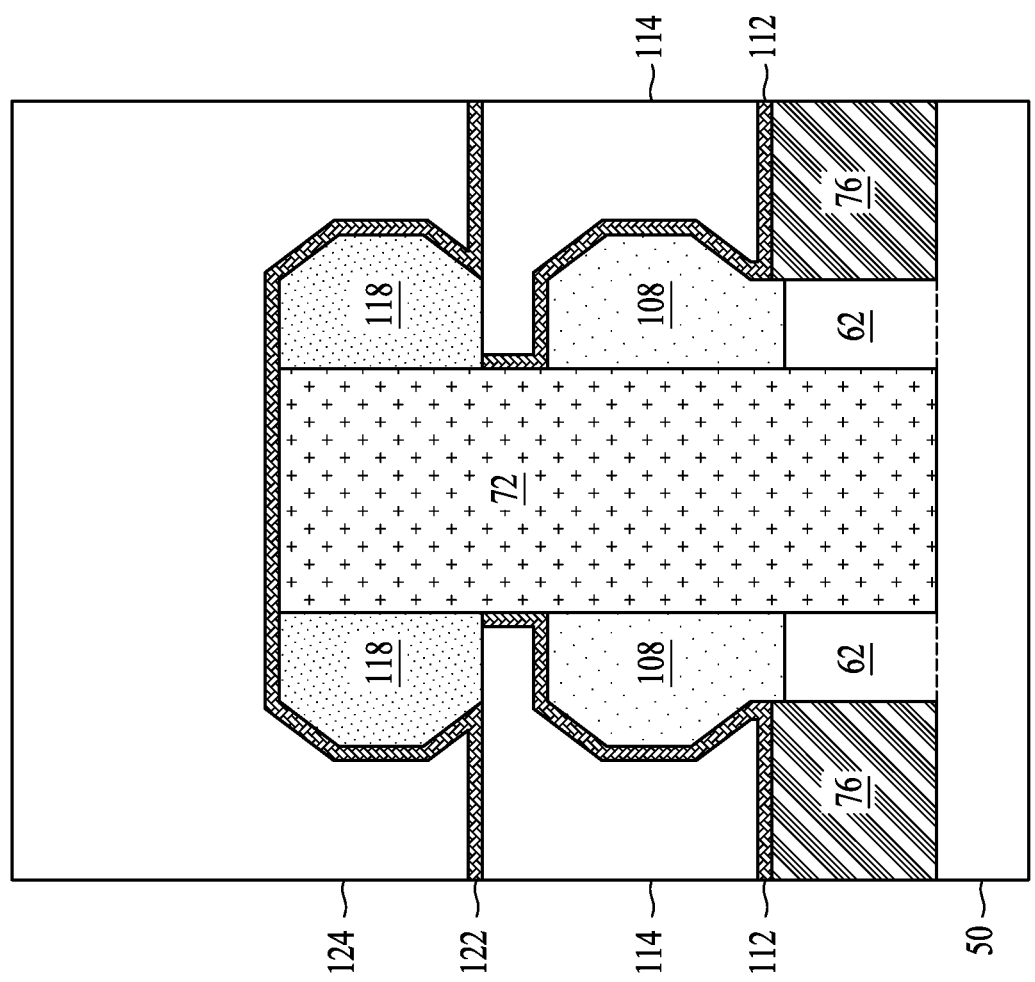

In FIGS. 14A-14C, a second ILD 124 is deposited over the upper epitaxial source/drain regions 118, the first ILD 114, the gate spacers 102, and the masks 96 (if present) or the dummy gates 94. The second ILD 124 may be formed of a dielectric material, which may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, an second CESL 122 is formed between the second ILD 124 and the upper epitaxial source/drain regions 118, the first ILD 114, the gate spacers 102, and the masks 96 (if present) or the dummy gates 94. The second CESL 122 may be formed of a dielectric material having a high etching selectivity from the etching of the second ILD 124, such as, silicon nitride, silicon oxide, silicon oxynitride, or the like, which may be formed by any suitable deposition process, such as CVD, ALD, or the like.

Figure 15A:
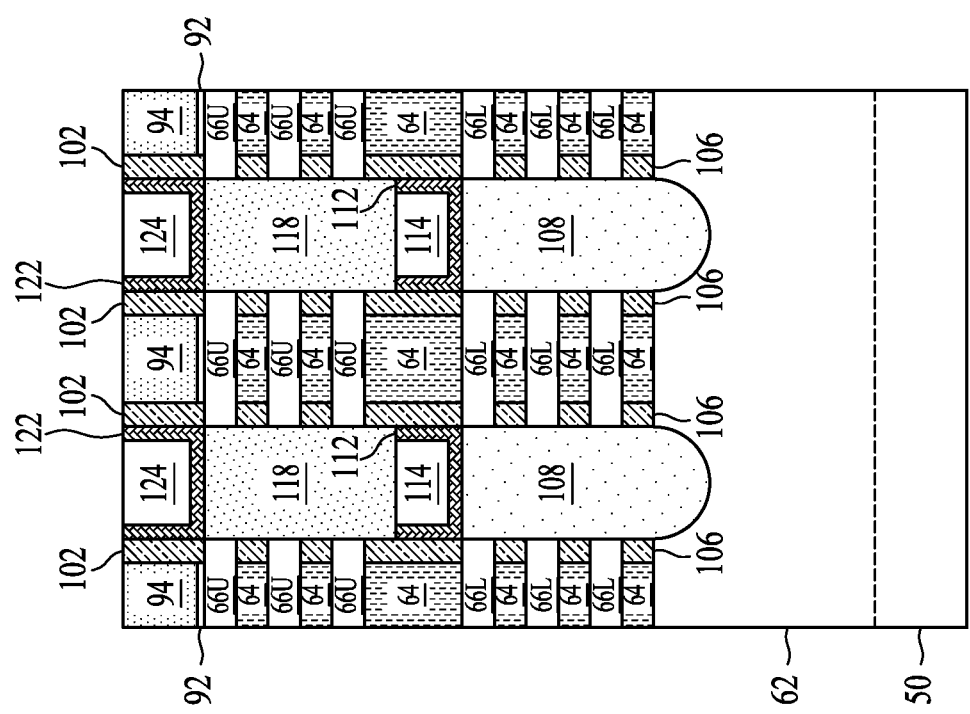
Figure 15B:
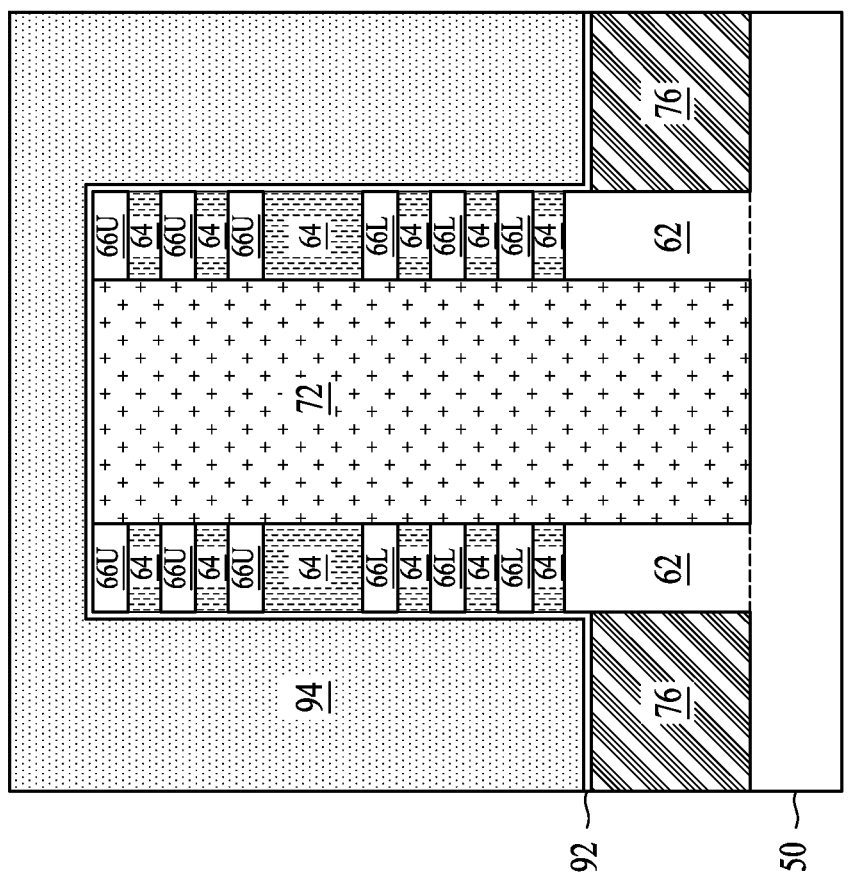
Figure 15C:
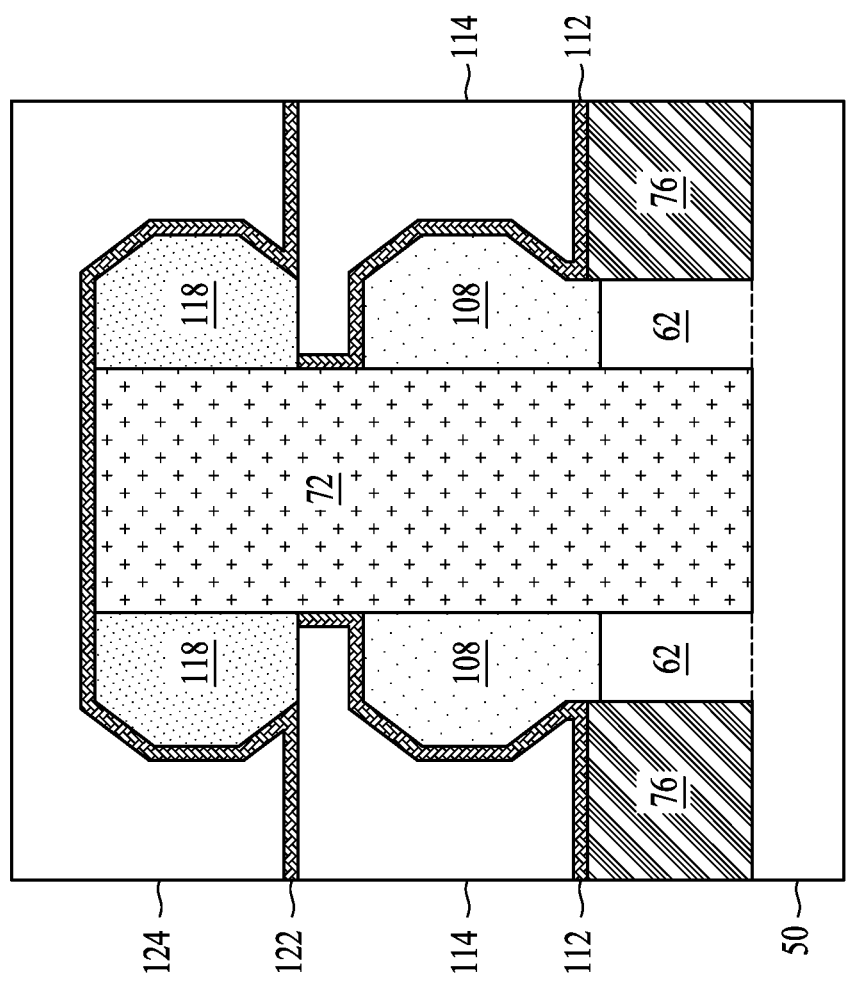

In FIGS. 15A-15C, a removal process is performed to level the top surfaces of the second ILD 124 with the top surfaces of the gate spacers 102 and the masks 96 (if present) or the dummy gates 94. In some embodiments, a planarization process such as a chemical mechanical polish (CMP), an etch-back process, combinations thereof, or the like may be utilized. The planarization process may also remove the masks 96 on the dummy gates 94, and portions of the gate spacers 102 along sidewalls of the masks 96. After the planarization process, top surfaces of the second ILD 124, the second CESL 122, the gate spacers 102, and the masks 96 (if present) or the dummy gates 94 are substantially coplanar (within process variations). Accordingly, the top surfaces of the masks 96 (if present) or the dummy gates 94 are exposed through the second ILD 124. In the illustrated embodiment, the masks 96 are removed such that the top surfaces of the dummy gates 94 are exposed through the second ILD 124.

Figure 16A:
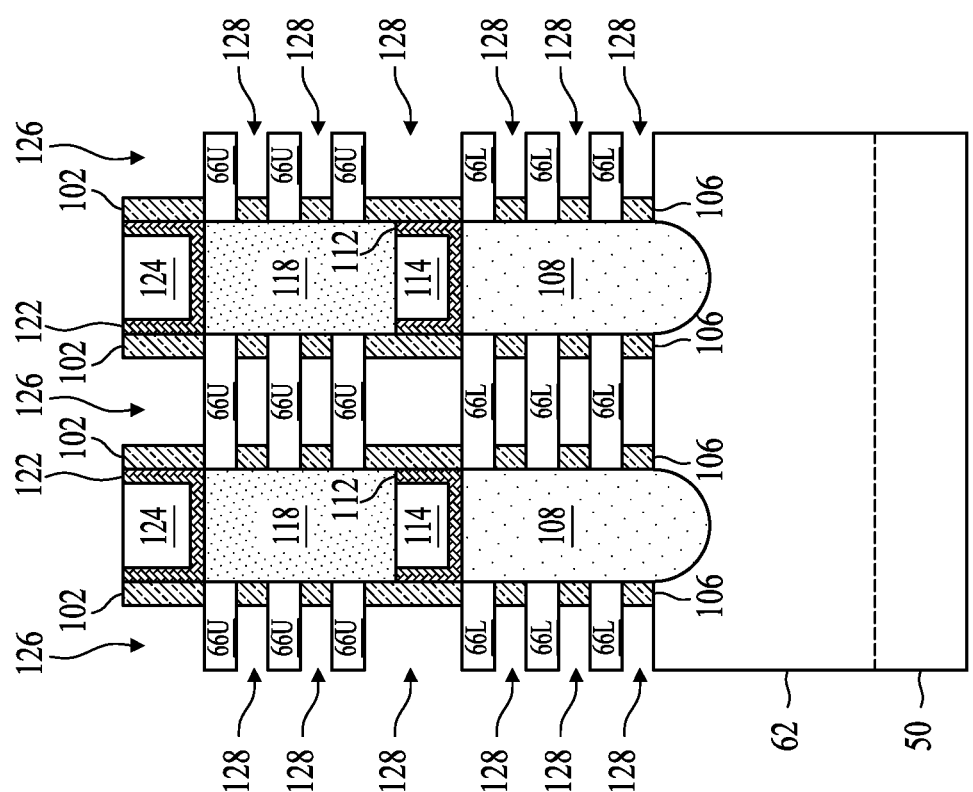
Figure 16B:
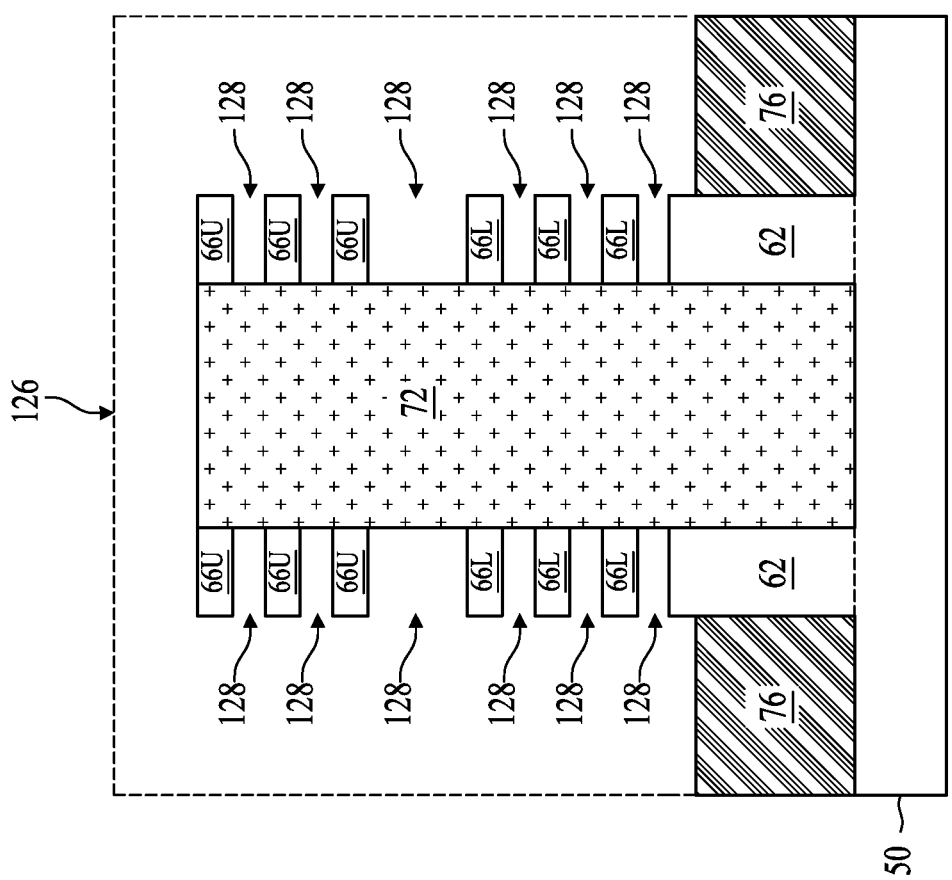
Figure 16C:
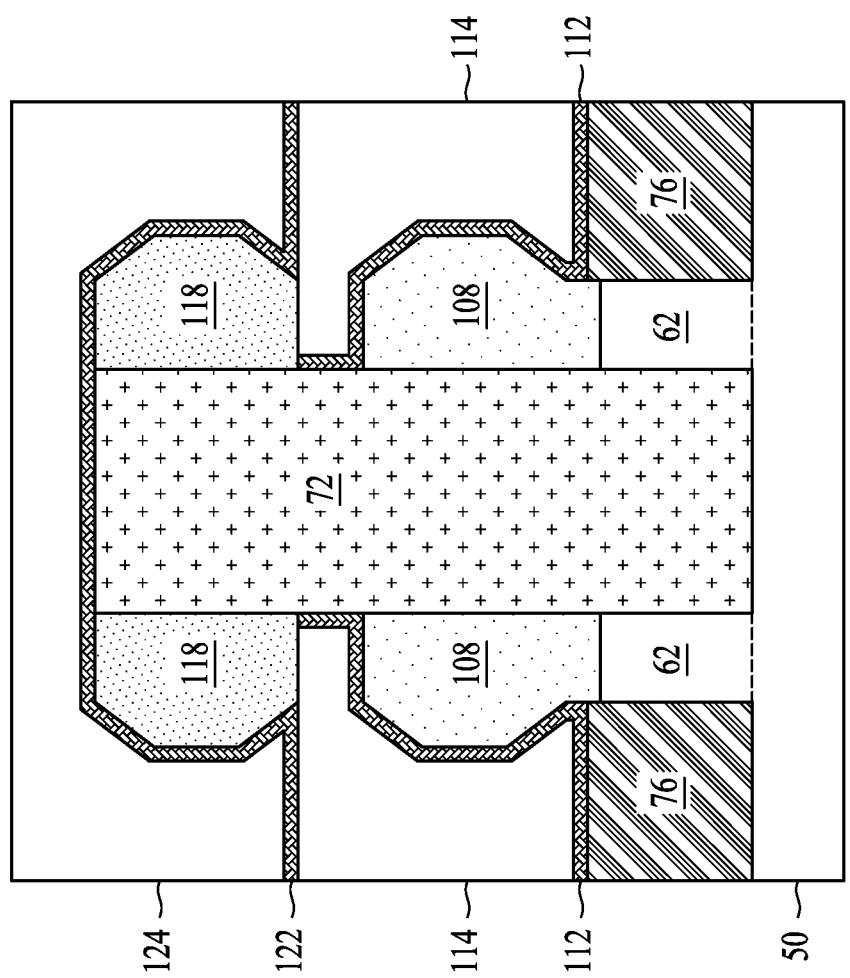

In FIGS. 16A-16C, the dummy gates 94 are removed in one or more etching steps, so that recesses 126 are formed between the gate spacers 102. Portions of the dummy dielectrics 92 in the recesses 126 are also removed. In some embodiments, the dummy gates 94 and the dummy dielectrics 92 are removed by an anisotropic dry etch process. For example, the etching process may include a dry etch process using reaction gas(es) that selectively etch the material of the dummy gates 94 at a faster rate than the materials of the second ILD 124 and the gate spacers 102. Each recesses 126 exposes and/or overlies portions of nanostructures 64, 66, which act as the channel regions in the resulting devices. Portions of the nanostructures 64, 66 which act as the channel regions are disposed between neighboring pairs of the lower epitaxial source/drain regions 108 and the upper epitaxial source/drain regions 118. During the removal, the dummy dielectrics 92 may be used as etch stop layers when the dummy gates 94 are etched. The dummy dielectrics 92 may then be removed after the removal of the dummy gates 94.

The remaining portions of the first nanostructures 64 are then removed to form openings 128 in regions between the second nanostructures 66. The remaining portions of the first nanostructures 64 can be removed by any acceptable etch process that selectively etches the material of the first nanostructures 64 at a faster rate than the material of the second nanostructures 66. The etching may be isotropic. For example, when the first nanostructures 64 are formed of silicon-germanium and the second nanostructures 66 are formed of silicon, the etch process may be a wet etch using tetramethylammonium hydroxide (TMAH), ammonium hydroxide (NH$_4$OH), or the like. In some embodiments, a trim process (not separately illustrated) is performed to decrease the thicknesses of the exposed portions of the second nanostructures 66 and expand the openings 128.

In this embodiment, no etching of the dielectric walls 72 occurs during the formation of the openings 128. As a result, the openings 128 do not extend into the dielectric walls 72. In another embodiment (subsequently described for FIGS. 26A-26C), some etching of the dielectric walls 72 occurs during the formation of the openings 128.

Figure 17A:
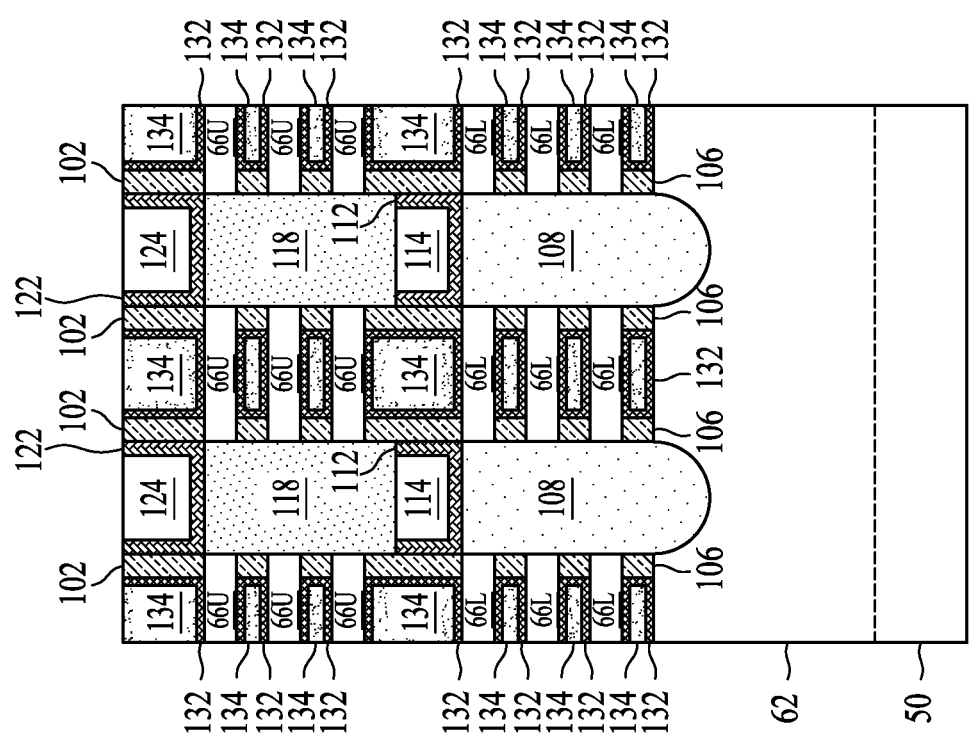
Figure 17B:
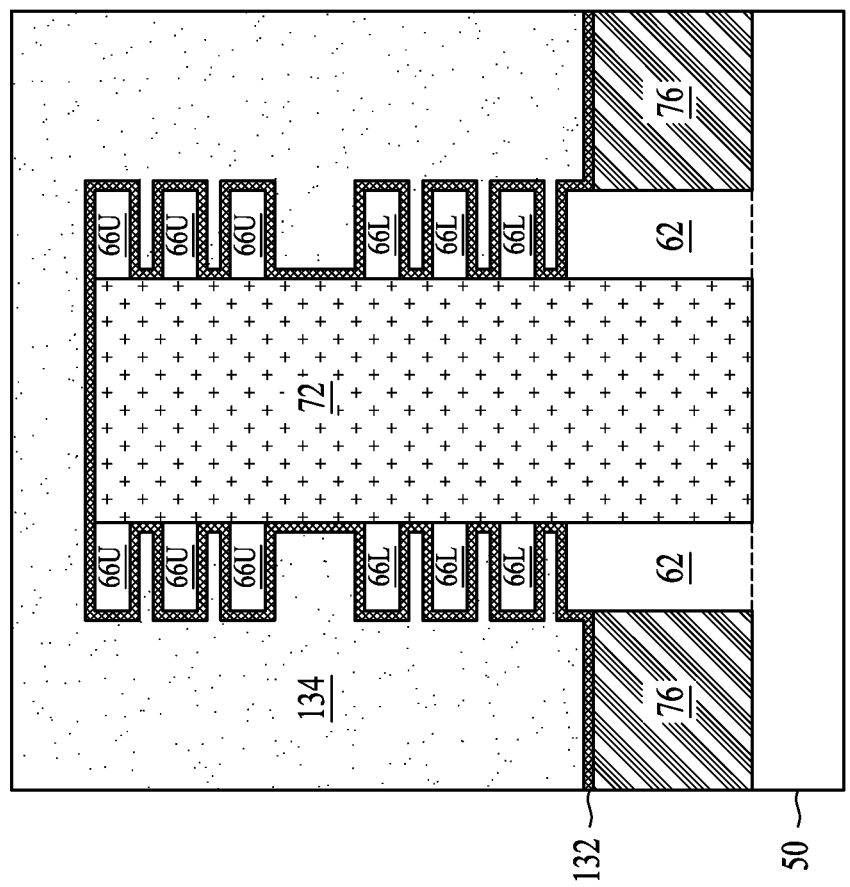
Figure 17C:
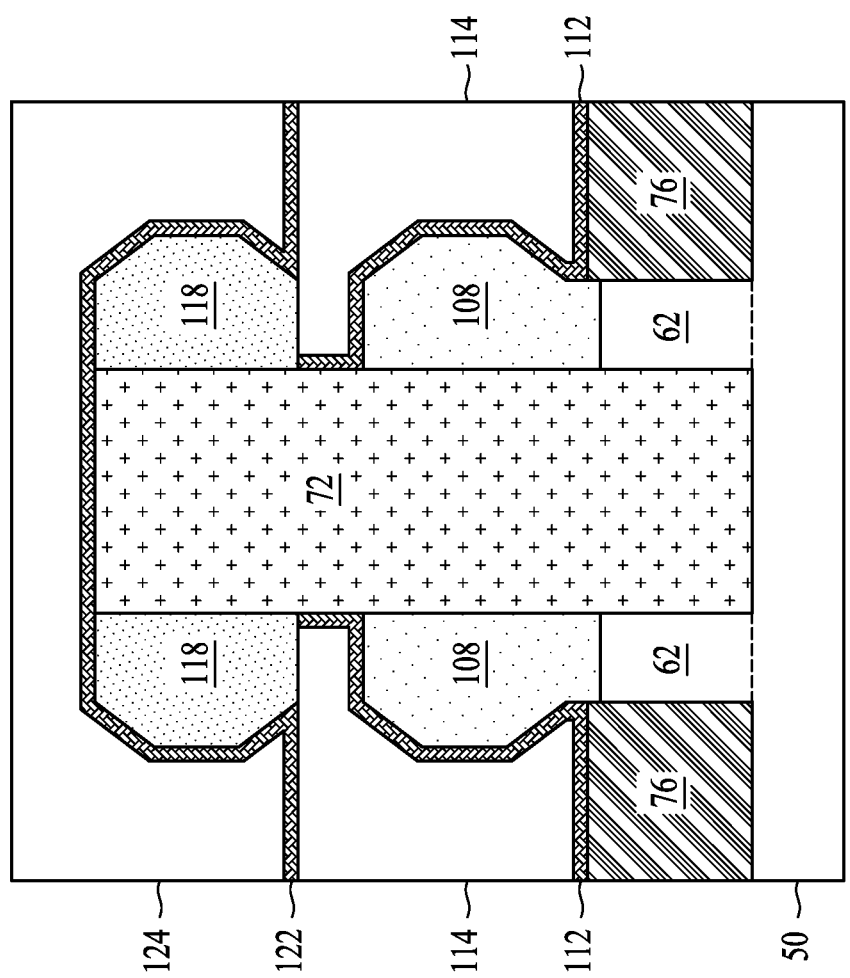

In FIGS. 17A-17C, gate dielectrics 132 and gate electrodes 134 are formed for replacement gates. Each respective pair of a gate dielectric 132 and a gate electrode 134 may be collectively referred to as a "gate structure." Each gate structure extends along three sides (e.g., a top surface, a sidewall, and a bottom surface) of a channel region of a nanostructure 66, such that the gate structure extends along sidewalls, a bottom surface, and a top surface of the nanostructure 66. The gate structures also extend along top surfaces and sidewalls of the dielectric walls 72. The gate structures may also extend along sidewalls and/or a top surface of a fin 62.

The gate dielectrics 132 include one or more gate dielectric layer(s) disposed on the sidewalls and/or the top surfaces of the fins 62; on the top surfaces, the sidewalls, and the bottom surfaces of the channel regions of the nanostructures 66; on the sidewalls of the inner spacers 106; on the sidewalls of the gate spacers 102; and on the sidewalls and/or the top surfaces of the dielectric walls 72. The gate dielectrics 132 may be formed of an oxide such as silicon oxide or a metal oxide, a silicate such as a metal silicate, combinations thereof, multi-layers thereof, or the like. Additionally or alternatively, the gate dielectrics 132 may be formed of a high-k dielectric material (e.g., dielectric materials having a k-value greater than about 7.0), such as a metal oxide and/or silicate of hafnium, aluminum, zirconium, lanthanum, manganese, barium, titanium, lead, and combinations thereof. The dielectric material(s) of the gate dielectrics 132 may be formed by molecular-beam deposition (MBD), ALD, PECVD, or the like. Although single-layered gate dielectrics 132 are illustrated, the gate dielectrics 132 may include any number of interfacial layers and any number of main layers. For example, the gate dielectrics 132 may include an interfacial layer and an overlying high-k dielectric layer.

The gate electrodes 134 include one or more gate electrode layer(s) disposed over the gate dielectrics 132. The gate electrodes 134 may be formed of a metal-containing material such as tungsten, titanium, titanium nitride, tantalum, tantalum nitride, tantalum carbide, aluminum, ruthenium, cobalt, combinations thereof, multi-layers thereof, or the like. Although single-layered gate electrodes 134 are illustrated, the gate electrodes 134 may include any number of work function tuning layers, any number of barrier layers, any number of glue layers, and a fill material.

As an example to form the gate structures, one or more gate dielectric layer(s) may be deposited in the recesses 126 and the openings 128. The gate dielectric layer(s) may also be deposited on the top surfaces of the second ILD 124, the second CESL 122, the gate spacers 102, and the dielectric walls 72. Subsequently, one or more gate electrode layer(s) may be deposited on the gate dielectric layer(s), and in the remaining portions of the recesses 126 and the openings 128. A removal process may then be performed to remove the excess portions of the gate dielectric layer(s) and the gate electrode layer(s), which excess portions are over the top surfaces of the second ILD 124, the second CESL 122, and the gate spacers 102. In some embodiments, a planarization process such as a chemical mechanical polish (CMP), an etch-back process, combinations thereof, or the like may be utilized. The gate dielectric layer(s), after the removal process, have portions left in the recesses 126 and the openings 128 (thus forming the gate dielectrics 132). The gate electrode layer(s), after the removal process, have portions left in the recesses 126 and the openings 128 (thus forming the gate electrodes 134). When a planarization process is utilized, the top surfaces of the gate spacers 102, the second CESL 122, the second ILD 124, the gate dielectrics 132, and the gate electrodes 134 are substantially coplanar (within process variations).

In this embodiment where no losses of the dielectric walls 72 occurs during the etching of the source/drain recesses 104 (see FIGS. 10A-10C), the portions of the dielectric walls 72 beneath the gate structures (see FIG. 17B) have a same height as the portions of the dielectric walls 72 adjacent the lower epitaxial source/drain regions 108 and the upper epitaxial source/drain regions 118 (see FIG. 17C). Additionally, in this embodiment, the top surfaces of the gate electrodes 134 are above the top surfaces of the dielectric walls 72. In another embodiment (subsequently described for FIGS. 32-34), the top surfaces of the gate electrodes 134 are coplanar with top surfaces of the dielectric walls 72.

Figure 18A:
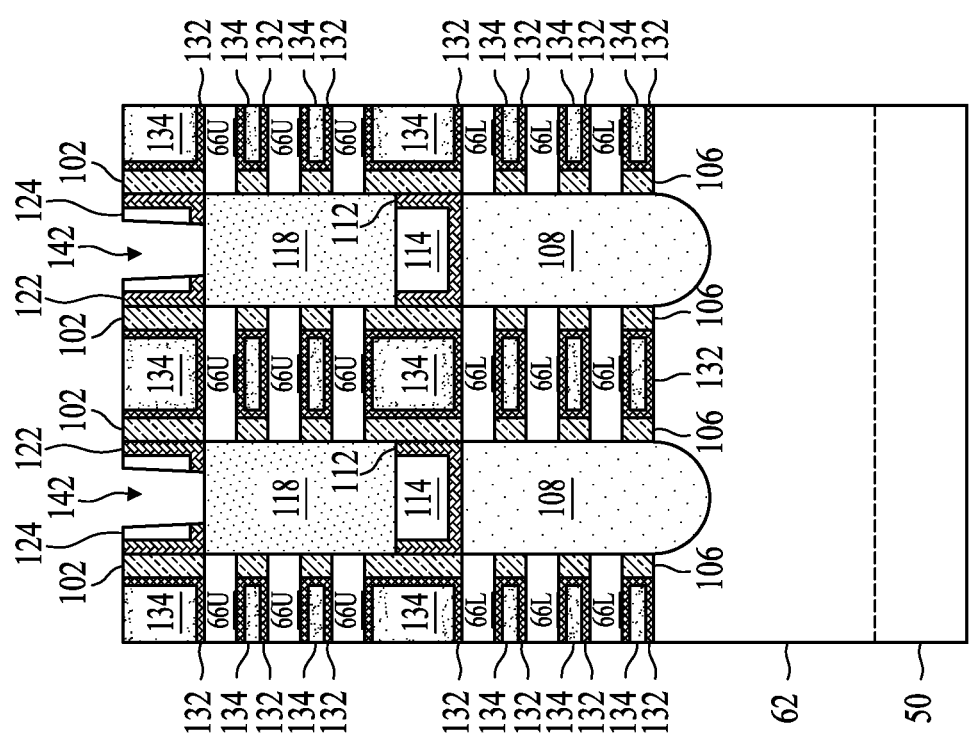
Figure 18B:
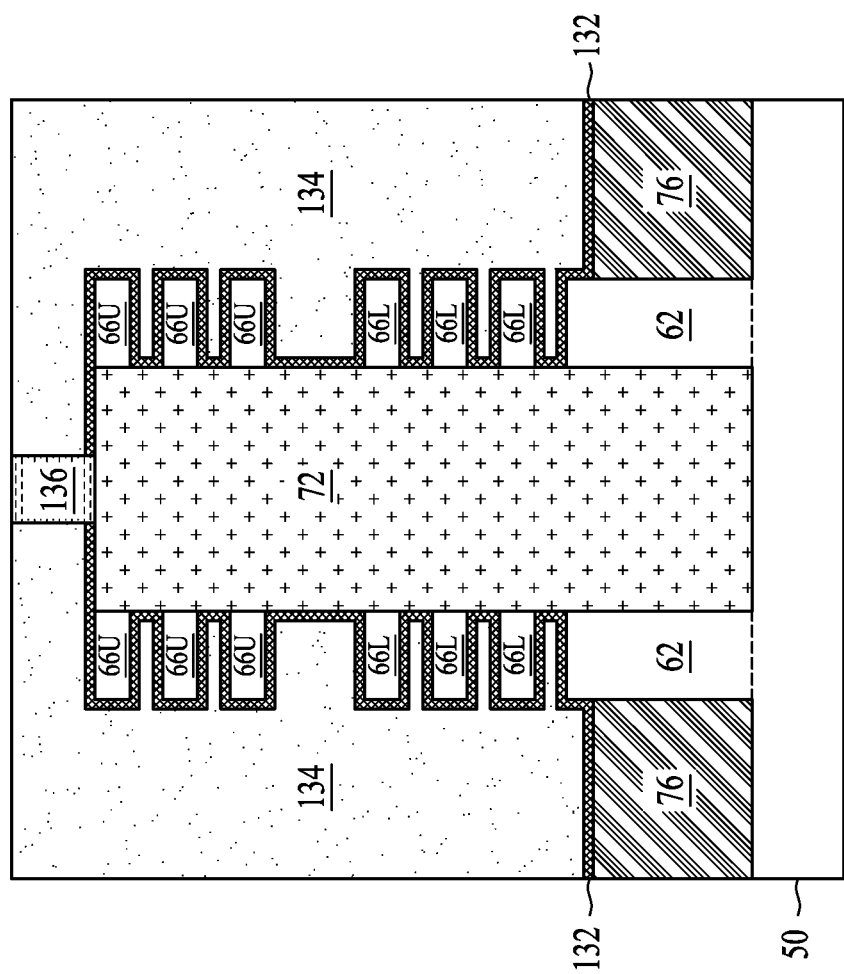
Figure 18C:
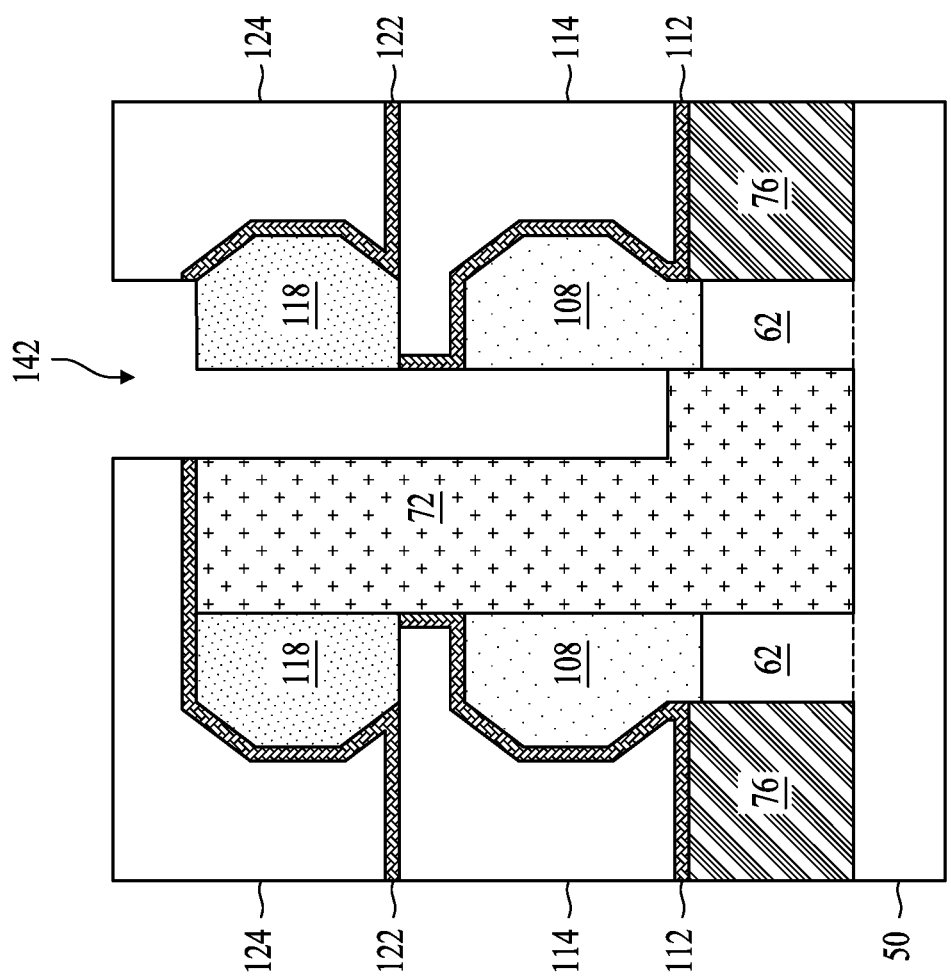

In FIGS. 18A-18C, a gate isolation structure 136 is formed to divide (or "cut") a gate structure (including a gate dielectric 132 and a gate electrode 134) into multiple gate segments. As an example to form the gate isolation structure 136, an opening may be patterned in a gate structure. Any acceptable etching process, such as a dry etch, a wet etch, the like, or a combination thereof, may be performed to pattern the opening. The etching may be anisotropic. The opening exposes a top surface of a dielectric wall 72. One or more dielectric material(s) are deposited in the opening. Acceptable dielectric materials include silicon nitride, silicon oxide, silicon oxynitride, or the like, which may be formed by a deposition process such as CVD, ALD, or the like. A removal process may be performed to remove the excess portions of the dielectric material(s), which excess portions are over the top surfaces of the gate electrode 134, thereby forming the gate isolation structure 136. A gate isolation structure 136 may isolate the gate structures of adjacent devices.

Contact openings 142 are formed to expose the lower epitaxial source/drain regions 108 and the upper epitaxial source/drain regions 118. The contact openings 142 expose top surfaces and sidewalls of the upper epitaxial source/drain regions 118, sidewalls of the lower epitaxial source/drain regions 108, and sidewalls of the dielectric walls 72. The contact openings 142 may be formed using acceptable photolithography and etching techniques.

In some embodiments, a multi-step etching process is utilized to form the contact openings 142. A first etch may be performed to form upper portions of the contact openings 142 in the second ILD 124 and the second CESL 122, thereby exposing top surfaces of the upper epitaxial source/drain regions 118 and the dielectric walls 72. The first etch may be selective to the materials of the second ILD 124 and the second CESL 122 (e.g., selectively etches the materials of the second ILD 124 and the second CESL 122 at a faster rate than the material(s) of the dielectric walls 72). The etching may be anisotropic. A second etch may then be performed to form the lower portions of the contact openings 142 in the dielectric walls 72, thereby exposing the sidewalls of the lower epitaxial source/drain regions 108 and the sidewalls of the upper epitaxial source/drain regions 118. The second etch may be selective to the material(s) of the dielectric walls 72 (e.g., selectively etches the material(s) of the dielectric walls 72 at a faster rate than the materials of the lower epitaxial source/drain regions 108 and the upper epitaxial source/drain regions 118).

Figure 19A:
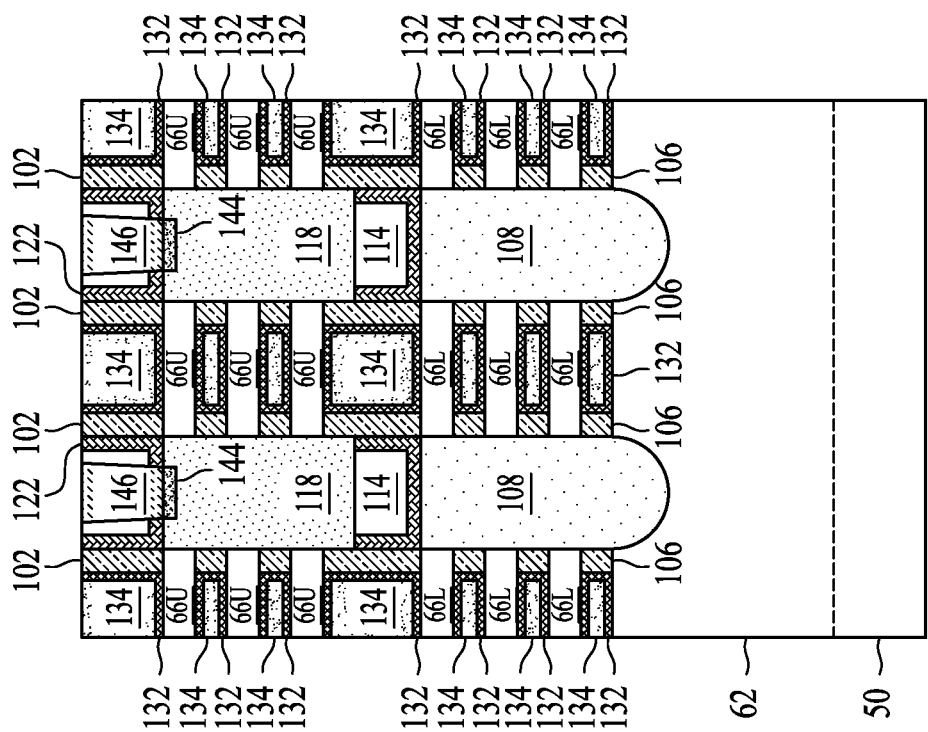
Figure 19B:
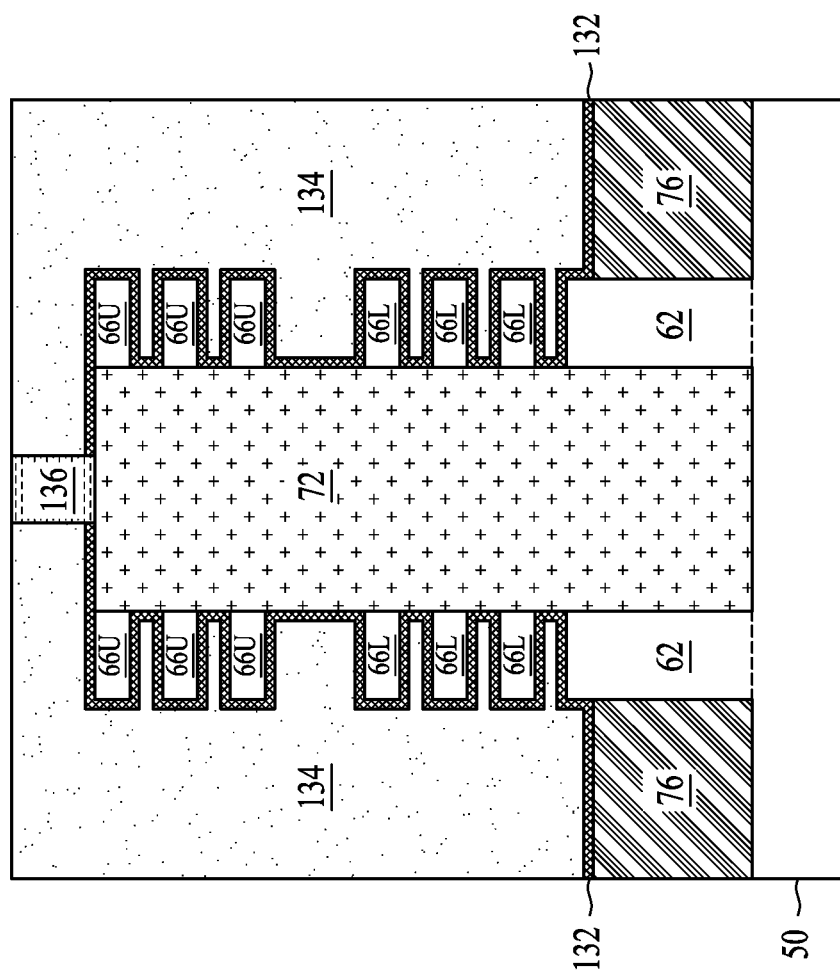
Figure 19C:
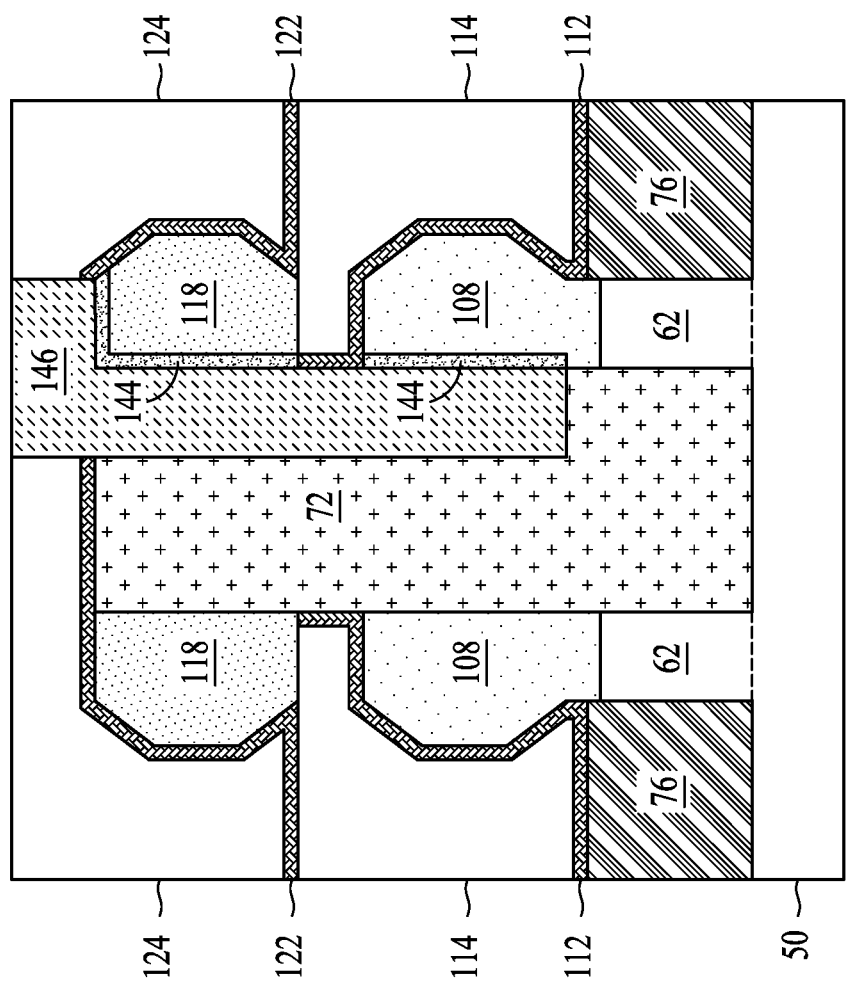

In FIGS. 19A-19C, shared source/drain contacts 146 are formed in the contact openings 142. The shared source/drain contacts 146 are physically and electrically coupled to the lower epitaxial source/drain regions 108 and to the upper epitaxial source/drain regions 118. Specifically, a shared source/drain contact 146 is shared with both an upper epitaxial source/drain region 118 and a lower epitaxial source/drain region 108 that is below the upper epitaxial source/drain region 118.

As an example to form the shared source/drain contacts 146, a liner (not separately illustrated), such as a diffusion barrier layer, an adhesion layer, or the like, and a conductive material are formed in the contact openings 142. The liner may include titanium, titanium nitride, tantalum, tantalum nitride, or the like. The conductive material may be cobalt, tungsten, copper, a copper alloy, silver, gold, aluminum, nickel, or the like. A removal process may be performed to remove excess material from the top surfaces of the gate spacers 102, the second ILD 124, the gate electrodes 134, and the gate isolation structure 136. The remaining liner and conductive material form the shared source/drain contacts 146 in the contact openings 142. In some embodiments, a planarization process such as a chemical mechanical polish (CMP), an etch-back process, combinations thereof, or the like is utilized. After the planarization process, the top surfaces of the gate spacers 102, the second ILD 124, the gate electrodes 134, the gate isolation structure 136, and the shared source/drain contacts 146 are substantially coplanar (within process variations).

Optionally, metal-semiconductor alloy regions 144 are formed at the interfaces between the shared source/drain contacts 146 and the lower epitaxial source/drain regions 108 and/or to the upper epitaxial source/drain regions 118. The metal-semiconductor alloy regions 144 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 144 can be formed before the shared source/drain contacts 146 by depositing a metal in the contact openings 142 and then performing a thermal anneal process. The metal can be any metal capable of reacting with the semiconductor materials (e.g., silicon, silicon-germanium, germanium, etc.) of the lower epitaxial source/drain regions 108 and/or to the upper epitaxial source/drain regions 118 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the contact openings 142, such as from surfaces of the metal-semiconductor alloy regions 144. The material(s) of the shared source/drain contacts 146 can then be formed on the metal-semiconductor alloy regions 144.

Figure 20A:
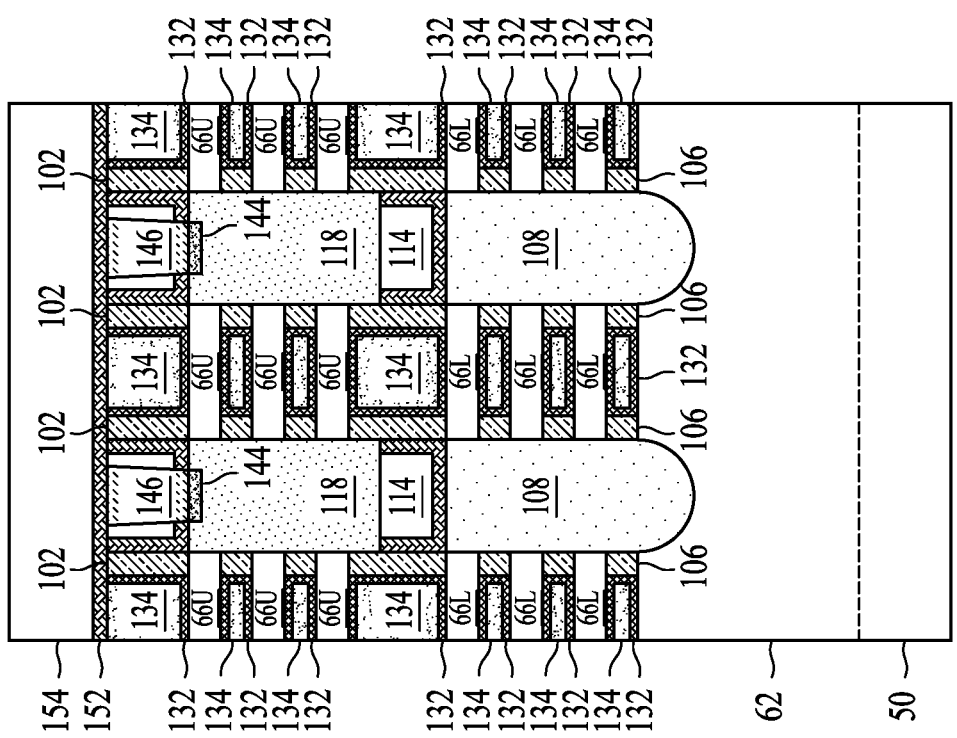
Figure 20B:
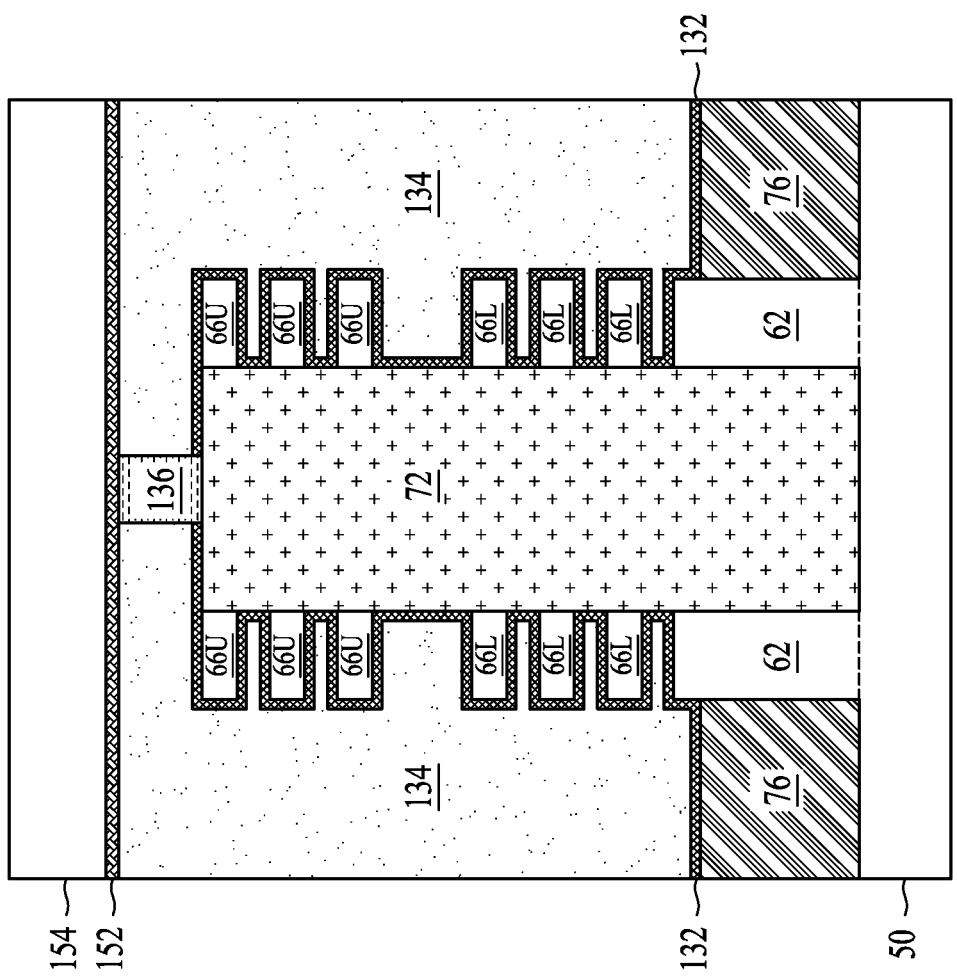
Figure 20C:
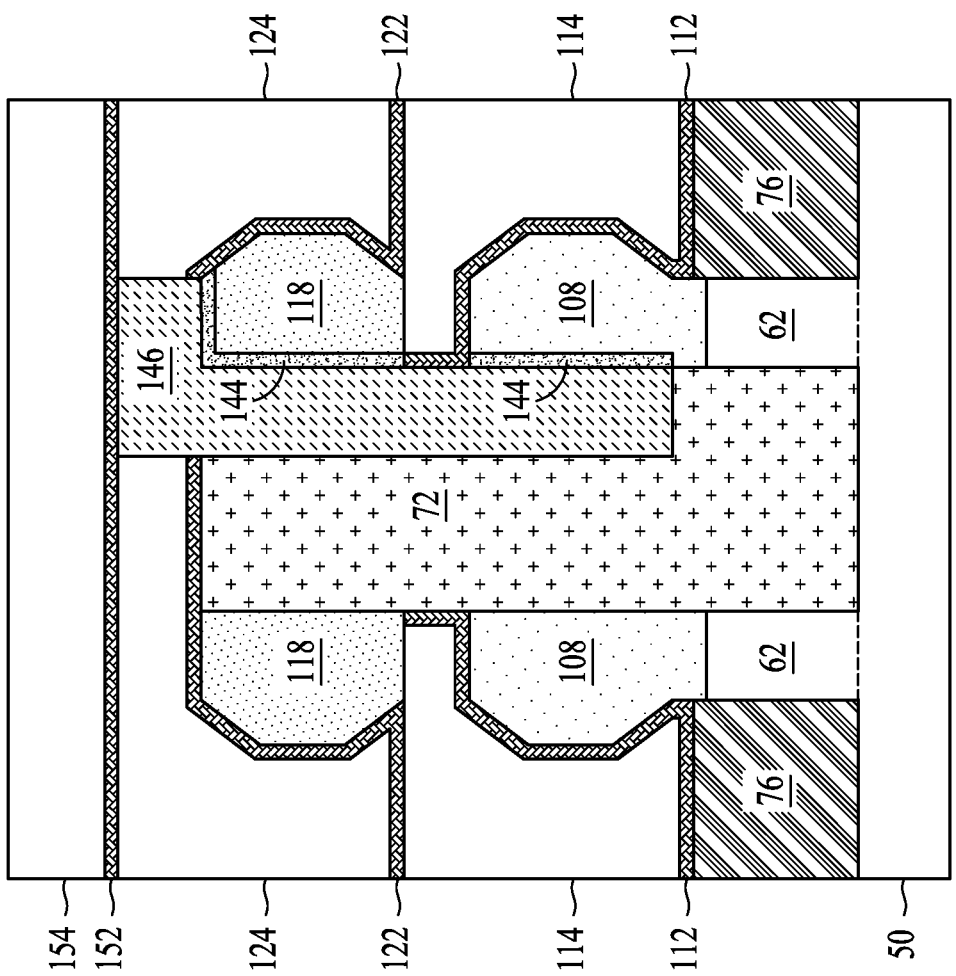

In FIGS. 20A-20C, a third ILD 154 is deposited over the gate spacers 102, the second ILD 124, the gate electrodes 134, and the shared source/drain contacts 146. In some embodiments, the third ILD 154 is a flowable film formed by a flowable CVD method. In some embodiments, the third ILD 154 is formed of a dielectric material such as PSG, BSG, BPSG, USG, or the like, which may be deposited by any suitable method, such as CVD, PECVD, or the like.

In some embodiments, an etch stop layer (ESL) 152 is formed between the third ILD 154 and the gate spacers 102, the second ILD 124, the gate electrodes 134, and the shared source/drain contacts 146. The ESL 152 may include a dielectric material having a high etching selectivity from the etching of the third ILD 154, such as, silicon nitride, silicon oxide, silicon oxynitride, or the like.

Figure 21A:
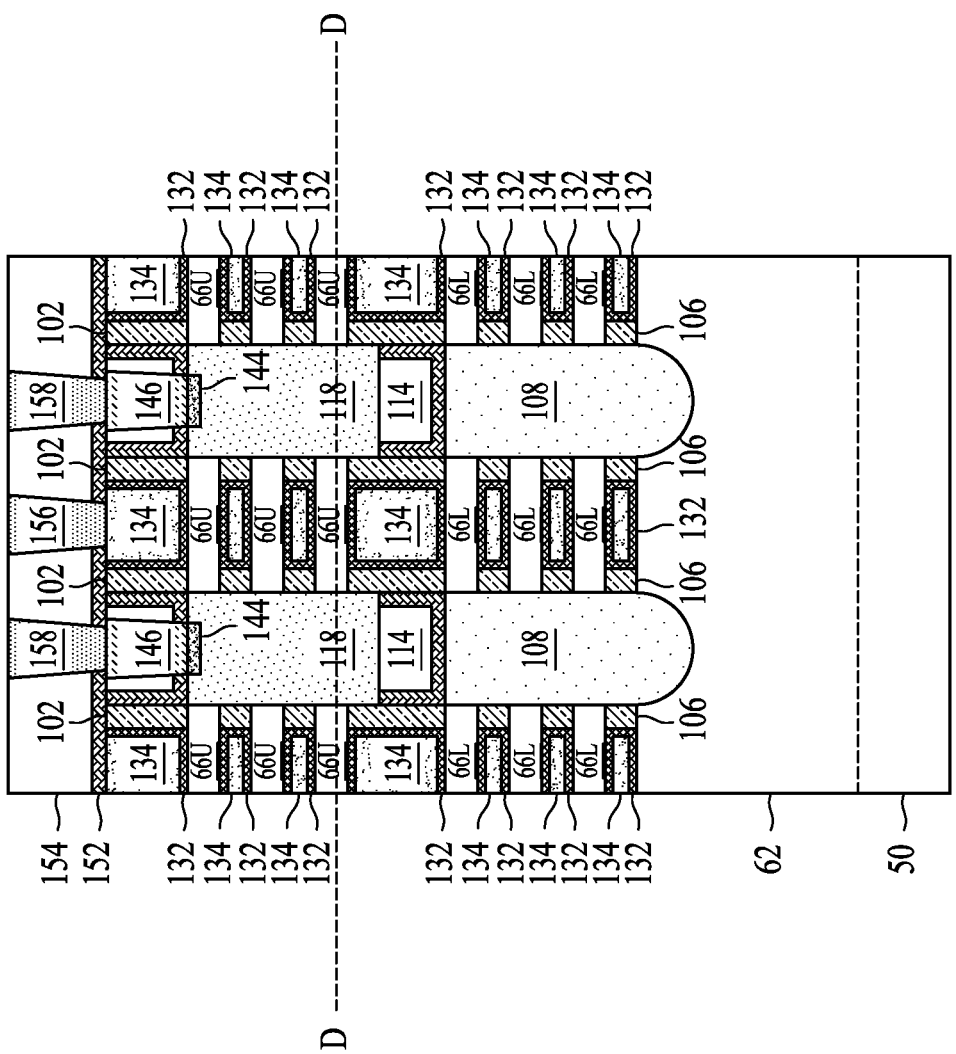
Figure 21B:
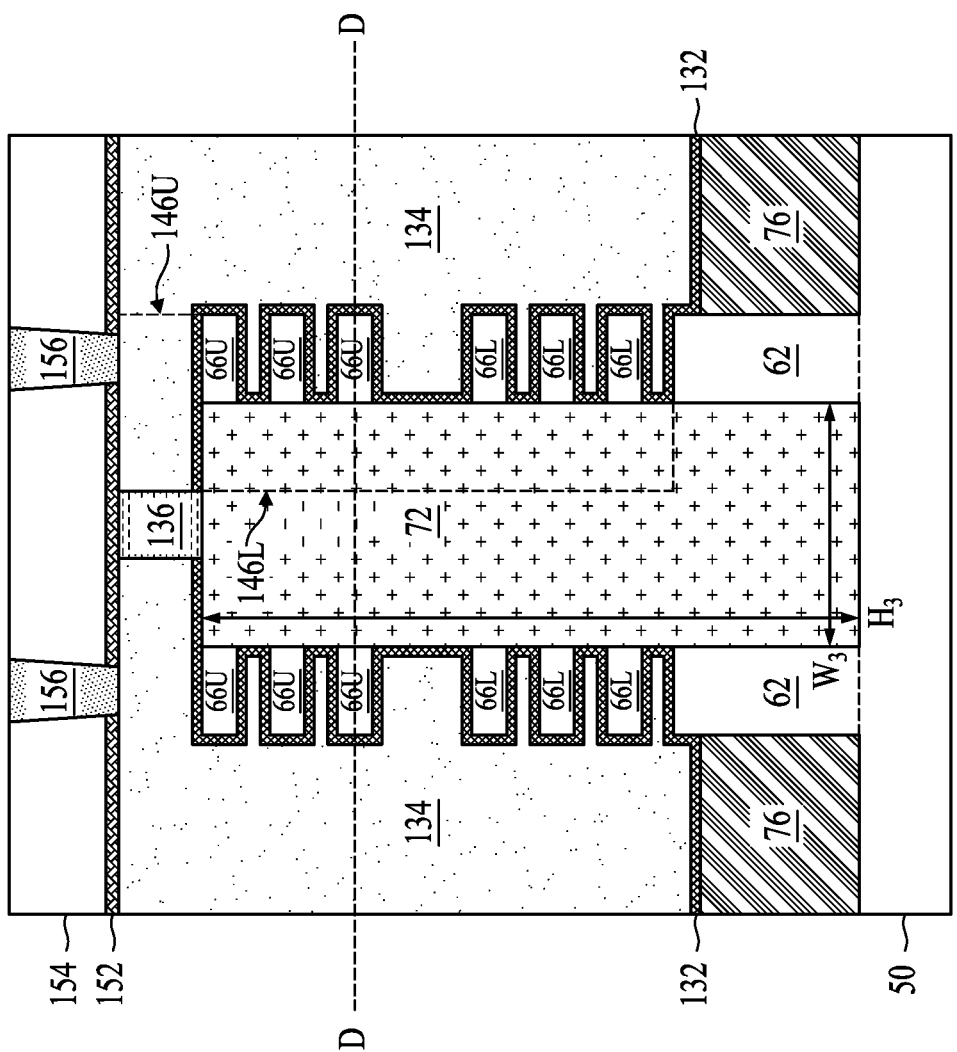
Figure 21C:
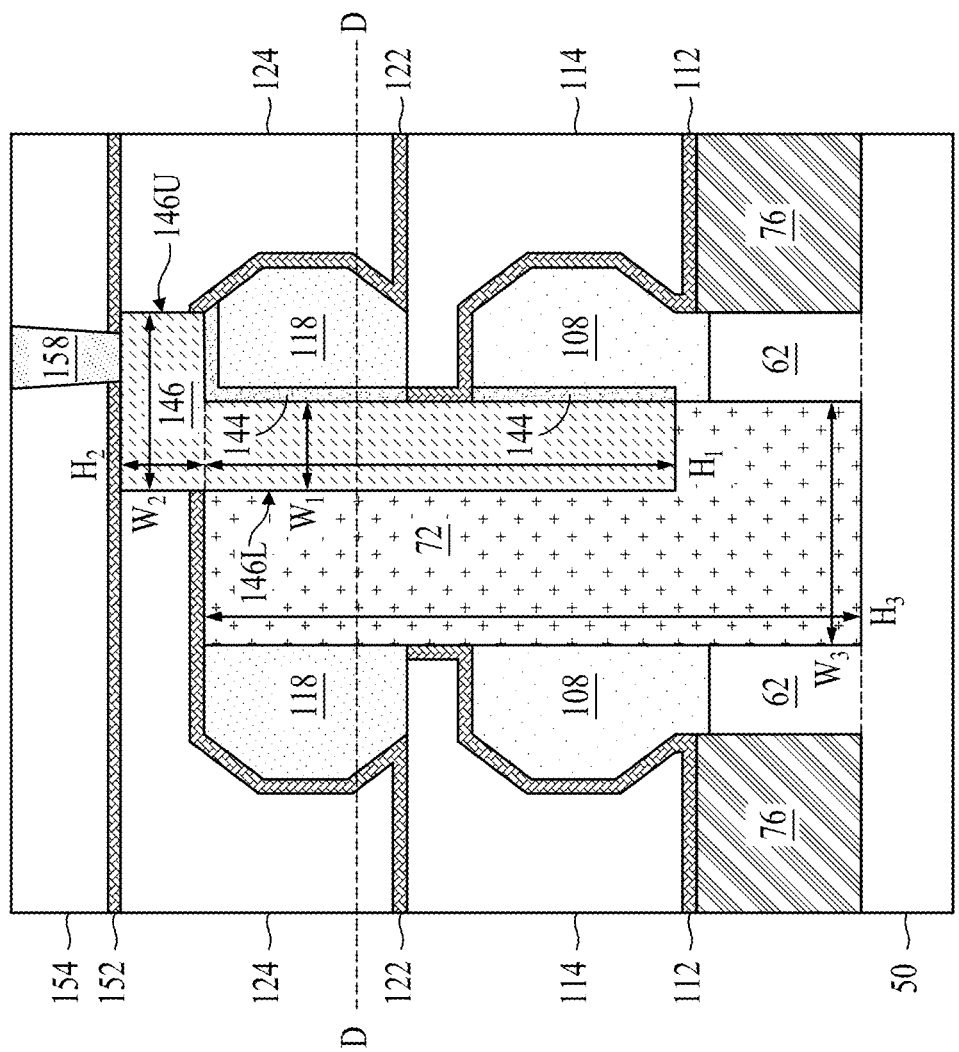

In FIGS. 21A-21C, gate contacts 156 and source/drain vias 158 are formed to contact, respectively, the gate electrodes 134 and the shared source/drain contacts 146. The gate contacts 156 may be physically and electrically coupled to the gate electrodes 134. The source/drain vias 158 may be physically and electrically coupled to the shared source/drain contacts 146.

As an example to form the gate contacts 156 and the source/drain vias 158, openings for the gate contacts 156 and the source/drain vias 158 are formed through the third ILD 154 and the ESL 152. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the third ILD 154. The remaining liner and conductive material form the gate contacts 156 and the source/drain vias 158 in the openings. The gate contacts 156 and the source/drain vias 158 may be formed in distinct processes, or may be formed in the same process. Although shown as being formed in the same cross-section, it should be appreciated that each of the gate contacts 156 and the source/drain vias 158 may be formed in different cross-sections, which may avoid shorting of the contacts.

Features of the shared source/drain contacts 146 are illustrated in FIG. 21B (in ghost) and in FIG. 21C. The shared source/drain contacts 146 have upper portions 146U in the second ILD 124 and have lower portions 146L in the dielectric walls 72. The upper portions 146U are wider than the lower portions 146L in the cross-section of FIG. 21C (e.g., in a direction parallel to a lengthwise direction of the gate structures). In some embodiments, the lower portions 146L have a width $W_1$ in the range of 8 nm to 25 nm and the upper portions 146U have a width $W_2$ in the range of 18 nm to 90 nm. The width $W_2$ may be greater than the width $W_1$. The source/drain vias 158 contact the upper portions 146U, and forming the upper portions 146U to be wider than the lower portions 146L may increasing the processing window for forming the source/drain vias 158. The lower portions 146L are taller than the upper portions 146U in the cross-section of FIG. 21C. In some embodiments, the lower portions 146L have a height $H_1$ in the range of 20 nm to 120 nm and the upper portions 146U have a height $H_2$ in the range of 10 nm to 40 nm. The height $H_2$ may be less than the height $H_1$. A lengthwise direction of the lower portions 146L is parallel to a lengthwise direction of the dielectric walls 72. In this embodiment where no losses of the dielectric walls 72 occurs during the etching of the source/drain recesses 104 (see FIGS. 10A-10C), the dielectric walls 72 have a height $H_3$ in the range of 50 nm to 250 nm and have a width $W_3$ (between adjacent fins 62) in the range of 10 nm to 50 nm.

Figure 21D:
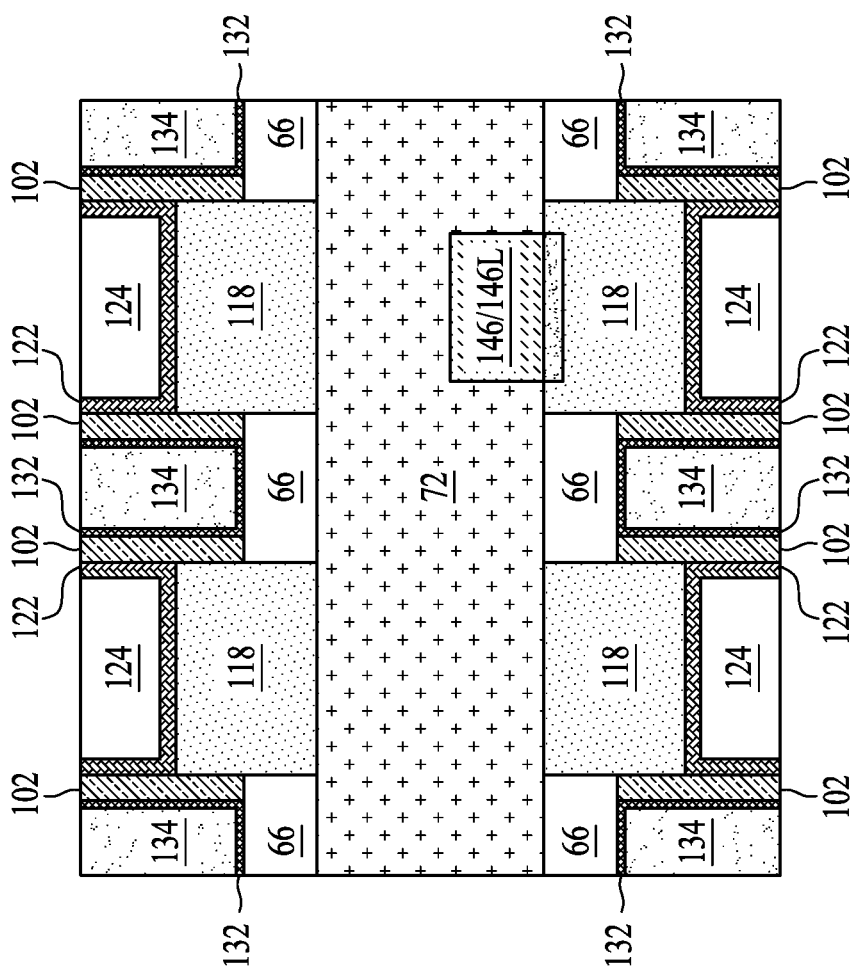

FIG. 21D is a top-down view illustrated along cross-section D-D in FIGS. 21A-21C. As previously described, the gate electrodes 134 extend above the dielectric walls 72 (see FIG. 21B). As a result, the lower portions 146L of the shared source/drain contacts 146 (e.g., the portions in the dielectric walls 72) do not extend along the sidewalls of the gate electrodes 134 in the top-down view of FIG. 21D. Indeed, as more clearly shown in FIG. 21B, a majority of an shared source/drain contact 146 (e.g., the lower portion 146L) extends along a dielectric wall 72 instead of along a gate electrode 134, while a minority of the shared source/drain contact 146 (e.g., the upper portion 146U) extends along the gate electrode 134. Forming the dielectric walls 72 therefore reduces the amount of overlap between the shared source/drain contacts 146 and the gate electrodes 134. Reducing the amount of overlap between the shared source/drain contacts 146 and the gate electrodes 134 can help reduce the parasitic capacitance between the shared source/drain contacts 146 and the gate electrodes 134. The performance and efficiency of the resulting devices may thus be improved.

The shared source/drain contacts 146 may be formed in desired locations based on the type of circuit that will be formed. In the illustrated example of FIG. 21D, one shared source/drain contact 146 is shown. As subsequently described in greater detail, a CMOS inverter may be formed using one shared source/drain contact 146.

Figures 22, 23:
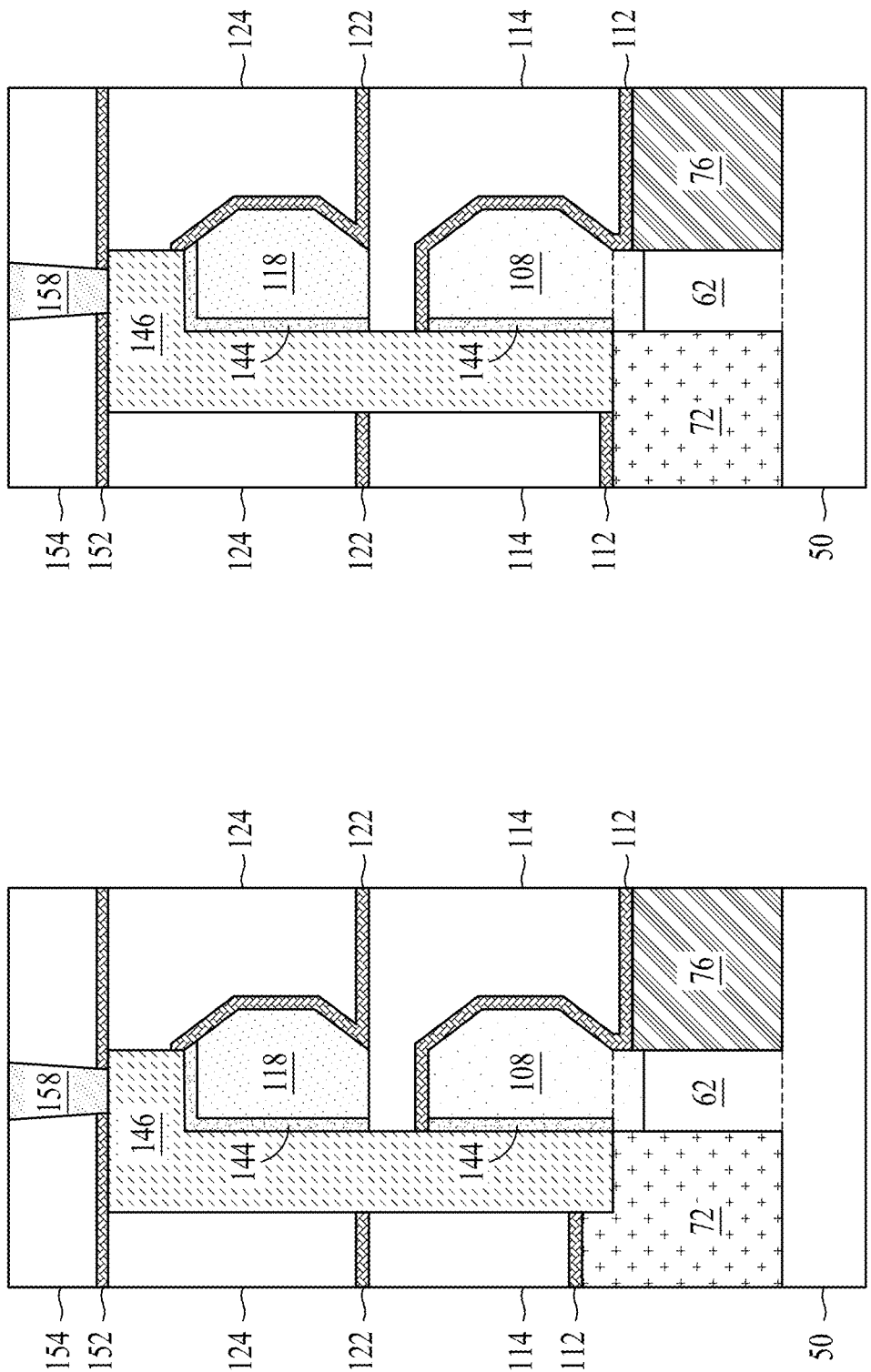
FIGS. 22-23 are views of complementary-FETs, in accordance with some embodiments.

FIGS. 22-23 are views of complementary-FETs, in accordance with some embodiments. These embodiments are similar to the embodiment of FIG. 21C, except losses of the dielectric walls 72 occurs during the etching of the source/drain recesses 104 (see FIGS. 10A-10C), such that the height of the dielectric walls 72 is reduced. Specifically, the portions of the dielectric walls 72 beneath the gate structures (see FIG. 21B) have a greater height than the portions of the dielectric walls 72 adjacent the upper epitaxial source/drain regions 118 and/or the lower epitaxial source/drain regions 108.

The portions of the fins 62 beneath the gate structures is shown in ghost in FIGS. 22-23. In some embodiments, the etched portions of the dielectric walls 72 have a greater height than the portions of the fins 62 beneath the gate structures, as shown in FIG. 22. In some embodiments, the etched portions of the dielectric walls 72 have a same height as the portions of the fins 62 beneath the gate structures, as shown in FIG. 23. In some embodiments, the etched portions of the dielectric walls 72 have a lesser height than the portions of the fins 62 beneath the gate structures (not separately illustrated).

Figure 24A:
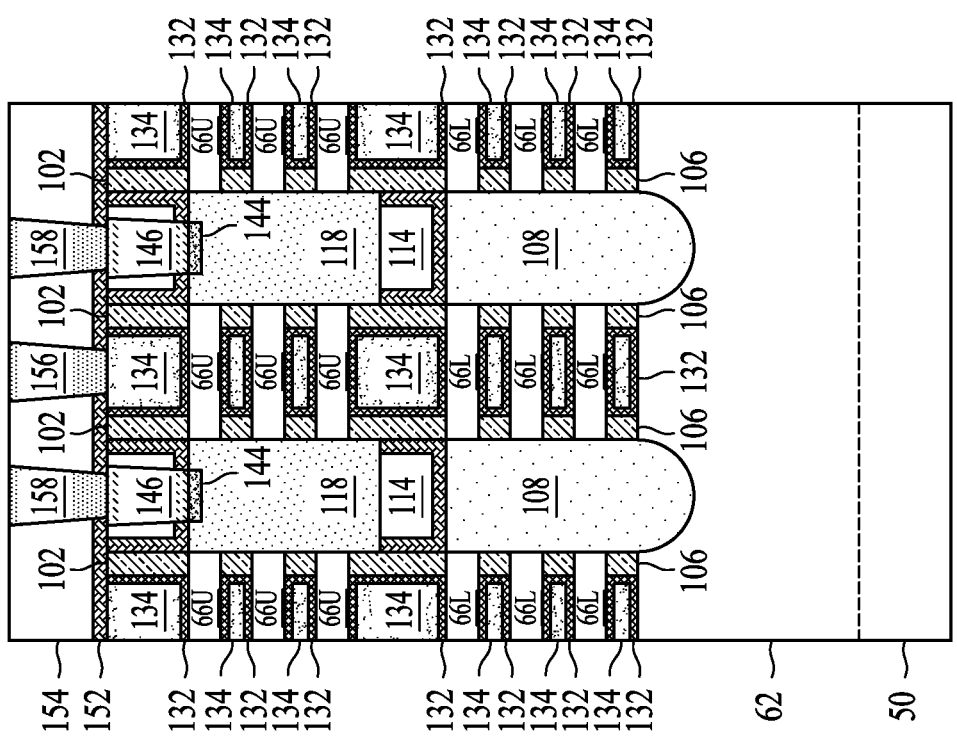
FIGS. 24A-24C are views of complementary-FETs, in accordance with some embodiments.
Figure 24B:
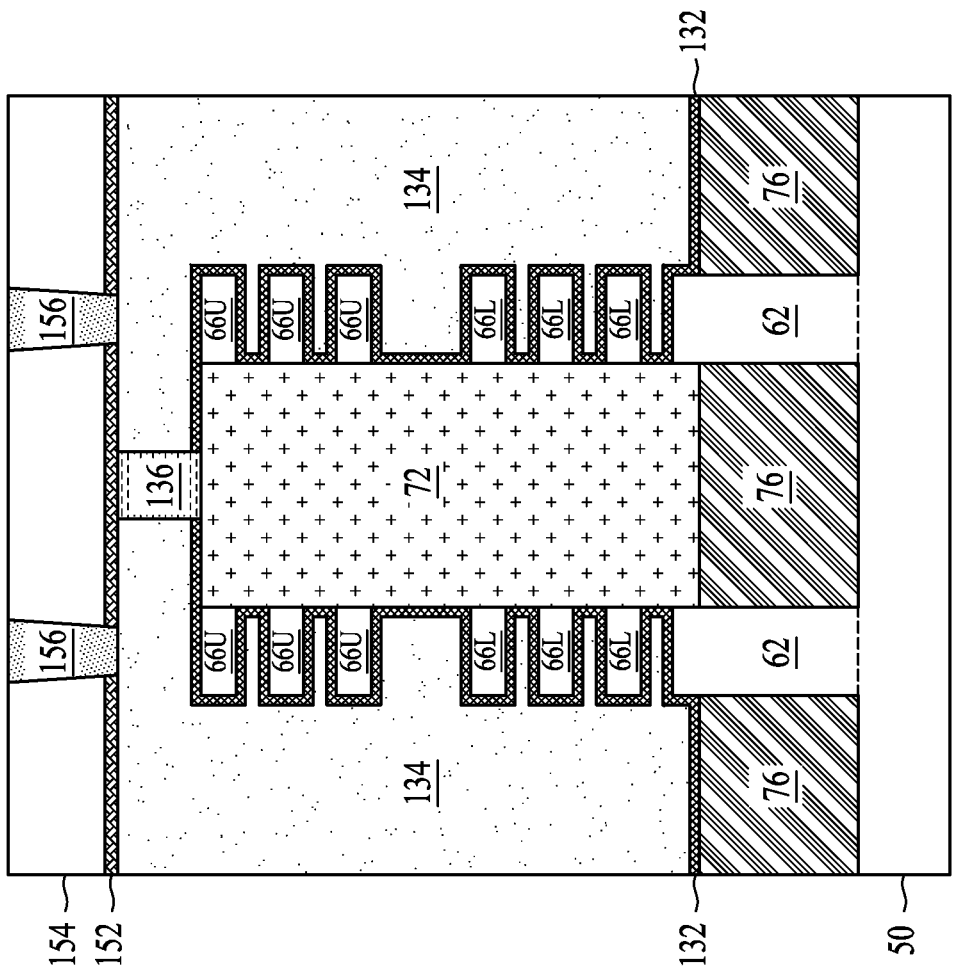
Figure 24C:
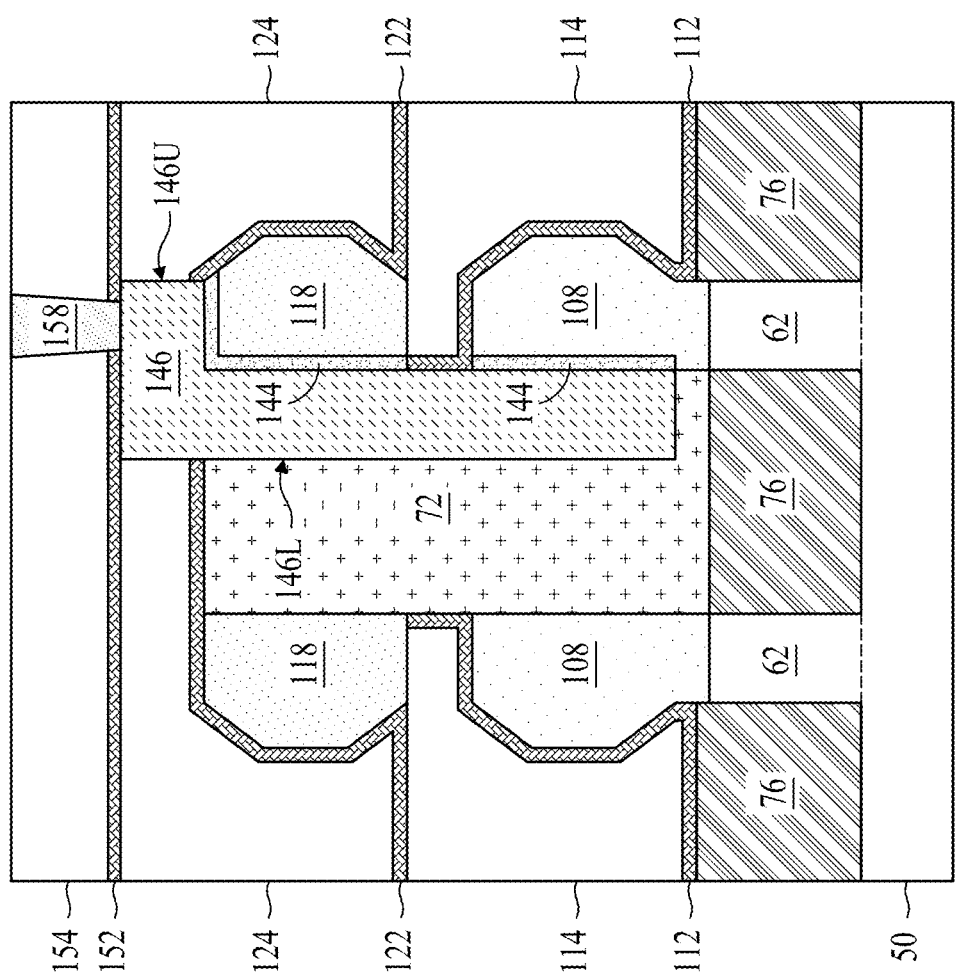

FIGS. 24A-24C are views of complementary-FETs, in accordance with some embodiments. This embodiment is similar to the embodiment of FIGS. 21A-21C, except the dielectric walls 72 are formed after the STI regions 76, such that the dielectric walls 72 are formed above the STI regions 76. Additionally, the STI regions 76 are between each of the adjacent fins 62 and nanostructures 64, 66. The dielectric walls 72 contact top surfaces of some of the STI regions 76.

Figure 25A:
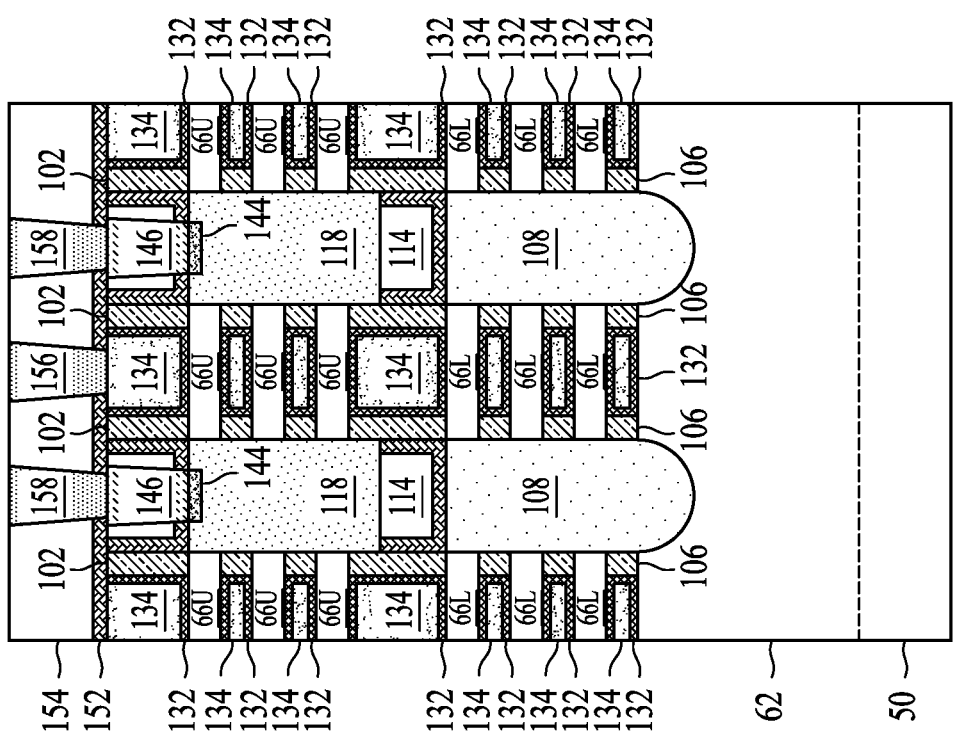
FIGS. 25A-25C are views of complementary-FETs, in accordance with some embodiments.
Figure 25B:
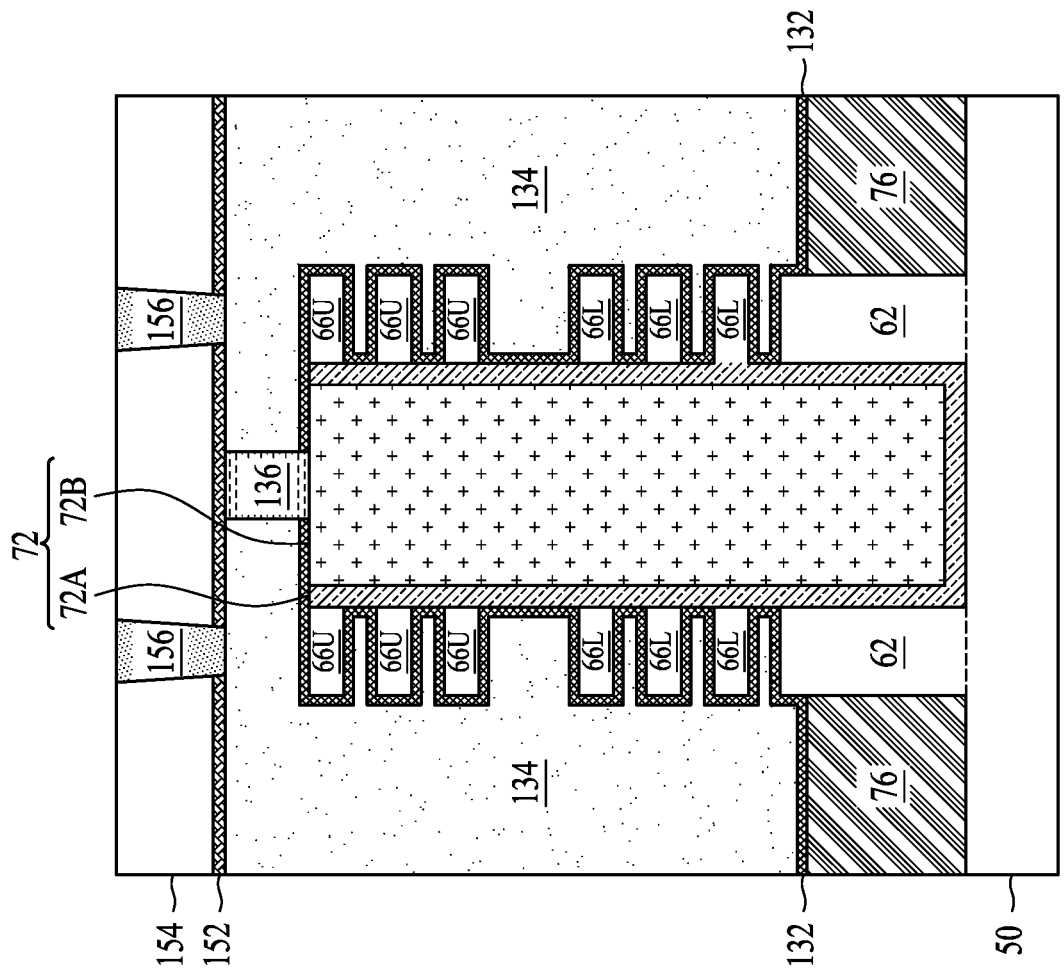
Figure 25C:
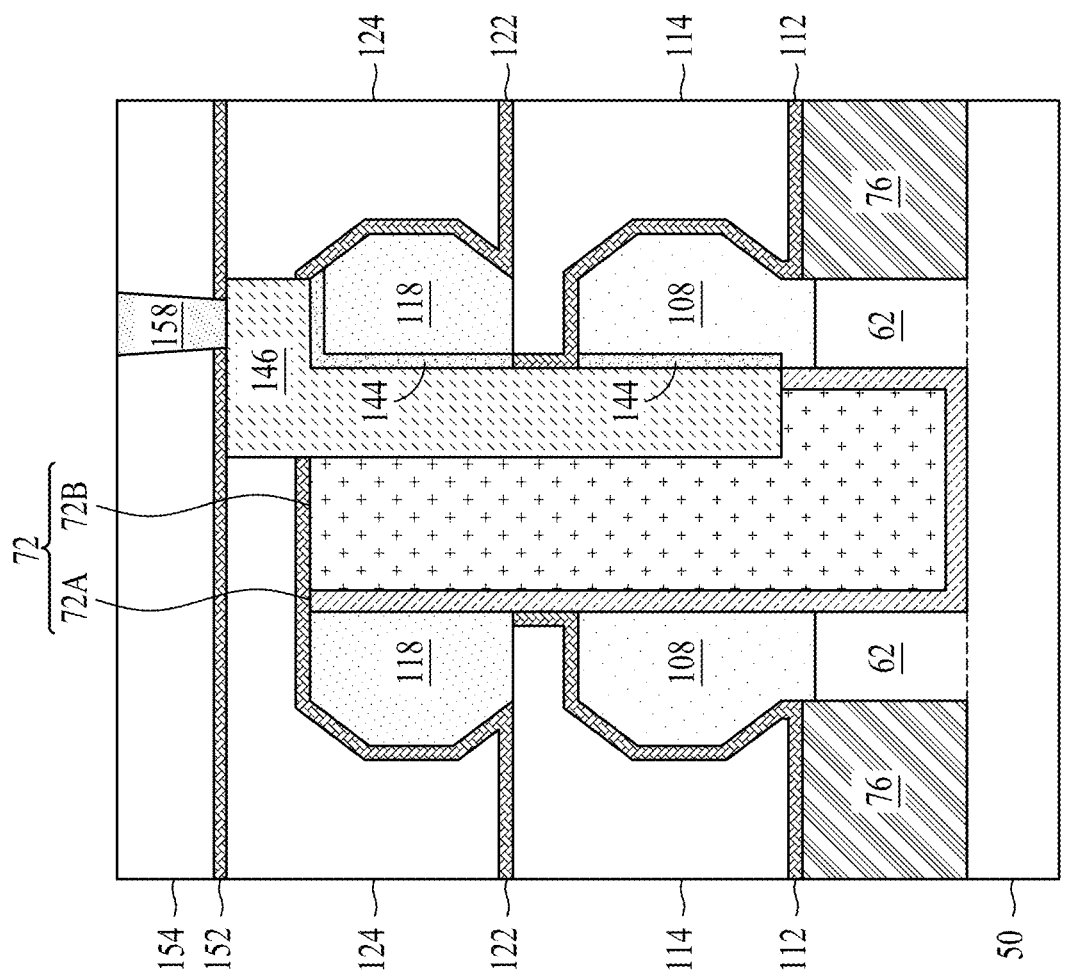

FIGS. 25A-25C are views of complementary-FETs, in accordance with some embodiments. This embodiment is similar to the embodiment of FIGS. 21A-21C, except the dielectric walls 72 are multi-layered, e.g., formed of multiple layers of different dielectric materials. For example, each dielectric wall 72 includes a first dielectric layer 72A and a second dielectric layer 72B on the first dielectric layer 72A, each of which are formed of different dielectric materials.

Figure 26A:
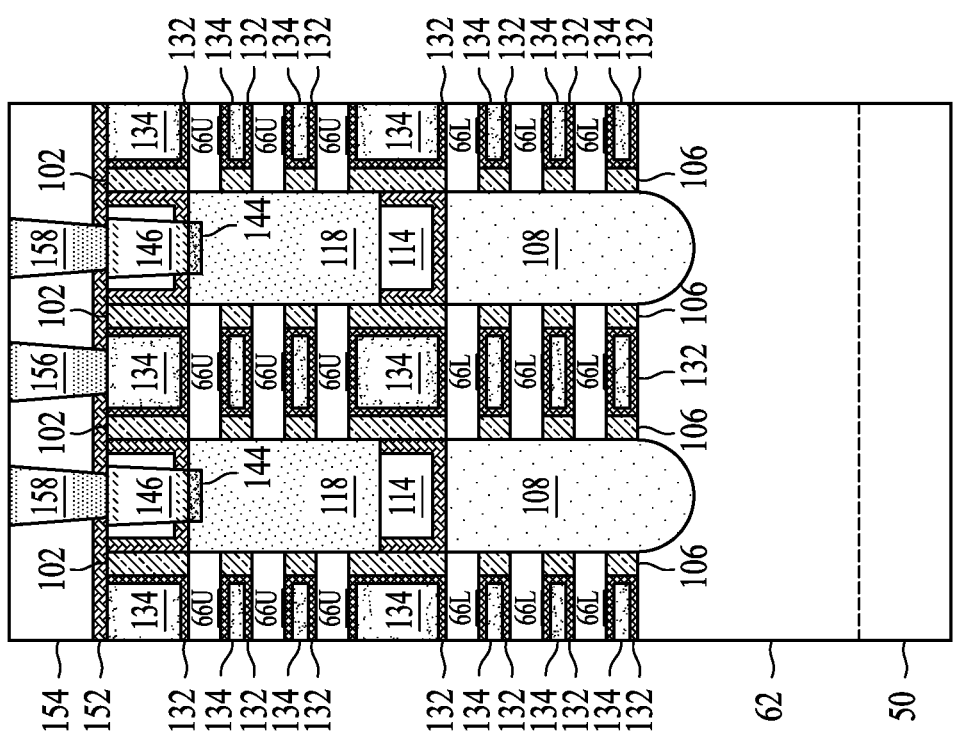
FIGS. 26A-26C are views of complementary-FETs, in accordance with some embodiments.
Figure 26B:
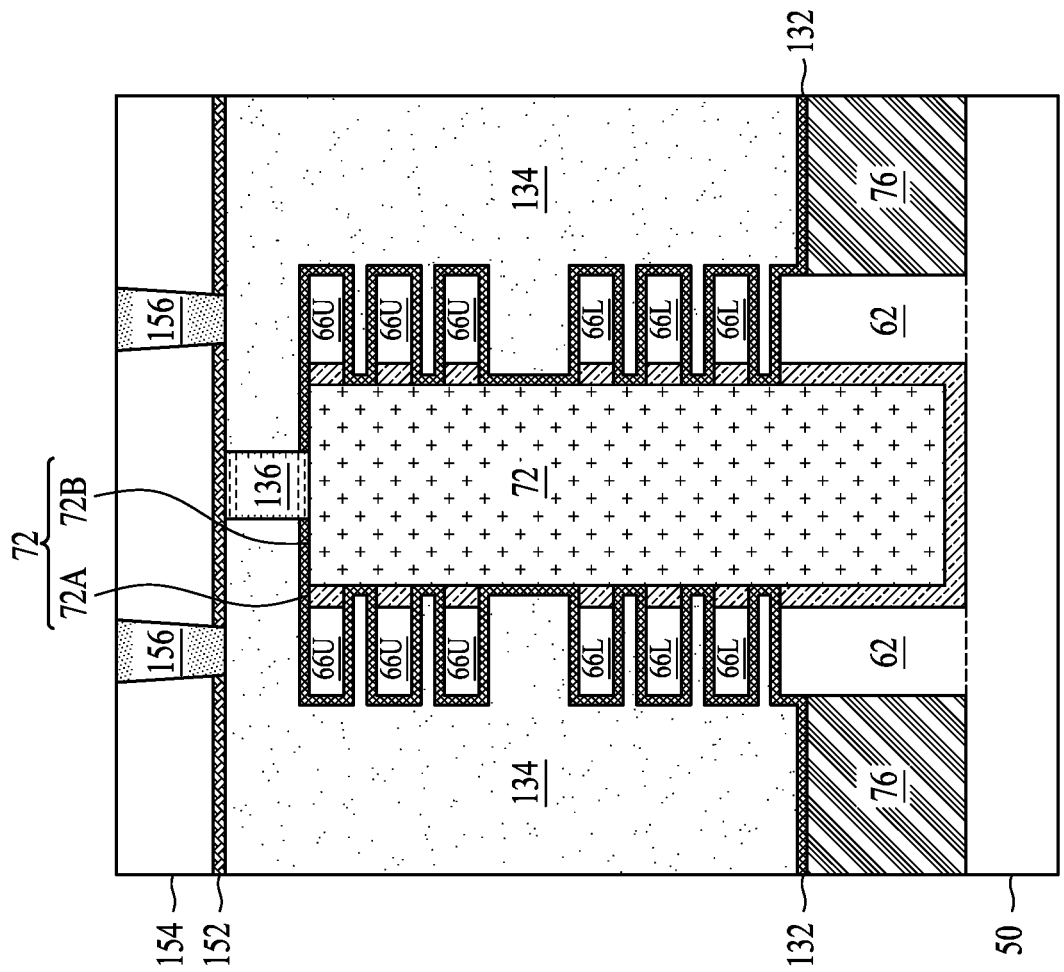
Figure 26C:
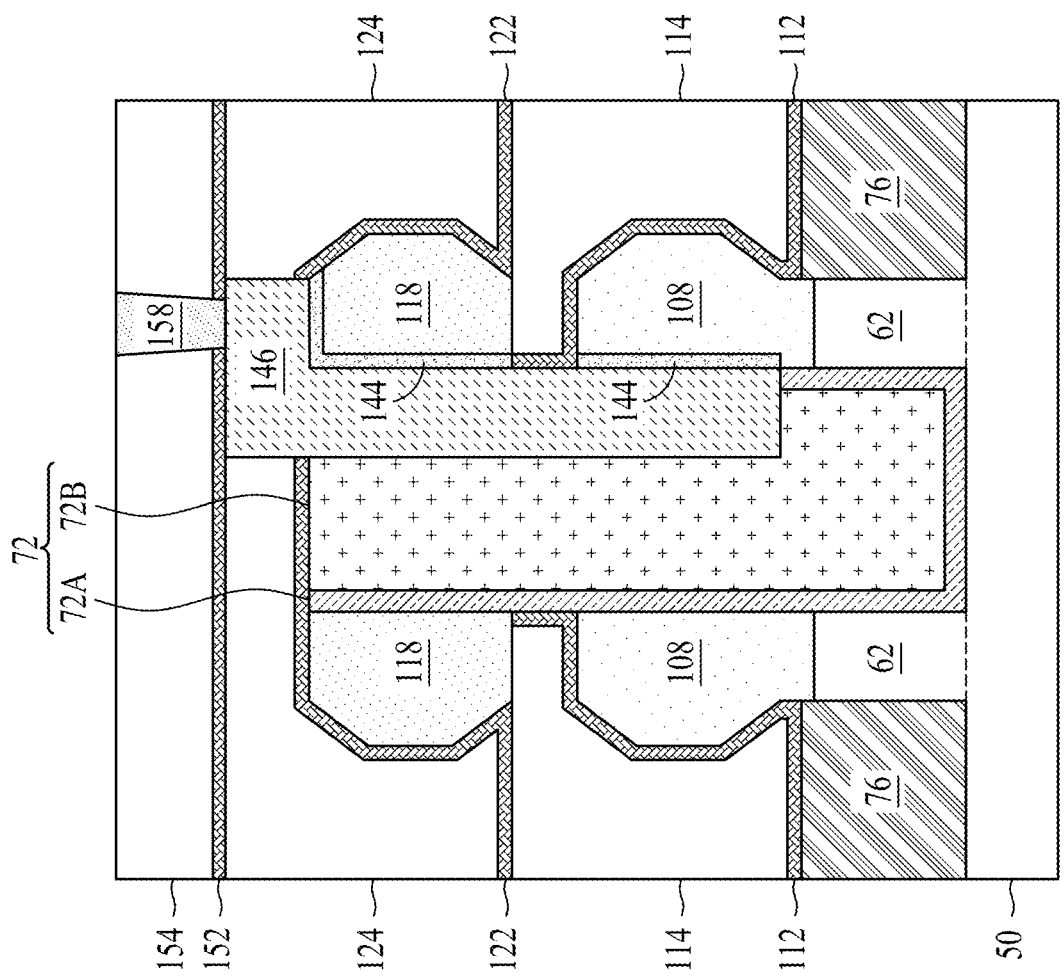

FIGS. 26A-26C are views of complementary-FETs, in accordance with some embodiments. This embodiment is similar to the embodiment of FIGS. 25A-25C, except some etching of the dielectric walls 72 occurs during the formation of the openings 128 (previously described for FIGS. 16A-16C). As a result, the gate electrodes 134 and/or the gate dielectrics 132 extend partially into sidewalls of the dielectric walls 72. The gate control over the nanostructures 66 may be improved as a result of forming the gate electrodes 134 partially in the sidewalls of the dielectric walls 72. In some embodiments, the second dielectric layers 72B act as etch stop layers during the etching of the first dielectric layers 72A, such that the gate electrodes 134 and/or the gate dielectrics 132 extend into/through the first dielectric layers 72A but not the second dielectric layers 72B.

Figure 27:
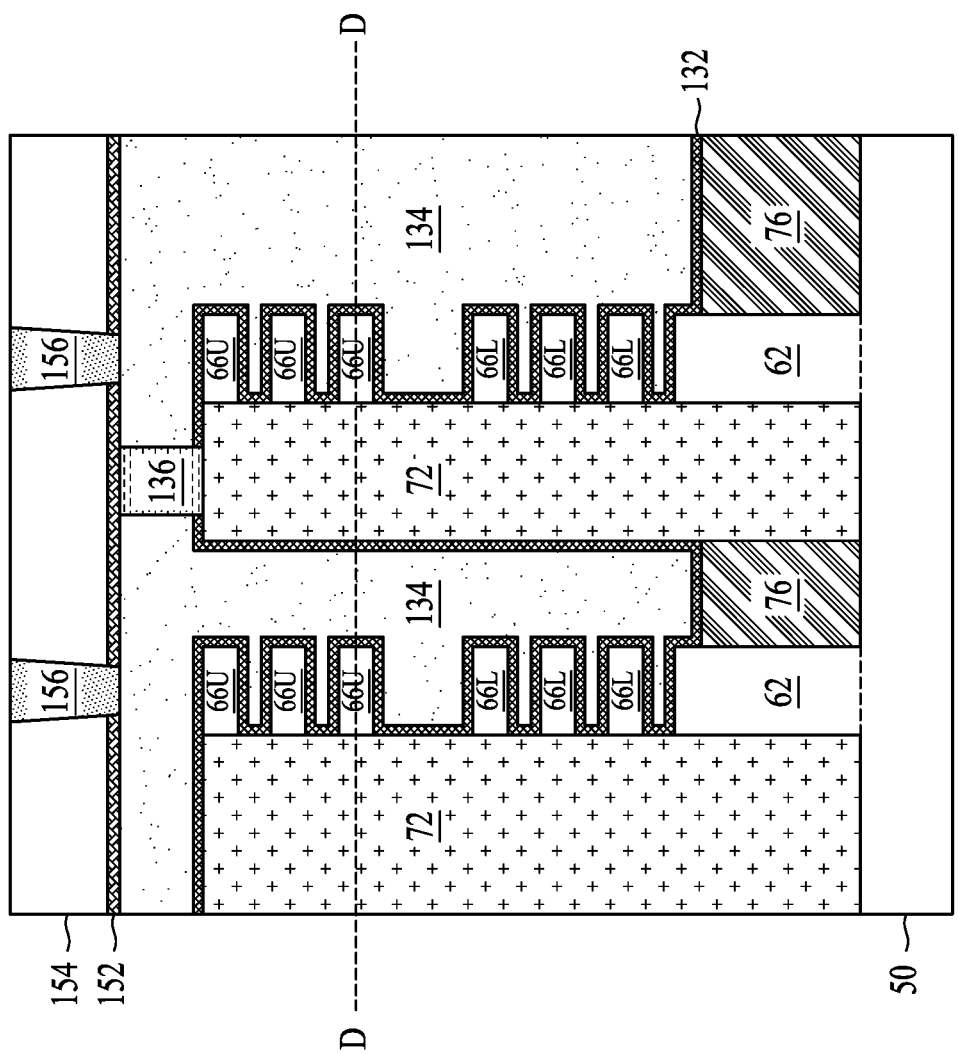
FIGS. 27-28 are views of complementary-FETs, in accordance with some embodiments.
Figure 28:
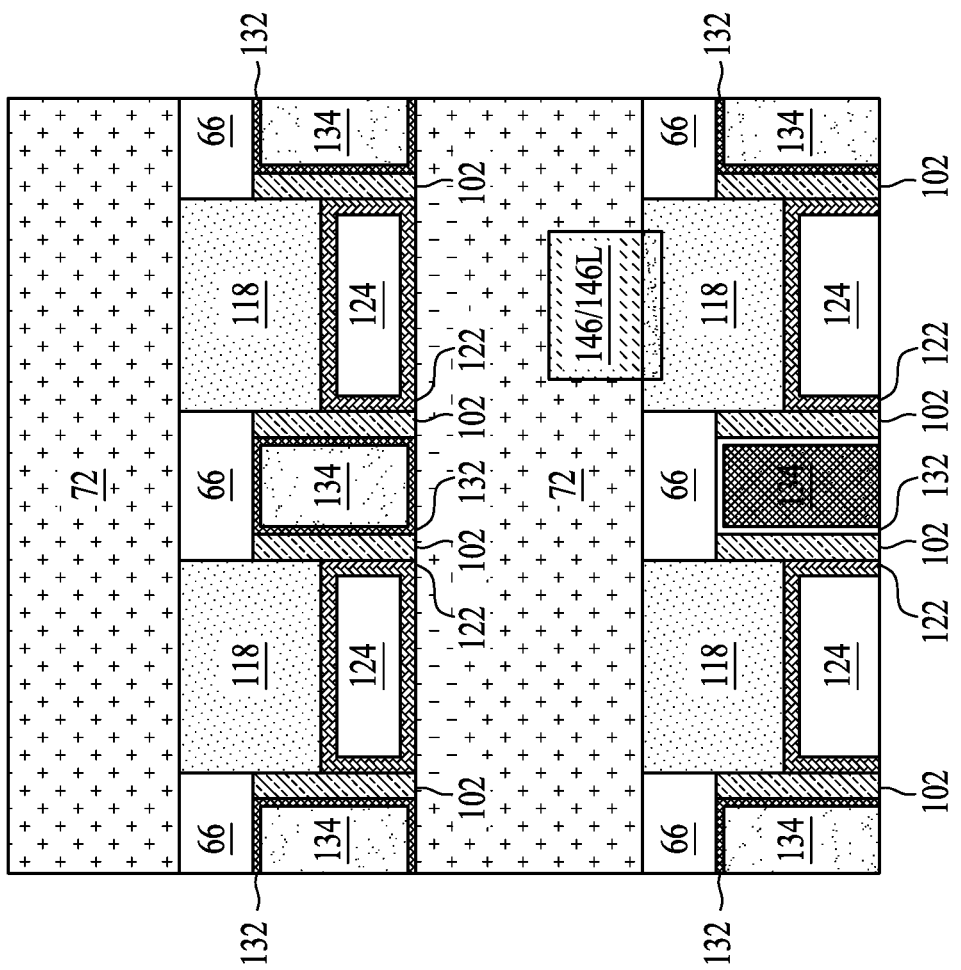

FIG. 27 is a view of complementary-FETs, in accordance with some embodiments. This embodiment is similar to the embodiment of FIG. 21B, except only one side of each dielectric wall 72 abuts the adjacent nanostructures 66. The other side of the dielectric walls 72 is separated from the adjacent nanostructures 66 by the gate electrodes 134. Additionally, a dielectric wall 72 and a STI region 76 are between each pair of fins 62. FIG. 28 is a top-down view illustrated along cross-section D-D in FIG. 27.

Figure 29A:
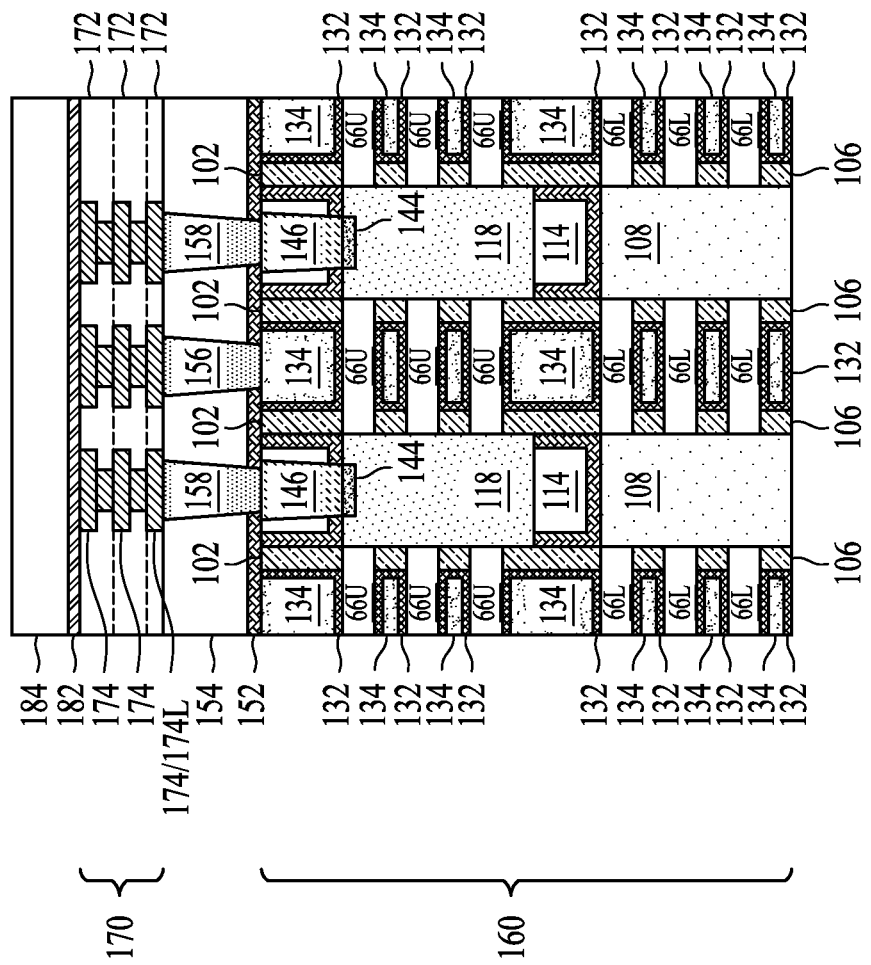
FIGS. 29A-30C are views of additional intermediate stages in the manufacturing of complementary-FETs, in accordance with some embodiments.
Figure 29B:
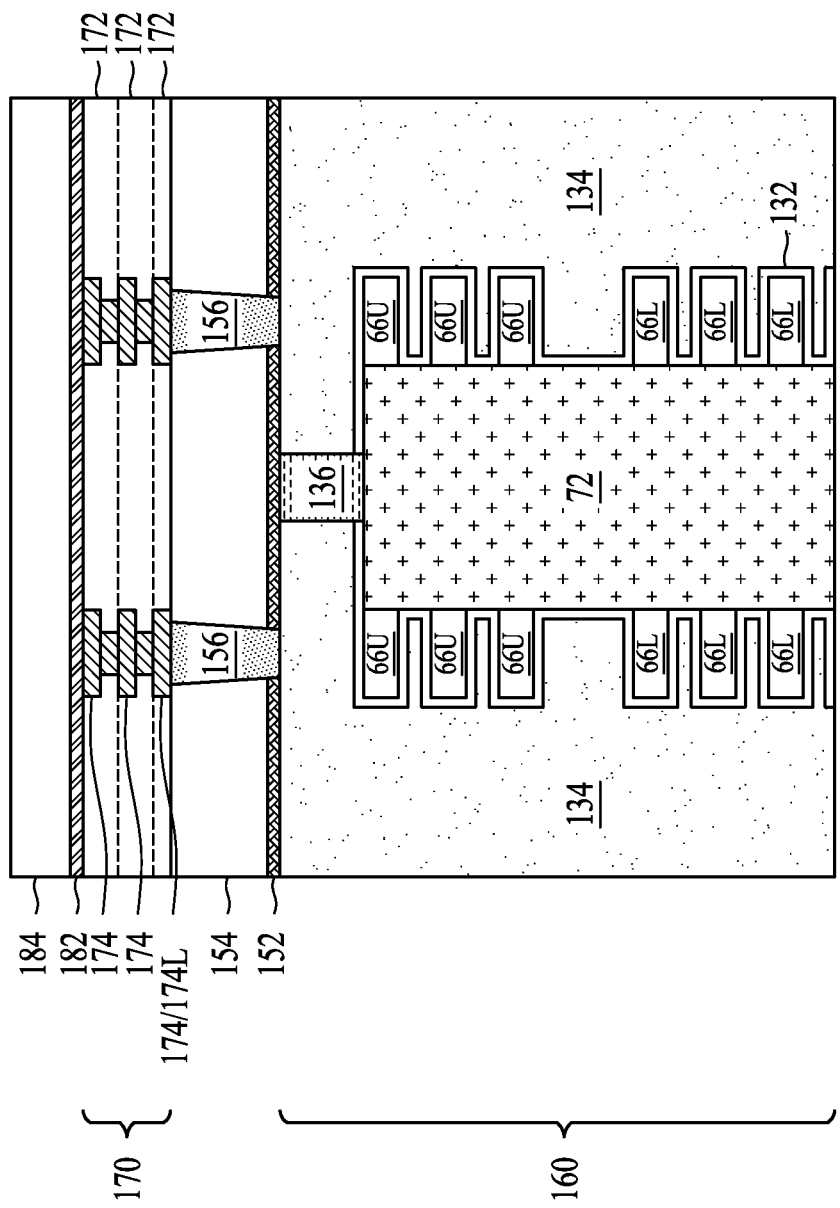
Figure 29C:
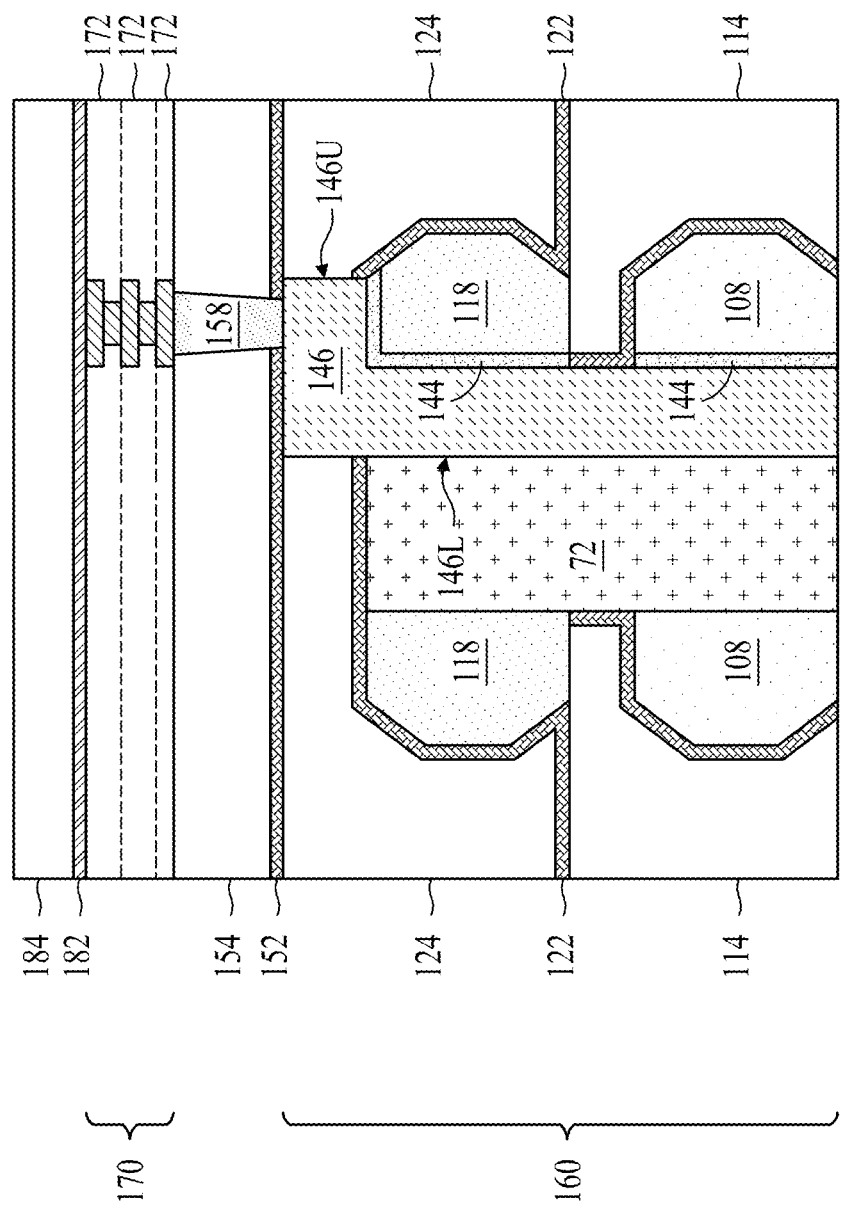
Figure 30A:
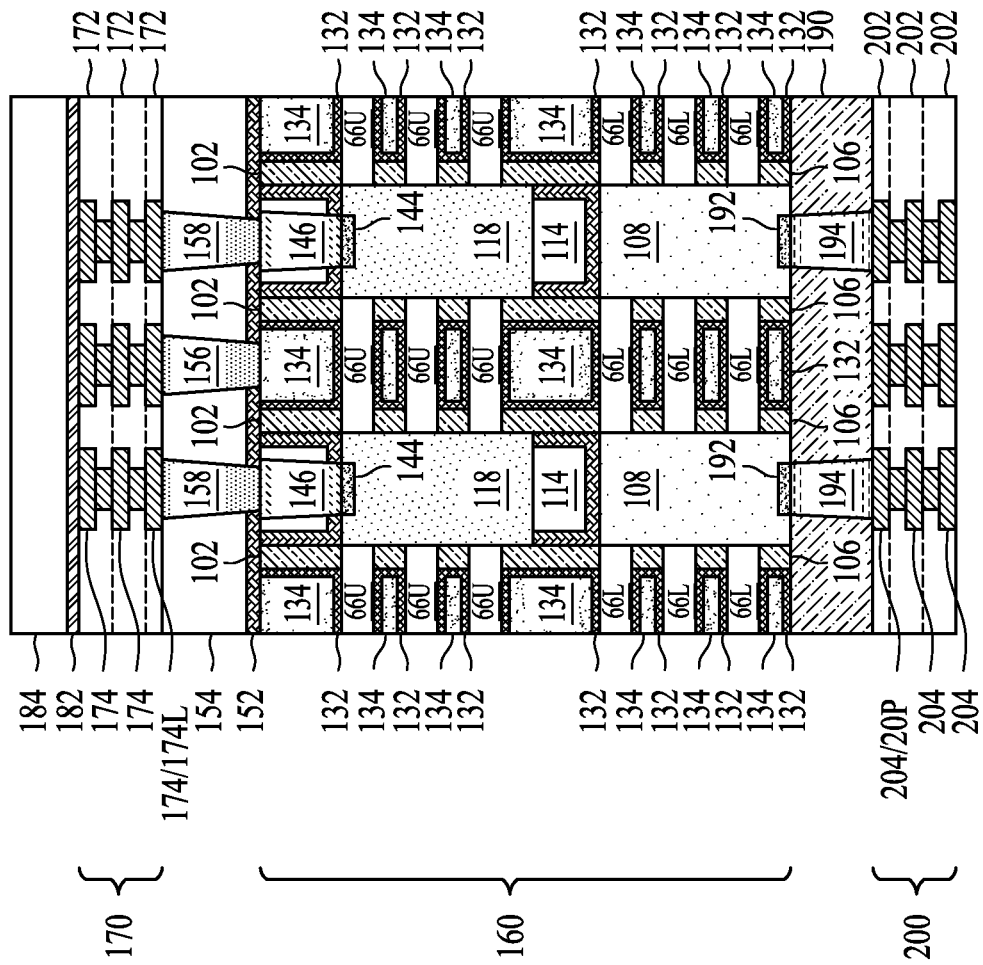
Figure 30B:
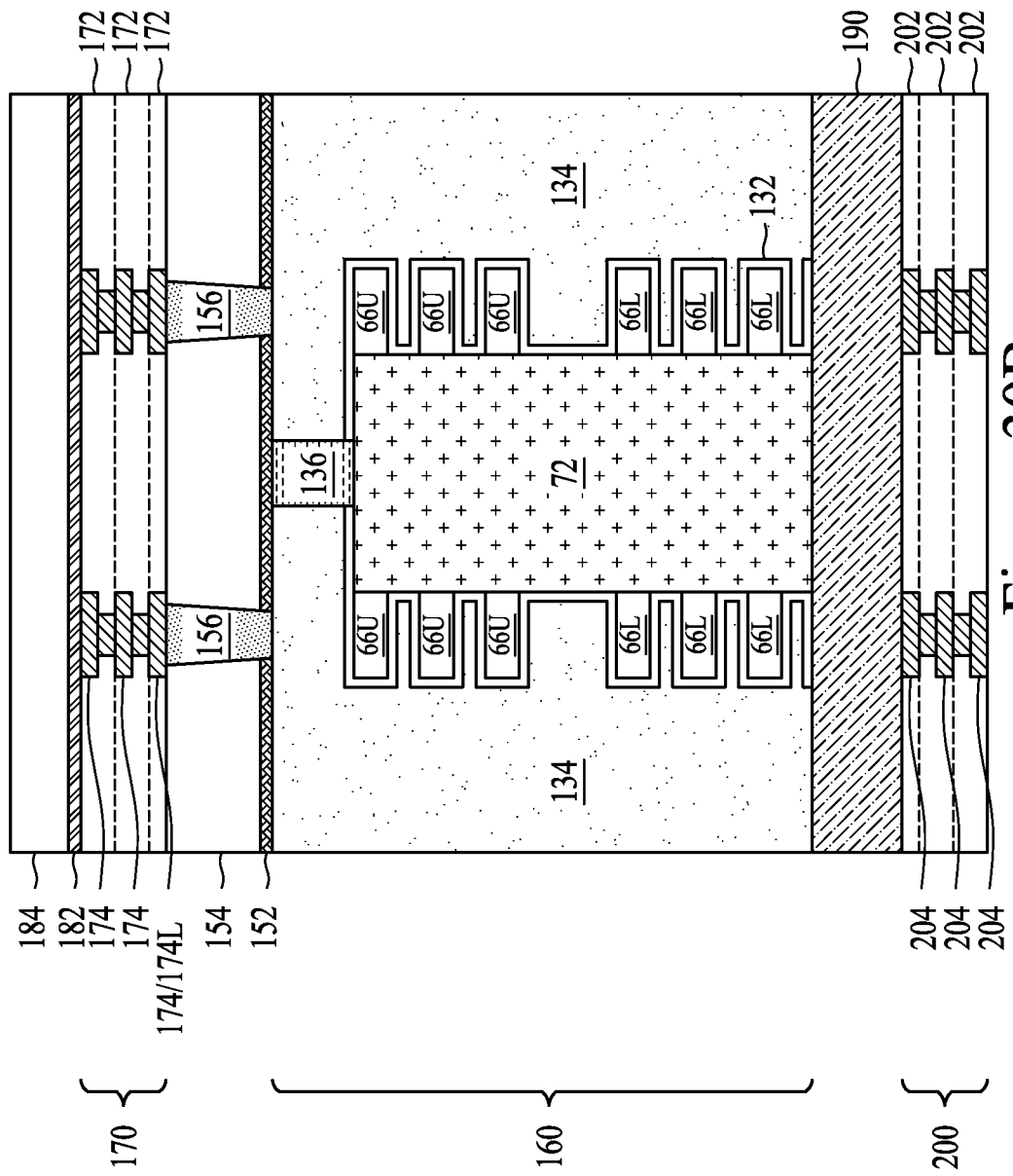
Figure 30C:
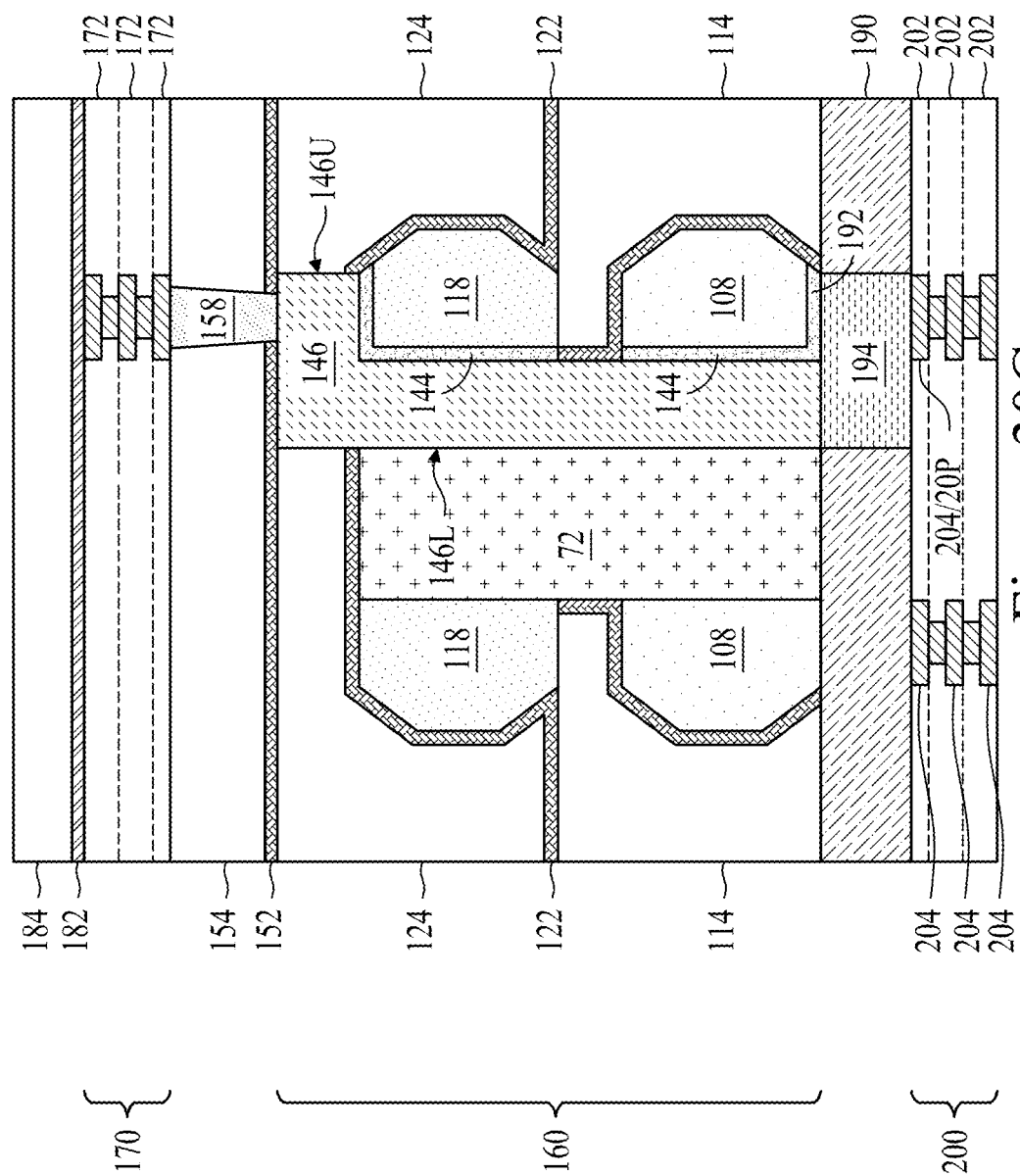

FIGS. 29A-30C are views of additional intermediate stages in the manufacturing of complementary-FETs, in accordance with some embodiments. Additional processing of the structure of FIGS. 21A-21C is described. However, the additional steps may be performed on any appropriate one of the previously described structures. FIGS. 29A and 30A illustrate cross-sectional views along a similar cross-section as reference cross-section A-A' in FIG. 1. FIGS. 29B and 30B illustrate cross-sectional views along a similar cross-section as reference cross-section B-B' in FIG. 1. FIGS. 29C and 30C illustrate cross-sectional views along a similar cross-section as reference cross-section C-C' in FIG. 1.

As subsequently described in greater detail, a first interconnect structure (e.g., a front-side interconnect structure) will be formed over the substrate 50. Some or all of the substrate 50 will then be removed and replaced with a second interconnect structure (e.g., a back-side interconnect structure). Thus, a device layer 160 of active devices is formed between a front-side interconnect structure and a back-side interconnect structure. The front-side and back-side interconnect structures each include conductive features that are connected to the devices of the device layer 160. The conductive features (e.g., interconnects) of the front-side interconnect structure will be connected to front-sides of the upper epitaxial source/drain regions 118 and the gate electrodes 134 to form functional circuits, such as logic circuits, memory circuits, image sensor circuits, or the like. The conductive features (e.g., power rails) of the back-side interconnect structure will be connected to back-sides of the lower epitaxial source/drain regions 108 to provide a reference voltage, supply voltage, or the like to the functional circuits.

In FIGS. 29A-29C, a front-side interconnect structure 170 is formed on the device layer 160, e.g., over the third ILD 154. The front-side interconnect structure 170 is referred to as a front-side interconnect structure because it is formed at a front-side of the device layer 160 (e.g., a side of the substrate 50 on which the devices are formed, see FIGS. 21A-21C). The front-side interconnect structure 170 includes dielectric layers 172 and layers of conductive features 174 in the dielectric layers 172.

The dielectric layers 172 may be formed of a dielectric material. Acceptable dielectric materials include silicon oxide, phosphosilicate glass (PSG), borosilicate glass (BSG), boron-doped phosphosilicate glass (BPSG), or the like, which may be formed by CVD, ALD, or the like. The dielectric layers 172 may be formed of a low-k dielectric material having a k-value lower than about 3.0. The dielectric layers 172 may be formed of an extra-low-k (ELK) dielectric material having a k-value of less than about 2.5.

The conductive features 174 may include conductive lines and vias. The conductive vias may extend through respective ones of the dielectric layers 172 to provide vertical connections between layers of conductive lines. The conductive features 174 may be formed by a damascene process, such as a single damascene process, a dual damascene process, or the like. In a damascene process, a dielectric layer 172 is patterned utilizing photolithography and etching techniques to form trenches and via openings corresponding to the desired pattern of the conductive features 174. The trenches and via openings may then be filled with a conductive material. Suitable conductive materials include copper, aluminum, tungsten, cobalt, gold, combinations thereof, or the like, which may be formed by electroplating or the like.

The front-side interconnect structure 170 includes any desired number of layers of the conductive features 174. The conductive features 174 are connected to features of the underlying devices (e.g., the gate electrodes 134 and the upper epitaxial source/drain regions 118) to form functional circuits. In other words, the conductive features 174 interconnect the devices of the device layer 160.

A support substrate 184 is bonded to a top surface of the front-side interconnect structure 170. The support substrate 184 may be bonded to the front-side interconnect structure 170 by one or more bonding layer(s) 182. The support substrate 184 may be a glass support substrate, a ceramic support substrate, a semiconductor substrate (e.g., a silicon substrate), a wafer (e.g., a silicon wafer), or the like. The support substrate 184 may provide structural support during subsequent processing steps and in the completed device. The support substrate 184 be substantially free of any active or passive devices.

The support substrate 184 may be bonded to the front-side interconnect structure 170 using a suitable technique such as dielectric-to-dielectric bonding, or the like. Dielectric-to-dielectric bonding may comprise depositing the bonding layer(s) 182 on the front-side interconnect structure 170 and/or the support substrate 184. In some embodiments, the bonding layer(s) 182 are formed of silicon oxide (e.g., a high density plasma (HDP) oxide or the like) that is deposited by CVD, ALD, or the like. The bonding layer(s) 182 may likewise include oxide layers that are formed prior to bonding using, for example, CVD, ALD, thermal oxidation, or the like. Other suitable materials may be used for the bonding layer(s) 182.

The dielectric-to-dielectric bonding process may further include applying a surface treatment to one or more of the bonding layer(s) 182. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the bonding layer(s) 182. The support substrate 184 is then aligned with the front-side interconnect structure 170 and the two are pressed against each other to initiate a pre-bonding of the support substrate 184 to the front-side interconnect structure 170. The pre-bonding may be performed at about room temperature. After the pre-bonding, an annealing process may be applied. The bonds are strengthened by the annealing process. After the support substrate 184 is bonded to the front-side interconnect structure 170, the intermediate structure is flipped so that the back-side of the device layer 160 faces upwards (not separately illustrated). The back-side of the device layer 160 refers to the side opposite to the front-side of the device layer 160.

The substrate 50 (see FIGS. 21A-21C) is thinned to remove (or at least reduce the thickness of) the back-side portions of the substrate 50. The thinning process may include a mechanical grinding, a chemical mechanical polish (CMP), an etch back, combinations thereof, or the like. The thinning process may also thin the fins 62 and the STI regions 76. In the illustrated embodiment, the thinning process removes an entirety of the substrate 50, the fins 62, and the STI regions 76, thereby exposing the gate electrodes 134, the gate dielectrics 132, the lower epitaxial source/drain regions 108, and the dielectric walls 72.

In FIGS. 30A-30C, a fourth ILD 190 is deposited over the back-side of the device layer 160, such as on the exposed surfaces of the gate electrodes 134, the gate dielectrics 132, the lower epitaxial source/drain regions 108, and the dielectric walls 72. In some embodiments, the fourth ILD 190 is a flowable film formed by a flowable CVD method. In some embodiments, the fourth ILD 190 is formed of a dielectric material such as PSG, BSG, BPSG, USG, or the like, which may be deposited by any suitable method, such as CVD, PECVD, or the like.

In some embodiments, an etch stop layer (ESL) (not separately illustrated) is formed between the fourth ILD 190 and the gate electrodes 134, the gate dielectrics 132, the lower epitaxial source/drain regions 108, and the dielectric walls 72. The ESL may include a dielectric material having a high etching selectivity from the etching of the fourth ILD 190, such as, silicon nitride, silicon oxide, silicon oxynitride, or the like.

Lower source/drain contacts 194 are formed through the fourth ILD 190. The lower source/drain contacts 194 may be physically and electrically coupled to the lower epitaxial source/drain regions 108. Specifically, the lower source/drain contacts 194 are coupled to the back-sides of the lower epitaxial source/drain regions 108. As an example to form the lower source/drain contacts 194, contact openings may be formed through the fourth ILD 190 to expose the lower epitaxial source/drain regions 108. The contact openings may be formed using acceptable photolithography and etching techniques. A liner, such as a diffusion barrier layer, an adhesion layer, or the like, and a conductive material are then formed in the contact openings. The liner may include titanium, titanium nitride, tantalum, tantalum nitride, or the like. The liner may be deposited by a conformal deposition process, such as physical vapor deposition (PVD), chemical vapor deposition (CVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by PVD, CVD, or the like. A planarization process, such as a CMP, may be performed to remove excess material from a surface of the fourth ILD 190. The remaining liner and conductive material in the contact openings forms the lower source/drain contacts 194.

Optionally, metal-semiconductor alloy regions 192 are formed at the interfaces between the lower source/drain contacts 194 and the lower epitaxial source/drain regions 108. The metal-semiconductor alloy regions 192 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 192 can be formed before the lower source/drain contacts 194 by depositing a metal in the openings for the lower source/drain contacts 194 and then performing a thermal anneal process. The metal can be any metal capable of reacting with the semiconductor materials (e.g., silicon, silicon-germanium, germanium, etc.) of the lower epitaxial source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the lower source/drain contacts 194, such as from surfaces of the metal-semiconductor alloy regions 192. The material(s) of the lower source/drain contacts 194 can then be formed on the metal-semiconductor alloy regions 192.

A back-side interconnect structure 200 is formed on the fourth ILD 190. The back-side interconnect structure 200 is referred to as a back-side interconnect structure because it is formed at the back-side of the device layer 160. The back-side interconnect structure 200 includes dielectric layers 202 and layers of conductive features 204 in the dielectric layers 202.

The dielectric layers 202 may be formed of a dielectric material. Acceptable dielectric materials include silicon oxide, phosphosilicate glass (PSG), borosilicate glass (BSG), boron-doped phosphosilicate glass (BPSG), or the like, which may be formed by CVD, ALD, or the like. The dielectric layers 202 may be formed of a low-k dielectric material having a k-value lower than about 3.0. The dielectric layers 202 may be formed of an extra-low-k (ELK) dielectric material having a k-value of less than about 2.5.

The conductive features 204 may include conductive lines and vias. The conductive vias may extend through respective ones of the dielectric layers 202 to provide vertical connections between layers of conductive lines. The conductive features 204 may be formed by a damascene process, such as a single damascene process, a dual damascene process, or the like. In a damascene process, a dielectric layer 202 is patterned utilizing photolithography and etching techniques to form trenches and via openings corresponding to the desired pattern of the conductive features 204. The trenches and via openings may then be filled with a conductive material. Suitable conductive materials include copper, aluminum, tungsten, cobalt, gold, combinations thereof, or the like, which may be formed by electroplating or the like.

The back-side interconnect structure 200 includes any desired number of layers of the conductive features 204. The conductive features 204 form a power distribution network for the devices of the device layer 160. Some or all of the conductive features 204 are power rails 204P, which are conductive lines that electrically connect the shared source/drain contacts 146 and/or the lower epitaxial source/drain regions 108 to a reference voltage, supply voltage, or the like. By placing the power rails 204P at a back-side of the device layer 160 rather than at a front-side of the device layer 160, advantages may be achieved. For example, a gate density of the devices of the device layer 160 may be increased. Further, the back-side of the device layer 160 may accommodate wider power rails, reducing resistance and increasing efficiency of power delivery to the devices of the device layer 160. For example, a width of the conductive features 204 may be at least twice a width of a first level conductive line (e.g., conductive line 174L) of the front-side interconnect structure 170.

In some embodiments, the lower source/drain contacts 194 are physically and electrically coupled to the shared source/drain contacts 146. Accordingly, the combination of a lower source/drain contact 194 and a shared source/drain contact 146 extends through the device layer 160 to couple a conductive feature 204 of the back-side interconnect structure 200 to a conductive feature 174 of the front-side interconnect structure 170.

Figure 31A:
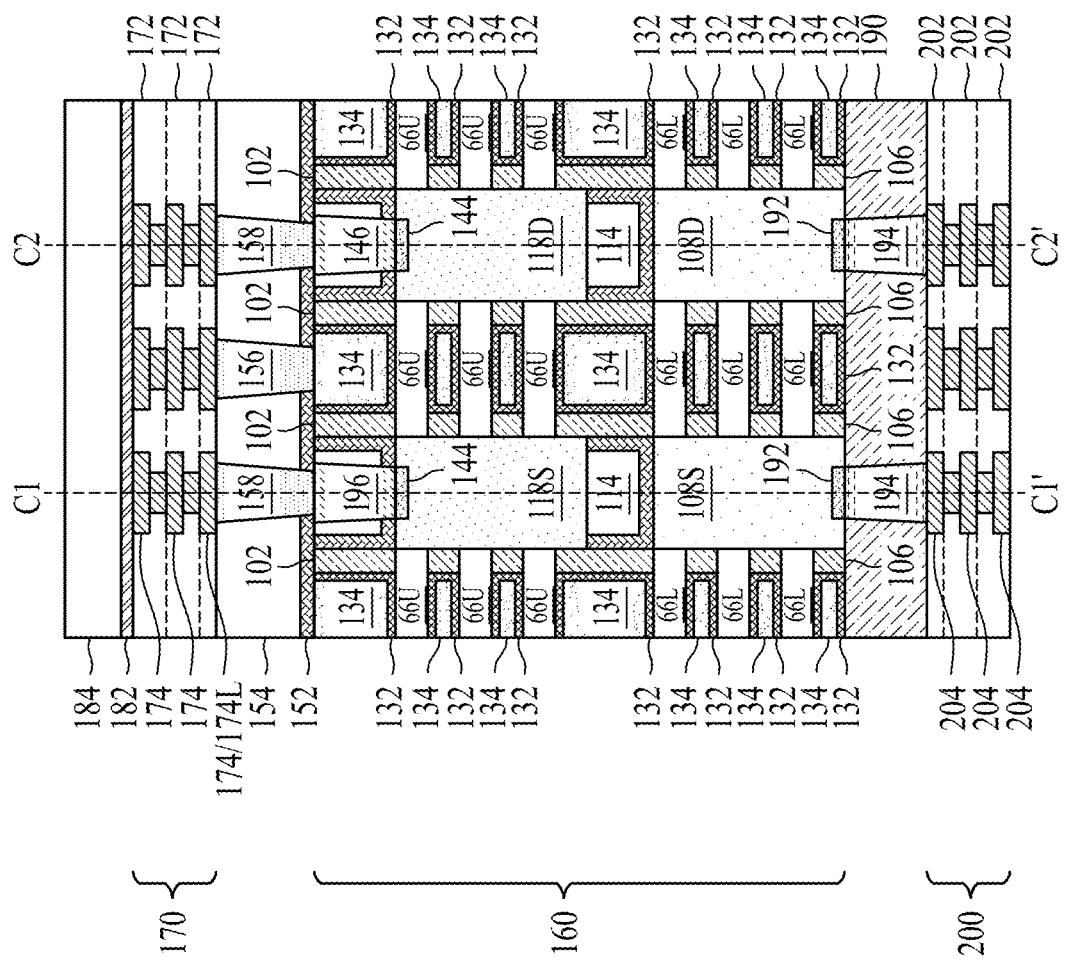
FIGS. 31A-31D are views of complementary-FETs, in accordance with some embodiments.
Figure 31B:
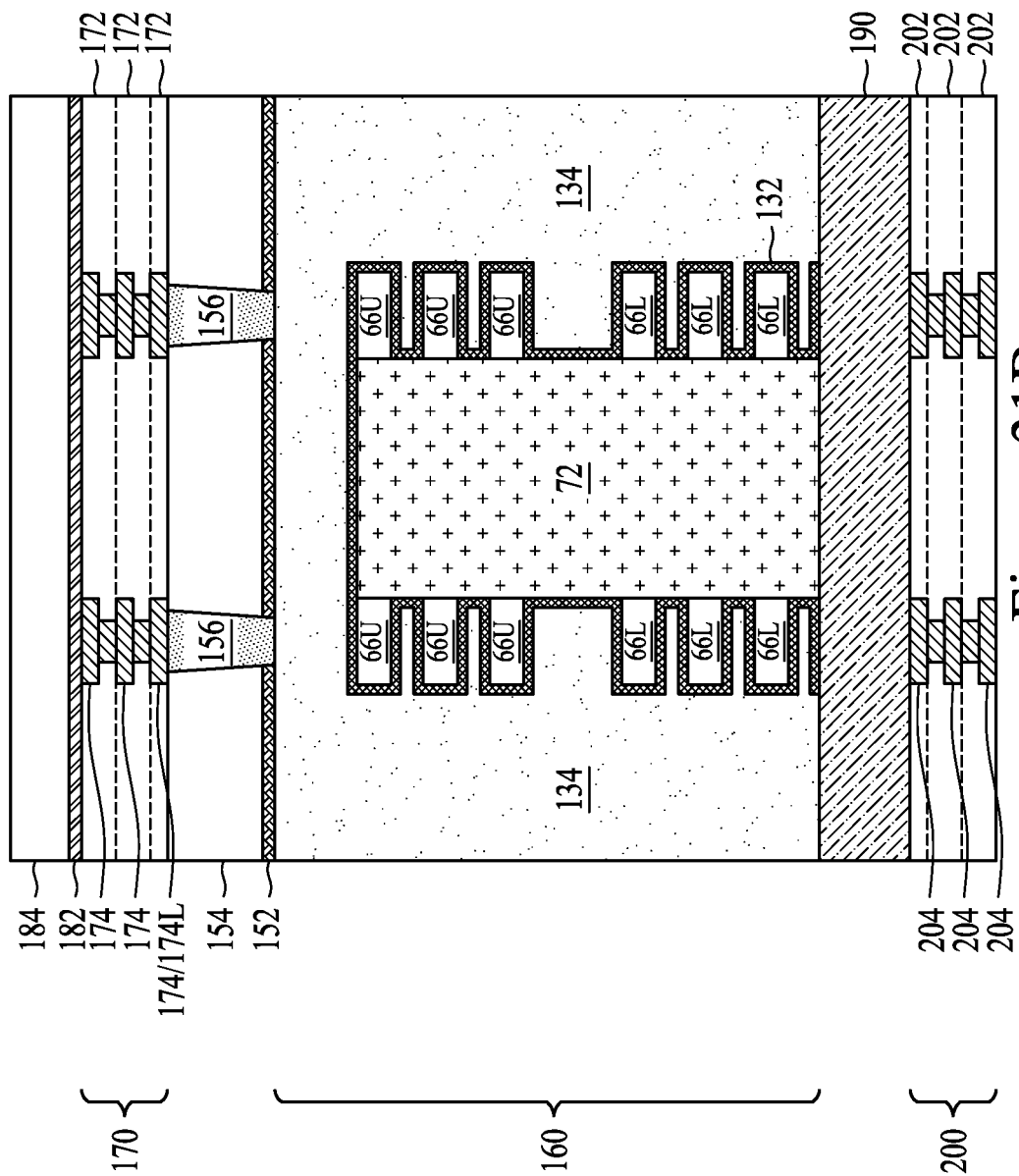
Figure 31C:
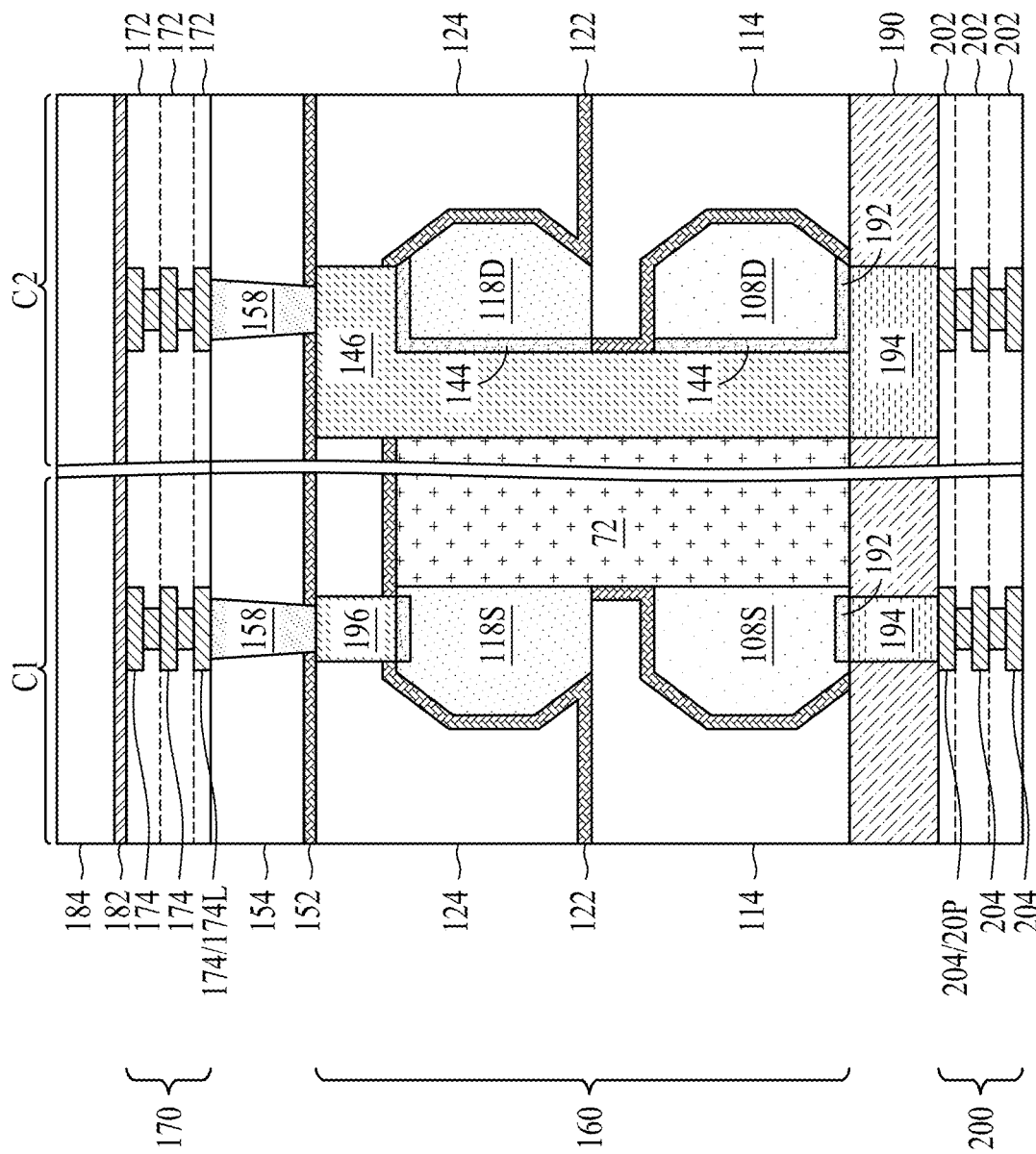

FIGS. 31A-31C are views of complementary-FETs, in accordance with some embodiments. This embodiment is similar to the embodiment of FIGS. 30A-30C, except the devices are interconnected to form a CMOS circuit, e.g., an inverter. Because a complementary-FET includes a lower nanostructure-FET of a first device type and an upper nanostructure-FET of a second device type, the source/drain regions of the complementary-FET may be interconnected to form CMOS circuit having a small footprint.

In this embodiment, the lower nanostructure-FET includes a lower source region 108S and a lower drain region 108D, and the upper nanostructure-FET includes an upper source region 118S and an upper drain region 118D. A first portion C1 of FIG. 31C is shown along cross-section C1-C1' in FIG. 31A, illustrating the lower source region 108S and the upper source region 118S. A second portion C2 of FIG. 31C is shown along cross-section C2-C2' in FIG. 31A, illustrating the lower drain region 108D and the upper drain region 118D.

Figure 31D:
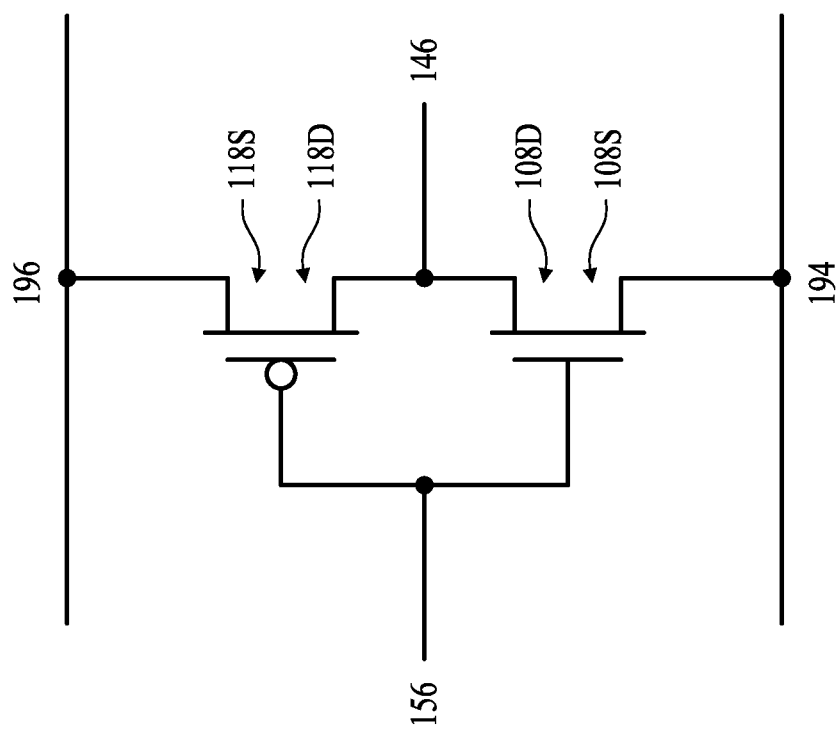

A same gate structure (including a gate dielectric 132 and a gate electrode 134) extends along three sides (e.g., a top surface, a sidewall, and a bottom surface) of the lower nanostructures 66L of the lower nanostructure-FET and along three sides (e.g., a top surface, a sidewall, and a bottom surface) of the upper nanostructures 66U of the upper nanostructure-FET. Accordingly, the gates of the lower and upper nanostructure-FETs are coupled together. A gate contact 156 is contact with the gate structure. A shared source/drain contact 146 is in contact with the lower drain region 108D and the upper drain region 118D, and is also coupled to a source/drain via 158, e.g., an output connection. Accordingly, the drain regions of the lower and upper nanostructure-FETs are coupled together. An upper source/drain contact 196 is in contact with the upper source region 118S, and is coupled to one of a power node and a ground node. The upper source/drain contact 196 may be formed in a similar manner as the shared source/drain contact 146, except the upper source/drain contact 196 is coupled to the upper source region 118S but not the lower source region 108S. A lower source/drain contact 194 is in contact with the lower source region 108S, and is coupled to the other of the power node and the ground node. The resulting CMOS circuit (e.g., inverter) is shown in FIG. 31D.

Other types of circuit may be formed using complementary-FETs. The device type of the upper and lower nanostructure-FETs may depend on the desired type of circuit. In various embodiments: the lower epitaxial source/drain regions 108 are p-type while the upper epitaxial source/drain regions 118 are n-type, the lower epitaxial source/drain regions 108 are n-type while the upper epitaxial source/drain regions 118 are p-type, the lower epitaxial source/drain regions 108 and the upper epitaxial source/drain regions 118 are both n-type, or the lower epitaxial source/drain regions 108 and the upper epitaxial source/drain regions 118 are both p-type.

Figure 32:
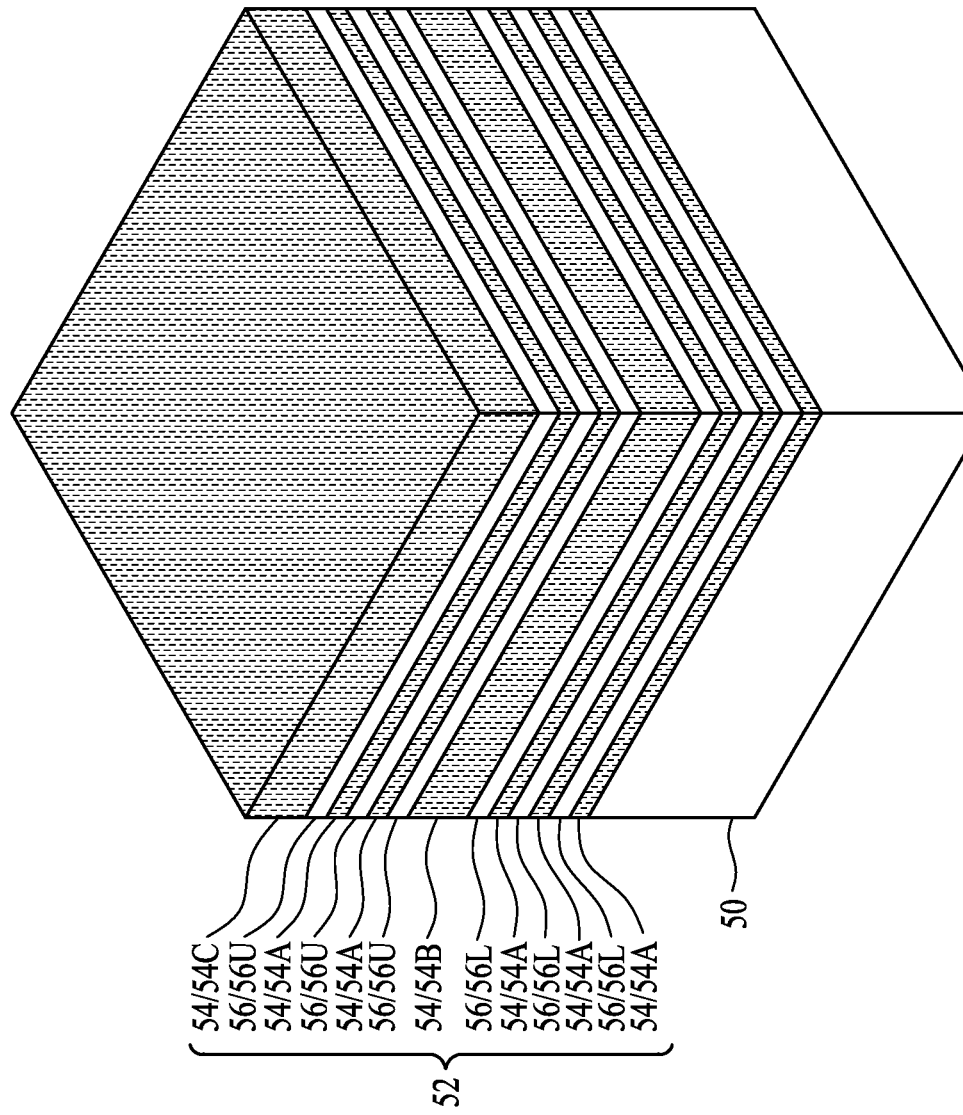
FIGS. 32-34 are views of intermediate stages in the manufacturing of complementary-FETs, in accordance with some embodiments.
Figure 33:
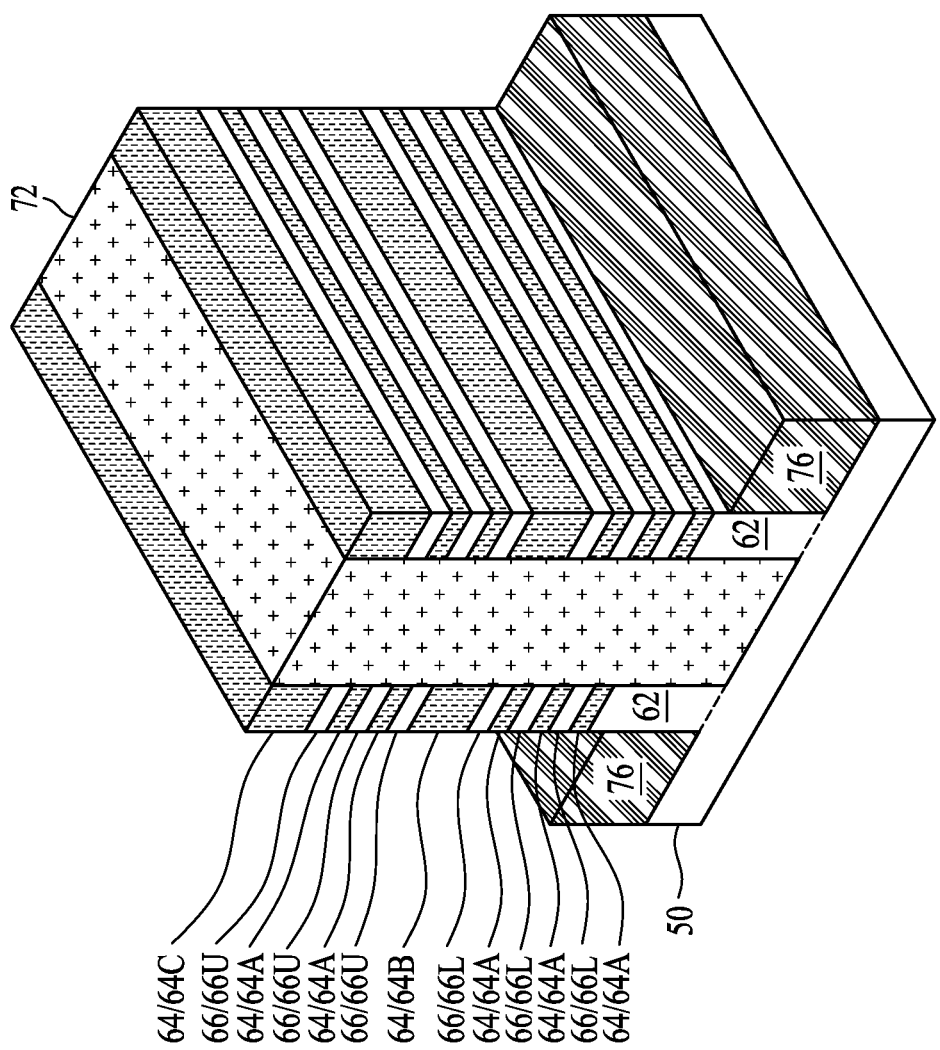
Figure 34:
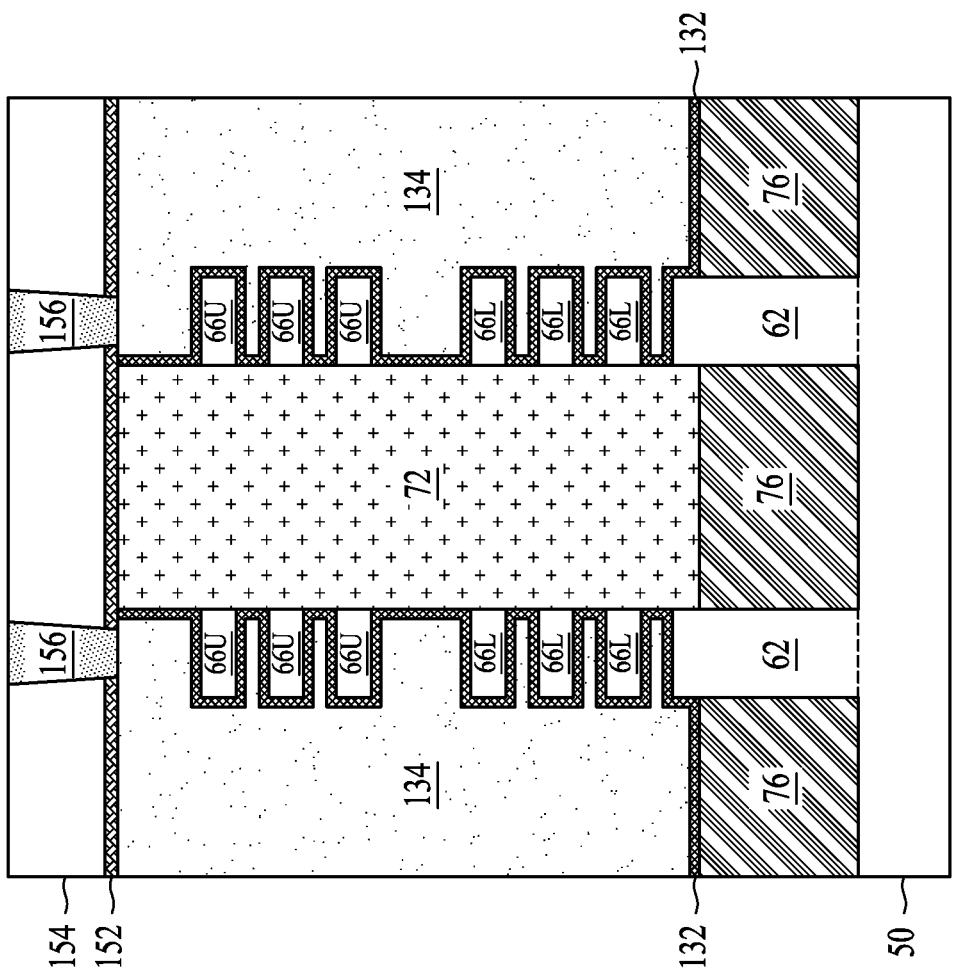

FIGS. 32-34 are views of intermediate stages in the manufacturing of complementary-FETs, in accordance with some embodiments. FIGS. 32 and 33 are three-dimensional views showing a similar three-dimensional view as FIG. 1. FIG. 34 illustrates a cross-sectional view along a similar cross-section as reference cross-section B-B' in FIG. 1. This embodiment is similar to the embodiment of FIGS. 2-21C, except the dielectric walls 72 are formed to an increased height so that they may also be utilized as gate isolation structures.

In FIG. 32, a substrate 50 is provided. The substrate 50 may be similar to that described for FIG. 2. A multi-layer stack 52 is formed over the substrate 50. The multi-layer stack 52 may be similar to that described for FIG. 2, except the multi-layer stack 52 includes an upper semiconductor layer 54C. The upper semiconductor layer 54C and the middle semiconductor layer 54B may be thicker than others of the first semiconductor layers 54A.

In FIG. 33, appropriate steps as previously described are performed to form the fins 62, the nanostructures 64, 66, the dielectric walls 72, and the STI regions 76. The nanostructures 64 include isolation structures 64B and isolation structures 64C, which are thicker than others of the nanostructures 64A. The top surfaces of the dielectric walls 72 and the isolation structures 64C may be substantially coplanar (within process variations). The dielectric walls 72 are formed adjacent the isolation structures 64C, and thus have a greater height than in previously described embodiments, such that the top surfaces of the dielectric walls 72 are above the top surfaces of the nanostructures 66.

In FIG. 34, appropriate steps as previously described are performed to complete formation of the complementary-FETs. The isolation structures 64C are removed during formation of the gate structures. The dielectric walls 72 of increased height may cut a gate structure (including a gate dielectric 132 and a gate electrode 134) into multiple gate segments. Additionally, the top surfaces of the dielectric walls 72 and the gate structures may be substantially coplanar (within process variations). The dielectric walls 72 are disposed between adjacent gate structures. Further processing may also be performed. For example, the process described for FIGS. 29A-30C may be performed to form front-side and back-side interconnect structures.

Embodiments may achieve advantages. As previously noted, the shared source/drain contacts 146 have portions in the dielectric walls 72, and the gate electrodes 134 are above the dielectric walls 72. Because the gate electrodes 134 are above the dielectric walls 72, a majority of an shared source/drain contact 146 extends along a dielectric wall 72 instead of along a gate electrode 134. The amount of overlap between the shared source/drain contacts 146 and the gate electrodes 134 may thus be reduced. Reducing the amount of overlap between the shared source/drain contacts 146 and the gate electrodes 134 can help reduce the parasitic capacitance between the shared source/drain contacts 146 and the gate electrodes 134. The performance and efficiency of the resulting devices may thus be improved.

In an embodiment, a device includes: a dielectric wall; nanostructures abutting the dielectric wall; a lower source/drain region adjoining a lower subset of the nanostructures; an upper source/drain region adjoining an upper subset of the nanostructures, the upper source/drain region oppositely doped from the lower source/drain region; and a shared source/drain contact contacting the upper source/drain region and the lower source/drain region, the shared source/drain contact extending into the dielectric wall. In some embodiments of the device, the lower source/drain region is a p-type source/drain region and the upper source/drain region is an n-type source/drain region. In some embodiments of the device, the lower source/drain region is an n-type source/drain region and the upper source/drain region is a p-type source/drain region. In some embodiments, the device further includes: an inter-layer dielectric on the upper source/drain region, the shared source/drain contact extending through the inter-layer dielectric, the shared source/drain contact having an upper portion in the inter-layer dielectric and having a lower portion in the dielectric wall, the upper portion wider than the lower portion. In some embodiments, the device further includes: an inter-layer dielectric on the upper source/drain region, the shared source/drain contact extending through the inter-layer dielectric, the shared source/drain contact having an upper portion in the inter-layer dielectric and having a lower portion in the dielectric wall, the lower portion taller than the upper portion. In some embodiments, the device further includes: an isolation region on a substrate, the nanostructures protruding from the isolation region, the dielectric wall contacting a top surface of the isolation region. In some embodiments, the device further includes: an isolation region on a substrate, the nanostructures protruding from the isolation region, the dielectric wall contacting a top surface of the substrate.

In an embodiment, a device includes: a dielectric wall; first nanostructures contacting a sidewall of the dielectric wall; second nanostructures above the first nanostructures and contacting the sidewall of the dielectric wall, the second nanostructures oppositely doped from the first nanostructures; and a gate structure extending along top surfaces and sidewalls of the second nanostructures, along top surfaces and sidewalls of the first nano structures, and along a top surface and a sidewall of the dielectric wall. In some embodiments, the device further includes: a lower source/ drain region adjoining the first nanostructures, the dielectric wall having a first portion adjacent the lower source/drain region, the dielectric wall having a second portion beneath the gate structure, the second portion of the dielectric wall having a greater height than the first portion of the dielectric wall. In some embodiments, the device further includes: a lower source/drain region adjoining the first nanostructures, the dielectric wall having a first portion adjacent the lower source/drain region, the dielectric wall having a second portion beneath the gate structure, the second portion of the dielectric wall having a same height as the first portion of the dielectric wall. In some embodiments of the device, a top surface of the gate structure is above a top surface of the dielectric wall. In some embodiments of the device, a top surface of the gate structure is coplanar with a top surface of the dielectric wall. In some embodiments of the device, the dielectric wall is single-layered. In some embodiments of the device, the dielectric wall is multi-layered. In some embodiments, the device further includes: a lower source region; a lower drain region, the first nano structures disposed between the lower drain region and the lower source region; an upper source region; an upper drain region, the second nanostructures disposed between the upper drain region and the upper source region; a shared source/drain contact contacting the upper drain region and the lower drain region; a lower source/drain contact contacting a back-side of the lower source region; and an upper source/drain contact contacting a front-side of the upper source region.

In an embodiment, a method includes: forming a dielectric wall abutting nanostructures; etching a source/drain recess in the nanostructures; growing a lower source/drain region in the source/drain recess; growing an upper source/drain region over the lower source/drain region in the source/drain recess; depositing an inter-layer dielectric on the upper source/drain region; patterning a contact opening extending through the inter-layer dielectric and into the dielectric wall, the contact opening exposing the upper source/drain region and the lower source/drain region; and forming a source/drain contact in the contact opening. In some embodiments of the method, patterning the contact opening includes: performing a first etch to form an upper portion of the contact opening in the inter-layer dielectric, the upper portion of the contact opening exposing a top surface of the upper source/drain region; and performing a second etch to form a lower portion of the contact opening in the dielectric wall, the lower portion of the contact opening exposing a sidewall of the upper source/drain region and a sidewall of the lower source/drain region. In some embodiments of the method, forming the dielectric wall includes: forming a plurality of dielectric walls, the nanostructures disposed between the dielectric walls; and removing a subset of the dielectric walls. In some embodiments, the method further includes: after forming the dielectric wall, forming an isolation region, the nanostructures protruding from the isolation region. In some embodiments, the method further includes: before forming the dielectric wall, forming an isolation region, the nanostructures protruding from the isolation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a dielectric wall;
   nanostructures abutting the dielectric wall;
   a lower source/drain region adjoining a lower subset of the nanostructures;
   an upper source/drain region adjoining an upper subset of the nanostructures, the upper source/drain region oppositely doped from the lower source/drain region;
   a shared source/drain contact contacting the upper source/drain region and the lower source/drain region, the shared source/drain contact extending into the dielectric wall; and
   an inter-layer dielectric on the upper source/drain region, the shared source/drain contact extending through the inter-layer dielectric, the shared source/drain contact having an upper portion in the inter-layer dielectric and having a lower portion in the dielectric wall, the lower portion of the shared source/drain contact being taller than the upper portion of the shared source/drain contact.

2. The device of claim 1, wherein the lower source/drain region is a p-type source/drain region and the upper source/drain region is an n-type source/drain region.

3. The device of claim 1, wherein the lower source/drain region is an n-type source/drain region and the upper source/drain region is a p-type source/drain region.

4. The device of claim 1, wherein the upper portion of the shared source/drain contact is wider than the lower portion of the shared source/drain contact.

5. The device of claim 1 further comprising:
   an isolation region on a substrate, the nanostructures protruding from the isolation region, the dielectric wall contacting a top surface of the isolation region.

6. The device of claim 1 further comprising:
   an isolation region on a substrate, the nanostructures protruding from the isolation region, the dielectric wall contacting a top surface of the substrate.

7. A device comprising:
   a dielectric wall;
   first nanostructures contacting a sidewall of the dielectric wall;
   second nanostructures above the first nanostructures and contacting the sidewall of the dielectric wall, the second nanostructures oppositely doped from the first nanostructures;
   a gate structure extending along top surfaces and sidewalls of the second nanostructures, along top surfaces and sidewalls of the first nanostructures, and along a top surface and a sidewall of the dielectric wall; and
   a lower source/drain region adjoining the first nanostructures, the dielectric wall having a first portion adjacent the lower source/drain region, the dielectric wall having a second portion beneath the gate structure, the second portion of the dielectric wall having a greater height than the first portion of the dielectric wall.

8. The device of claim 7, wherein a top surface of the gate structure is above a top surface of the dielectric wall.

9. The device of claim 7, wherein a top surface of the gate structure is coplanar with a top surface of the dielectric wall.

10. The device of claim 7, wherein the dielectric wall is single-layered.

11. The device of claim 7, wherein the dielectric wall is multi-layered.

12. The device of claim 7, wherein the lower source/drain region is a lower source region, and the device further comprises:
a lower drain region, the first nanostructures disposed between the lower drain region and the lower source region;
an upper source region;
an upper drain region, the second nanostructures disposed between the upper drain region and the upper source region;
a shared source/drain contact contacting the upper drain region and the lower drain region;
a lower source/drain contact contacting a back-side of the lower source region; and
an upper source/drain contact contacting a front-side of the upper source region.

13. A method comprising:
forming a dielectric wall abutting nanostructures, wherein forming the dielectric wall comprises:
forming a plurality of dielectric walls, the nanostructures disposed between the dielectric walls; and
removing a subset of the dielectric walls;
etching a source/drain recess in the nanostructures;
growing a lower source/drain region in the source/drain recess;
growing an upper source/drain region over the lower source/drain region in the source/drain recess;
depositing an inter-layer dielectric on the upper source/drain region;
patterning a contact opening extending through the inter-layer dielectric and into the dielectric wall, the contact opening exposing the upper source/drain region and the lower source/drain region; and
forming a source/drain contact in the contact opening.

14. The method of claim 13, wherein patterning the contact opening comprises:
performing a first etch to form an upper portion of the contact opening in the inter-layer dielectric, the upper portion of the contact opening exposing a top surface of the upper source/drain region; and
performing a second etch to form a lower portion of the contact opening in the dielectric wall, the lower portion of the contact opening exposing a sidewall of the upper source/drain region and a sidewall of the lower source/drain region.

15. The method of claim 13 further comprising:
after forming the dielectric wall, forming an isolation region, the nanostructures protruding from the isolation region.

16. The method of claim 13 further comprising:
before forming the dielectric wall, forming an isolation region, the nanostructures protruding from the isolation region.

17. The method of claim 13, wherein the contact opening has an upper portion in the inter-layer dielectric and has a lower portion in the dielectric wall, the upper portion of the contact opening being wider than the lower portion of the contact opening.

18. The method of claim 13, wherein the contact opening has an upper portion in the inter-layer dielectric and has a lower portion in the dielectric wall, the lower portion of the contact opening being taller than the upper portion of the contact opening.

19. The method of claim 13, further comprising:
forming a gate structure around the nanostructures, the dielectric wall having a first portion adjacent the lower source/drain region, the dielectric wall having a second portion beneath the gate structure, the second portion of the dielectric wall having a greater height than the first portion of the dielectric wall.

20. The method of claim 13, further comprising:
forming a gate structure around the nanostructures, the dielectric wall having a first portion adjacent the lower source/drain region, the dielectric wall having a second portion beneath the gate structure, the second portion of the dielectric wall having a same height as the first portion of the dielectric wall.

* * * * *